US012353101B2

(12) United States Patent
Oh et al.

(10) Patent No.: US 12,353,101 B2
(45) Date of Patent: *Jul. 8, 2025

(54) LIQUID CRYSTAL DIFFRACTIVE DEVICES WITH NANO-SCALE PATTERN AND METHODS OF MANUFACTURING THE SAME

(71) Applicant: Magic Leap, Inc., Plantation, FL (US)

(72) Inventors: Chulwoo Oh, Sammamish, WA (US); Mauro Melli, San Leandro, CA (US); Christophe Peroz, Tokyo (JP); Vikramjit Singh, Pflugerville, TX (US); Frank Xu, Austin, TX (US); Michael Anthony Klug, Austin, TX (US)

(73) Assignee: Magic Leap, Inc., Plantation, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/323,531

(22) Filed: May 25, 2023

(65) Prior Publication Data

US 2023/0296945 A1 Sep. 21, 2023

Related U.S. Application Data

(63) Continuation of application No. 17/379,895, filed on Jul. 19, 2021, now Pat. No. 11,693,282, which is a (Continued)

(51) Int. Cl.
*G02F 1/1347* (2006.01)
*G02F 1/1337* (2006.01)
(Continued)

(52) U.S. Cl.
CPC ...... *G02F 1/1347* (2013.01); *G02F 1/133703* (2013.01); *G02F 1/133711* (2013.01);
(Continued)

(58) Field of Classification Search
None
See application file for complete search history.

(56) References Cited

U.S. PATENT DOCUMENTS

| 1,239,371 A | 9/1917 | Evans |
| 4,693,544 A | 9/1987 | Yamasaki et al. |

(Continued)

FOREIGN PATENT DOCUMENTS

| CN | 102683803 A | 9/2012 |
| CN | 102890366 A | 1/2013 |

(Continued)

OTHER PUBLICATIONS

"Metamaterials". Duke University. Center for Metamaterials and Integrated Plasmonics. May 11, 2015 (Retrieved from the internet Aug. 12, 2016). URL: http://web.archive.org/web/20150511045547/ http://metamaterials.duke.edu/research/metamaterials.

(Continued)

*Primary Examiner* — Dung T Nguyen
(74) *Attorney, Agent, or Firm* — Tobias Intellectual Property Law, PLLC

(57) ABSTRACT

An optical device includes a liquid crystal layer having a first plurality of liquid crystal molecules arranged in a first pattern and a second plurality of liquid crystal molecules arranged in a second pattern. The first and the second pattern are separated from each other by a distance of about 20 nm to about 100 nm along a longitudinal or a transverse axis of the liquid crystal layer. The first and the second plurality of liquid crystal molecules are configured as first and second grating structures that can redirect light of visible or infrared wavelengths.

14 Claims, 23 Drawing Sheets

Related U.S. Application Data continuation of application No. 15/795,067, filed on Oct. 26, 2017, now Pat. No. 11,067,860.

(60) Provisional application No. 62/424,341, filed on Nov. 18, 2016.

(51) Int. Cl.

| | |
|---|---|
| *B81C 1/00* | (2006.01) |
| *G02B 3/00* | (2006.01) |
| *G02B 5/18* | (2006.01) |
| *G02B 5/30* | (2006.01) |
| *G02B 6/00* | (2006.01) |
| *G02B 27/00* | (2006.01) |
| *G02B 27/01* | (2006.01) |
| *G02B 27/10* | (2006.01) |
| *G02B 30/36* | (2020.01) |
| *G02F 1/1334* | (2006.01) |
| *G02F 1/29* | (2006.01) |

(52) U.S. Cl.
CPC ............ *B81C 1/0046* (2013.01); *G02B 3/00* (2013.01); *G02B 5/1809* (2013.01); *G02B 5/1833* (2013.01); *G02B 5/1847* (2013.01); *G02B 5/1861* (2013.01); *G02B 5/3016* (2013.01); *G02B 5/3083* (2013.01); *G02B 2006/0098* (2013.01); *G02B 27/0081* (2013.01); *G02B 27/0093* (2013.01); *G02B 2027/0134* (2013.01); *G02B 2027/0174* (2013.01); *G02B 27/1006* (2013.01); *G02B 30/36* (2020.01); *G02F 1/1334* (2013.01); *G02F 1/133726* (2021.01); *G02F 1/29* (2013.01); *G02F 2203/24* (2013.01); *G02F 2203/28* (2013.01)

(56) References Cited

U.S. PATENT DOCUMENTS

| | | | |
|---|---|---|---|
| 4,834,500 A | 5/1989 | Hilsum et al. | |
| 4,991,924 A | 2/1991 | Shankar et al. | |
| 5,082,354 A | 1/1992 | Kalmanash | |
| 5,187,372 A | 2/1993 | Clube | |
| 5,473,455 A | 12/1995 | Koike et al. | |
| 5,544,268 A | 8/1996 | Bischel et al. | |
| 5,566,982 A | 10/1996 | Lehureau et al. | |
| 5,745,207 A * | 4/1998 | Asada ............... | G02F 1/134363 349/178 |
| 5,808,797 A | 9/1998 | Bloom et al. | |
| 5,825,448 A | 10/1998 | Bos et al. | |
| 5,838,407 A | 11/1998 | Chigrinov et al. | |
| 5,915,051 A | 6/1999 | Damask et al. | |
| 6,014,197 A | 1/2000 | Hikmet | |
| 6,040,885 A | 3/2000 | Koike et al. | |
| 6,181,393 B1 | 1/2001 | Enomoto et al. | |
| 6,188,462 B1 | 2/2001 | Lavrentovich et al. | |
| 6,214,439 B1 | 4/2001 | Meneghin et al. | |
| 6,215,539 B1 | 4/2001 | Schadt et al. | |
| 6,334,960 B1 | 1/2002 | Willson et al. | |
| 6,542,671 B1 | 4/2003 | Ma et al. | |
| 6,680,767 B2 | 1/2004 | Coates et al. | |
| 6,690,845 B1 | 2/2004 | Yoshimura et al. | |
| 6,735,224 B2 | 5/2004 | Murry et al. | |
| 6,750,941 B2 | 6/2004 | Satoh et al. | |
| 6,850,221 B1 | 2/2005 | Tickle | |
| 6,873,087 B1 | 3/2005 | Choi et al. | |
| 6,900,881 B2 | 5/2005 | Sreenivasan et al. | |
| 6,982,818 B2 | 1/2006 | Riza et al. | |
| D514,570 S | 2/2006 | Ohta | |
| 7,023,466 B2 | 4/2006 | Favalora et al. | |
| 7,070,405 B2 | 7/2006 | Sreenivasan et al. | |
| 7,098,572 B2 | 8/2006 | Choi et al. | |
| 7,122,482 B2 | 10/2006 | Xu et al. | |
| 7,140,861 B2 | 11/2006 | Watts et al. | |
| 7,206,107 B2 | 4/2007 | Levola | |
| 7,341,348 B2 | 3/2008 | Eagan | |
| 7,375,784 B2 | 5/2008 | Smith et al. | |
| 7,471,362 B1 | 12/2008 | Jones | |
| 7,519,096 B2 | 4/2009 | Bouma et al. | |
| 7,573,640 B2 | 8/2009 | Nivon et al. | |
| 7,692,759 B2 | 4/2010 | Escuti et al. | |
| 7,705,943 B2 | 4/2010 | Kume et al. | |
| 7,841,745 B2 | 11/2010 | Mukawa | |
| 8,064,035 B2 | 11/2011 | Escuti et al. | |
| 8,076,386 B2 | 12/2011 | Xu et al. | |
| 8,160,411 B2 | 4/2012 | Levola et al. | |
| 8,233,204 B1 | 7/2012 | Robbins et al. | |
| 8,248,458 B2 | 8/2012 | Schowengerdt et al. | |
| 8,264,623 B2 | 9/2012 | Marrucci | |
| 8,339,566 B2 | 12/2012 | Escuti et al. | |
| 8,508,848 B2 | 8/2013 | Saarikko | |
| 8,757,812 B2 | 6/2014 | Melville et al. | |
| 8,885,161 B2 | 11/2014 | Scheeline et al. | |
| 8,885,997 B2 | 11/2014 | Nguyen et al. | |
| 8,950,867 B2 | 2/2015 | Macnamara | |
| 9,081,426 B2 | 7/2015 | Armstrong | |
| 9,195,092 B2 | 11/2015 | Escuti et al. | |
| 9,215,293 B2 | 12/2015 | Miller | |
| D752,529 S | 3/2016 | Loretan et al. | |
| 9,291,754 B2 | 3/2016 | Masuyama et al. | |
| 9,310,559 B2 | 4/2016 | Macnamara | |
| 9,345,402 B2 | 5/2016 | Gao | |
| 9,348,143 B2 | 5/2016 | Gao et al. | |
| D758,367 S | 6/2016 | Natsume | |
| D759,657 S | 6/2016 | Kujawski et al. | |
| 9,411,210 B2 | 8/2016 | Sugiyama et al. | |
| 9,417,452 B2 | 8/2016 | Schowengerdt et al. | |
| 9,470,906 B2 | 10/2016 | Kaji et al. | |
| 9,547,174 B2 | 1/2017 | Gao et al. | |
| 9,575,366 B2 | 2/2017 | Srivastava et al. | |
| 9,664,905 B2 | 5/2017 | Bohn et al. | |
| 9,671,566 B2 | 6/2017 | Abovitz et al. | |
| D794,288 S | 8/2017 | Beers et al. | |
| 9,740,006 B2 | 8/2017 | Gao | |
| 9,791,700 B2 | 10/2017 | Schowengerdt | |
| D805,734 S | 12/2017 | Fisher et al. | |
| 9,846,967 B2 | 12/2017 | Schowengerdt | |
| 9,851,563 B2 | 12/2017 | Gao et al. | |
| 9,857,591 B2 | 1/2018 | Welch et al. | |
| 9,874,749 B2 | 1/2018 | Bradski et al. | |
| 9,933,684 B2 | 4/2018 | Brown et al. | |
| 10,025,160 B2 | 7/2018 | Park et al. | |
| 10,156,725 B2 | 12/2018 | TeKolste et al. | |
| 10,191,288 B2 | 1/2019 | Singer et al. | |
| 10,254,454 B2 | 4/2019 | Klug et al. | |
| 10,260,864 B2 | 4/2019 | Edwin et al. | |
| 10,261,318 B2 | 4/2019 | TeKolste et al. | |
| 10,345,592 B2 | 7/2019 | Samec et al. | |
| 10,466,478 B2 | 11/2019 | Klug et al. | |
| 10,466,561 B2 | 11/2019 | Oh | |
| 10,690,826 B2 | 6/2020 | Klug et al. | |
| 10,921,630 B2 | 2/2021 | Oh | |
| 11,067,860 B2 | 7/2021 | Oh et al. | |
| 11,209,700 B2 | 12/2021 | Miyake | |
| 2001/0024255 A1 | 9/2001 | Kitson et al. | |
| 2001/0024256 A1 | 9/2001 | Kitson et al. | |
| 2002/0097962 A1 | 7/2002 | Yoshimura et al. | |
| 2002/0126249 A1 | 9/2002 | Liang et al. | |
| 2002/0167638 A1 | 11/2002 | Byun et al. | |
| 2002/0172237 A1 | 11/2002 | Murry et al. | |
| 2003/0147112 A1 | 8/2003 | Mukawa | |
| 2003/0161573 A1 | 8/2003 | Ishida et al. | |
| 2004/0007465 A1 | 1/2004 | Goldberg et al. | |
| 2004/0022888 A1 | 2/2004 | Sreenivasan et al. | |
| 2004/0120647 A1 | 6/2004 | Sakata et al. | |
| 2004/0150141 A1 | 8/2004 | Chao et al. | |
| 2004/0184163 A1 | 9/2004 | Nishioka et al. | |
| 2004/0191429 A1 | 9/2004 | Patrick | |
| 2005/0042391 A1 | 2/2005 | Ryan et al. | |
| 2005/0072959 A1 | 4/2005 | Moia et al. | |
| 2005/0073577 A1 | 4/2005 | Sudo et al. | |
| 2005/0232530 A1 | 10/2005 | Kekas | |

(56) References Cited

U.S. PATENT DOCUMENTS

| | | |
|---|---|---|
| 2005/0237471 A1 | 10/2005 | Kawamura |
| 2005/0248705 A1 | 11/2005 | Smith et al. |
| 2005/0253112 A1 | 11/2005 | Kelly et al. |
| 2005/0270312 A1 | 12/2005 | Lad et al. |
| 2005/0270461 A1 | 12/2005 | Kitson et al. |
| 2006/0028436 A1 | 2/2006 | Armstrong |
| 2006/0051024 A1 | 3/2006 | Levola |
| 2006/0087607 A1* | 4/2006 | Lee .................. G02F 1/133528 349/129 |
| 2006/0120247 A1 | 6/2006 | Noda et al. |
| 2006/0121358 A1 | 6/2006 | Rich et al. |
| 2006/0126179 A1 | 6/2006 | Levola |
| 2006/0157443 A1 | 7/2006 | Mei |
| 2006/0221448 A1 | 10/2006 | Nivon et al. |
| 2006/0227283 A1 | 10/2006 | Ooi et al. |
| 2007/0031097 A1 | 2/2007 | Heikenfeld et al. |
| 2007/0081123 A1 | 4/2007 | Lewis |
| 2007/0229955 A1 | 10/2007 | Kawamura et al. |
| 2007/0273957 A1 | 11/2007 | Zalevsky et al. |
| 2008/0043166 A1 | 2/2008 | Liu et al. |
| 2008/0043334 A1 | 2/2008 | Itzkovitch et al. |
| 2008/0169479 A1 | 7/2008 | Xu et al. |
| 2008/0278675 A1 | 11/2008 | Escuti et al. |
| 2009/0009668 A1 | 1/2009 | Tan et al. |
| 2009/0141216 A1 | 6/2009 | Marrucci |
| 2009/0268142 A1* | 10/2009 | Fu .................. G02F 1/1337 349/128 |
| 2009/0322970 A1 | 12/2009 | Iwane |
| 2010/0066929 A1 | 3/2010 | Shemo et al. |
| 2010/0142570 A1 | 6/2010 | Konttinen et al. |
| 2010/0207964 A1 | 8/2010 | Kimmel et al. |
| 2010/0225876 A1 | 9/2010 | Escuti et al. |
| 2010/0260030 A1 | 10/2010 | Tao et al. |
| 2010/0277803 A1 | 11/2010 | Pockett et al. |
| 2010/0284090 A1 | 11/2010 | Simmonds |
| 2010/0321781 A1 | 12/2010 | Levola et al. |
| 2011/0002143 A1 | 1/2011 | Saarikko et al. |
| 2011/0024950 A1 | 2/2011 | Kruglick |
| 2011/0049761 A1 | 3/2011 | Mataki |
| 2011/0051066 A1 | 3/2011 | Ahn et al. |
| 2011/0194058 A1 | 8/2011 | Amos et al. |
| 2011/0199566 A1* | 8/2011 | Mazusaki ............ G02F 1/13363 349/123 |
| 2011/0213664 A1 | 9/2011 | Osterhout et al. |
| 2011/0242461 A1 | 10/2011 | Escuti et al. |
| 2011/0242478 A1 | 10/2011 | Yakushiji et al. |
| 2011/0277361 A1 | 11/2011 | Nichol et al. |
| 2011/0304782 A1 | 12/2011 | Akao et al. |
| 2012/0021140 A1 | 1/2012 | Dijksman et al. |
| 2012/0033306 A1 | 2/2012 | Valera et al. |
| 2012/0127062 A1 | 5/2012 | Bar-Zeev et al. |
| 2012/0162549 A1 | 6/2012 | Gao et al. |
| 2012/0206485 A1 | 8/2012 | Osterhout et al. |
| 2012/0206812 A1 | 8/2012 | Saito et al. |
| 2012/0212696 A1* | 8/2012 | Trajkovska ............ G02F 1/29 349/123 |
| 2012/0218301 A1 | 8/2012 | Miller |
| 2012/0242918 A1 | 9/2012 | Valyukh et al. |
| 2012/0327330 A1 | 12/2012 | Takahashi et al. |
| 2013/0027656 A1 | 1/2013 | Escuti et al. |
| 2013/0051730 A1 | 2/2013 | Travers et al. |
| 2013/0077040 A1 | 3/2013 | Escuti et al. |
| 2013/0082922 A1 | 4/2013 | Miller |
| 2013/0117377 A1 | 5/2013 | Miller |
| 2013/0125027 A1 | 5/2013 | Abovitz |
| 2013/0169909 A1 | 7/2013 | Srivastava et al. |
| 2013/0208234 A1 | 8/2013 | Lewis |
| 2013/0222384 A1 | 8/2013 | Futterer |
| 2013/0235440 A1 | 9/2013 | Takeda et al. |
| 2013/0242262 A1 | 9/2013 | Lewis |
| 2013/0242392 A1 | 9/2013 | Amirparviz et al. |
| 2013/0314765 A1 | 11/2013 | Padilla et al. |
| 2013/0314789 A1 | 11/2013 | Saarikko et al. |
| 2013/0321747 A1 | 12/2013 | Kondo et al. |
| 2013/0322810 A1 | 12/2013 | Robbins |
| 2013/0335683 A1 | 12/2013 | Escuti et al. |
| 2014/0003762 A1 | 1/2014 | Macnamara |
| 2014/0016081 A1 | 1/2014 | Kakubari et al. |
| 2014/0055740 A1 | 2/2014 | Spaulding et al. |
| 2014/0064655 A1 | 3/2014 | Nguyen et al. |
| 2014/0071539 A1 | 3/2014 | Gao |
| 2014/0104665 A1 | 4/2014 | Popovich et al. |
| 2014/0140653 A1 | 5/2014 | Brown et al. |
| 2014/0140654 A1 | 5/2014 | Brown et al. |
| 2014/0177023 A1 | 6/2014 | Gao et al. |
| 2014/0211322 A1 | 7/2014 | Bohn et al. |
| 2014/0218468 A1 | 8/2014 | Gao et al. |
| 2014/0232993 A1 | 8/2014 | Kim |
| 2014/0233879 A1 | 8/2014 | Gibson et al. |
| 2014/0237817 A1 | 8/2014 | Trajkovska-Broach et al. |
| 2014/0267420 A1 | 9/2014 | Schowengerdt et al. |
| 2014/0300695 A1 | 10/2014 | Smalley et al. |
| 2014/0306866 A1 | 10/2014 | Miller et al. |
| 2015/0002528 A1 | 1/2015 | Bohn et al. |
| 2015/0015879 A1 | 1/2015 | Papadopoulos et al. |
| 2015/0016777 A1 | 1/2015 | Abovitz et al. |
| 2015/0062500 A1 | 3/2015 | Park et al. |
| 2015/0103306 A1 | 4/2015 | Kaji et al. |
| 2015/0146147 A1 | 5/2015 | Choi et al. |
| 2015/0168731 A1 | 6/2015 | Robbins |
| 2015/0178939 A1 | 6/2015 | Bradski et al. |
| 2015/0205126 A1 | 7/2015 | Schowengerdt |
| 2015/0205182 A1 | 7/2015 | Leister |
| 2015/0222883 A1 | 8/2015 | Welch |
| 2015/0222884 A1 | 8/2015 | Cheng |
| 2015/0234205 A1 | 8/2015 | Schowengerdt |
| 2015/0235431 A1 | 8/2015 | Schowengerdt |
| 2015/0241705 A1 | 8/2015 | Abovitz et al. |
| 2015/0268415 A1 | 9/2015 | Schowengerdt et al. |
| 2015/0293409 A1 | 10/2015 | Usukura et al. |
| 2015/0301249 A1 | 10/2015 | Pau et al. |
| 2015/0302652 A1 | 10/2015 | Miller et al. |
| 2015/0309263 A2 | 10/2015 | Abovitz et al. |
| 2015/0326570 A1 | 11/2015 | Publicover et al. |
| 2015/0346490 A1 | 12/2015 | TeKolste et al. |
| 2015/0346495 A1 | 12/2015 | Welch et al. |
| 2016/0011353 A1 | 1/2016 | Escuti et al. |
| 2016/0011419 A1 | 1/2016 | Gao |
| 2016/0026253 A1 | 1/2016 | Bradski et al. |
| 2016/0033698 A1 | 2/2016 | Escuti et al. |
| 2016/0033771 A1 | 2/2016 | Tremblay et al. |
| 2016/0041390 A1 | 2/2016 | Poon et al. |
| 2016/0055801 A1 | 2/2016 | Kim et al. |
| 2016/0077338 A1 | 3/2016 | Robbins et al. |
| 2016/0085300 A1 | 3/2016 | Robbins et al. |
| 2016/0097930 A1 | 4/2016 | Robbins et al. |
| 2016/0116739 A1 | 4/2016 | TeKolste et al. |
| 2016/0116979 A1 | 4/2016 | Border |
| 2016/0167422 A1 | 6/2016 | Brehm et al. |
| 2016/0209648 A1 | 7/2016 | Haddick et al. |
| 2016/0270656 A1 | 9/2016 | Samec et al. |
| 2016/0282808 A1 | 9/2016 | Smalley |
| 2016/0320536 A1 | 11/2016 | Simmonds et al. |
| 2017/0007182 A1 | 1/2017 | Samec et al. |
| 2017/0010466 A1 | 1/2017 | Klug et al. |
| 2017/0010488 A1 | 1/2017 | Klug et al. |
| 2017/0131595 A1 | 5/2017 | Yim et al. |
| 2017/0269453 A1 | 9/2017 | Galstian et al. |
| 2017/0277003 A1 | 9/2017 | Zhu |
| 2017/0322419 A1 | 11/2017 | TeKolste et al. |
| 2017/0363794 A1 | 12/2017 | Wan et al. |
| 2017/0373459 A1 | 12/2017 | Weng et al. |
| 2018/0004289 A1 | 1/2018 | Wilson et al. |
| 2018/0046859 A1 | 2/2018 | Jarvenpaa |
| 2018/0113309 A1 | 4/2018 | Robbins et al. |
| 2018/0113310 A1 | 4/2018 | Rolland et al. |
| 2018/0143438 A1 | 5/2018 | Oh |
| 2018/0143470 A1 | 5/2018 | Oh et al. |
| 2018/0143485 A1 | 5/2018 | Oh |
| 2018/0143509 A1 | 5/2018 | Oh |
| 2018/0164627 A1 | 6/2018 | Oh |
| 2018/0164645 A1 | 6/2018 | Oh et al. |
| 2018/0188528 A1 | 7/2018 | Browy et al. |
| 2018/0188542 A1 | 7/2018 | Waldern et al. |

(56) References Cited

U.S. PATENT DOCUMENTS

| | | |
|---|---|---|
| 2018/0217395 A1 | 8/2018 | Lin et al. |
| 2018/0239147 A1 | 8/2018 | Schowengerdt et al. |
| 2018/0239177 A1 | 8/2018 | Oh |
| 2018/0275350 A1 | 9/2018 | Oh et al. |
| 2018/0275409 A1 | 9/2018 | Gao et al. |
| 2018/0364505 A1* | 12/2018 | Tan .................. G02F 1/1343 |
| 2019/0033684 A1 | 1/2019 | Favalora et al. |
| 2019/0086674 A1 | 3/2019 | Sinay et al. |
| 2019/0121142 A1 | 4/2019 | TeKolste et al. |
| 2019/0227211 A1 | 7/2019 | Klug et al. |
| 2019/0243141 A1 | 8/2019 | TeKolste et al. |
| 2019/0243142 A1 | 8/2019 | TeKolste et al. |
| 2020/0174304 A1 | 6/2020 | Oh |
| 2021/0311351 A1 | 10/2021 | Oh |

FOREIGN PATENT DOCUMENTS

| | | |
|---|---|---|
| CN | 103558704 A | 2/2014 |
| CN | 105849628 A | 8/2016 |
| EP | 1843198 A1 | 10/2007 |
| JP | S62269174 A | 11/1987 |
| JP | H0384516 A | 4/1991 |
| JP | H0961822 A | 3/1997 |
| JP | 2000075405 A | 3/2000 |
| JP | 2002357804 A | 12/2002 |
| JP | 2003161834 A | 6/2003 |
| JP | 2003232910 A | 8/2003 |
| JP | 2004219750 A | 8/2004 |
| JP | 2005316304 A | 11/2005 |
| JP | 2005316314 A | 11/2005 |
| JP | 2006201388 A | 8/2006 |
| JP | 2006215186 A | 8/2006 |
| JP | 2006252638 A | 9/2006 |
| JP | 2008090259 A | 4/2008 |
| JP | 2008209710 A | 9/2008 |
| JP | 2008241756 A | 10/2008 |
| JP | 2010271565 A | 12/2010 |
| JP | 2012073515 A | 4/2012 |
| JP | 2012073522 A | 4/2012 |
| JP | 2012215614 A | 11/2012 |
| JP | 2014224846 A | 12/2014 |
| JP | 2015049376 A | 3/2015 |
| JP | 2015089638 A | 5/2015 |
| JP | 2016519327 A | 6/2016 |
| KR | 19990016200 A | 3/1999 |
| TW | 200834190 A | 8/2008 |
| WO | 2005024469 A2 | 3/2005 |
| WO | 2006064301 A1 | 6/2006 |
| WO | 2006092758 A2 | 9/2006 |
| WO | 2006106501 A1 | 10/2006 |
| WO | 2008130555 A1 | 10/2008 |
| WO | 2008130561 A1 | 10/2008 |
| WO | 2010067114 A1 | 6/2010 |
| WO | 2011130718 A2 | 10/2011 |
| WO | 2012103497 A1 | 8/2012 |
| WO | 2013052834 A1 | 4/2013 |
| WO | 2013054115 A1 | 4/2013 |
| WO | 2013188464 A1 | 12/2013 |
| WO | 2014016403 A1 | 1/2014 |
| WO | 2014036537 A1 | 3/2014 |
| WO | 2014091204 A1 | 6/2014 |
| WO | 2014159045 A1 | 10/2014 |
| WO | 2014172252 A1 | 10/2014 |
| WO | 2015081313 A2 | 6/2015 |
| WO | 2016054092 A1 | 4/2016 |
| WO | 2016082031 A1 | 6/2016 |
| WO | 2016113533 A2 | 7/2016 |
| WO | 2016151347 A1 | 9/2016 |
| WO | 2016205249 A1 | 12/2016 |
| WO | 2016205256 A1 | 12/2016 |
| WO | 2018093730 A1 | 5/2018 |
| WO | 2018094079 A1 | 5/2018 |
| WO | 2018094093 A1 | 5/2018 |
| WO | 2018106963 A1 | 6/2018 |
| WO | 2018112101 A1 | 6/2018 |
| WO | 2018156779 A1 | 8/2018 |
| WO | 2018156784 A1 | 8/2018 |
| WO | 2018175343 A1 | 9/2018 |
| WO | 2018175488 A1 | 9/2018 |
| WO | 2020069026 A1 | 4/2020 |

OTHER PUBLICATIONS

Aieta, F. et al., "Multiwavelength achromatic metasurfaces by dispersive phase compensation," Science, vol. 347, Issue 6228, Mar. 20, 2015, in 5 pages. URL: www.sciencemag.org.

Arbabi, A. et al., "Dielectric metasurfaces for complete control of phase and polarization with subwavelength spatial resolution and high transmission," Nature Nanotechnology, published online Aug. 31, 2015, in 8 pages. URL: www.nature.com/naturenanotechnology.

ARToolKit: https://web.archive.org/web/20051013062315/http://www.hitl.washington.edu:80/artoolkit/documentation/hardware.htm, archived Oct. 13, 2005.

Azuma, "A Survey of Augmented Reality," Teleoperators and Virtual Environments 6, 4 (Aug. 1997), pp. 355-385. https://web.archive.org/web/20010604100006/http://www.cs.unc.edu/˜ azuma/ARpresence.pdf.

Azuma, "Predictive Tracking for Augmented Realty," TR95-007, Department of Computer Science, UNC-Chapel Hill, NC, Feb. 1995.

Bimber, et al., "Spatial Augmented Reality-Merging Real and Virtual Worlds," 2005 https://web.media.mit.edu/raskar/book/BimberRaskarAugmentedRealityBook.pdf.

Chigrinov, V.: Photoaligning and Photopatterning Technology: Applications in Displays and Photonics, Proceedings of SPIE, Emerging Liquid Crystal Technologies I, vol. 9769, Mar. 7, 2016, in 11 pages.

Chiu et al.: "P-33: Large Area Self-aligning of Liquid Crystal Molecules induced by Nanoimprinting Lithography and a Multiple Function Film Made Therein," EuroDisplay, Sep. 20, 2005-Sep. 22, 2020, pp. 323-325.

Choi, Y. et al.: "Determination of Surface Nematic Liquid Crystal Anchoring Strength Using Nano-scale Surface Grooves," Optical Society of America, May 2013, in 10 pages.

Crawford, et al.: "Liquid-crystal Diffraction Gratings using Polarization Holography Alignment Techniques," Journal of Applied Physics 98, 123102, Dec. 2005.

Cunningham et al., "A plastic colorimetric resonant optical biosensor for multiparallel detection of label-free biochemical interactions," Sensors and Actuators B, vol. 85, 2190226, Jul. 2002, in 8 pages.

Dierking, I.: "Chiral Liquid Crystals: Structures, Phases, Effects," Symmetry, (Jun. 2014) 6(2): 444- 472.

Escuti J., "Polarization-Independent Modulation & Simplified Spectropolarimetry Using LC Polarization Gratings," paper #39.4, posters P-209, p. 167, SID Symposium Digest, 2006.

Escuti, M. et al., "39.4: Polarization-Independent Switching with High Contrast from a Liquid Crystal Polarization Grating", SID Symposium Digest, vol. 37, pp. 1443-1446, Jun. 2006, in 4 pages.

Escuti, M. et al., "Polarization-Independent LC Microdisplays Using Liquid Crystal Polarization Gratings: A Viable Solution", ILCC presentation, Jul. 1, 2008, in 15 pages.

Gear, C. et al.: "Engineered Liquid Crystal Anchoring Energies with Nanopatterned Surfaces," Optical Society of America, Jan. 2015, in 8 pp.

International Preliminary Report on Patentability for PCT Application No. PCT/US2017/061369, dated May 31, 2019.

International Search Report and Written Opinion for PCT Application No. PCT/US2017/61369, dated Jan. 30, 2018.

Jacob, "Eye Tracking in Advanced Interface Design," Human-Computer Interaction Lab Naval Research Laboratory, Washington, D.C. / paper/ in Virtual Environments and Advanced Interface Design, ed. by W. Barfield and T.A. Furness, pp. 258-288, Oxford University Press, New York (1995).

Kim, J. et al., "Wide-angle, nonmechanical beam steering with high throughput utilizing polarization gratings", Applied Optics, vol. 50, No. 17, Jun. 10, 2011, in 4 pages.

(56) References Cited

OTHER PUBLICATIONS

Komanduri, et al., "Multi-twist retarders: broadband retadation control using self-aligning reactive liquid crystal layers," Optical Society of America, Optics Express 404, vol. 21, No. 1, Jan. 14, 2013.

Komanduri, R. et al., "18:3: Late-News Paper: Polarization Independent Liquid Crystal Microdisplays", SID Digest, vol. 39, No. 1, pp. 236-239, May 2008, in 4 pages.

Komanduri, R. et al., "34.4L: Late-News Paper: Polarization Independent Projection Systems using Thin Film Polymer Polarization Gratings and Standard Liquid Crystal Microdisplays", SID Digest, vol. 40, No. 1, Jun. 2009, in 4 pages.

Komanduri, R. et al., "Elastic Continuum Analysis of the Liquid Crystal Polarization Grating", Physical review. E, Statistical, nonlinear, and soft matter physics, May 25, 2007, in 8 pages.

Komanduri, R. et al., "Polarization Independent Projection Systems using Thin Film Polymer Polarization Gratings and Standard Liquid Crystal Microdisplays", SID—Display week presentation, Jun. 3, 2009, in 12 pages.

Komanduri, R. et al., "Polarization-independent modulation for projection displays using small-period LC polarization gratings", Journal of the Society for information display, vol. 15, No. 8, pp. 589-594, Aug. 2007, in 7 pages.

Kurioz, Y. et al.: "P-128: Orientation of a Reactive Mesogen on Photosensitive Surface," Society for Information Display (SID) Symposium Digest of Technical Papers, May 2007, in 3 pages.

Lee, et al., Negative dispersion of birefringence in two-dimensionally self-organized smectic liquid crystal and monomer thin film, Optics Letters, vol. 39, No. 17, Sep. 1, 2014.

Lim, Y. et al., "Anisotropic Nano-Imprinting Technique for Fabricating a Patterned Optical Film of a Liquid Crystalline Polymer", Journal of Nanoscience and Nanotechnology, vol. 8, pp. 4775-4778, Oct. 2008, in 4 pages.

Lin, D. et al., "Dielectric gradient metasurface optical elements", Science, vol. 345, Issue 6194, Jul. 18, 2014, in 6 pages.

Lin, D. et al., "Supplementary Materials for Dielectric gradient metasurface optical elements", Science, vol. 345, Issue 6194, Jul. 18, 2014, in 22 pages.

Lin, R. et al. Molecular-Scale soft imprint lithography for alignment layers in liquid crystal devices; Nano Letters, vol. 7, No. 6; Publication [online]. May 23, 2007 [retrieved Feb. 7, 2018]. Retrieved from the Internet: URL:https://pubs.acs.org/doi/abs/10.1021/nl070559y; pp. 1613-1621.

Lub J. et al.: "Formation of Optical Films by Photo-Polymerisation of Liquid Crystalline Acrylates and Application of These Films in Liquid Crystal Display Technology," Mol Cryst Liq Cryst., (May 2005) 429(1):77-99.

Nikolova et al., "Diffraction Efficiency and Selectivity of Polarization Holographic Recording", Optica Acta: Int'l J Optics (1984) 31(5):579-588.

Oh C. et al.: "Achromatic Diffraction from Polarization Gratings with High Efficiency", Opt Lett. (Oct. 2008) 33 (20):2287-2289 & Erratum Opt Lett. (Dec. 2009) 34(23):3637.

Oh C., Thesis: "Broadband Polarization Gratings for Efficient Liquid Crystal Display, Beam Steering, Spectropolarimetry, and Fresnel Zone Plate", N. C. State University, Electrical Engineering (2009) in 190 pages.

Oh et al., "Polarization-Independent Modulation Using Standard Liquid Crystal Microdisplays and Polymer Polarization Gratings," NC State University; International Display Research Conference, vol. 28, pp. 298-301, 2008. in 16 pages.

Oh, C. et al., "Numerical analysis of polarization gratings using the finite-difference time-domain method", Physical review A, vol. 76, Oct. 12, 2007, in 8 pages.

Rongsheng, et al., "Molecular-Scale Soft Imprint Lithography for Alignment: Layers in Liquid Crystal Devices," NANO Letters, vol. 7, No. 6, May 23, 2007.

Scheeline, et al., "Stacked Mutually Rotated Diffraction Gratings as Enablers of Portable Visible Spectrometry," Appl. Spectrosc. 70, 766-777, May 11, 2016.

Tanriverdi and Jacob, "Interacting With Eye Movements in Virtual Environments," Department of Electrical Engineering and Computer Science, Tufts University, Medford, MA—paper/Proc. AMC CHI 2000 Human Factors in Computing Systems Conference, pp. 265-272, Addison-Wesley/ACM Press (2000).

Wikipedia Blind spot (vision), archived Jun. 9, 2016, in 2 pages. URL: https://web.archive.org/web/20160609224858/ https:en.wikipedia.org/wiki/Blind_spot(vision).

Yang et al. Negative Dispersion of Birefringence of Smectic Liquid Crystal-Polymer Composite: Dependence on the Constituent Molecules and Temperature, Optical Society of America, Optics Express 2466, vol. 23, No. 3, Feb. 9, 2015.

Yu, N. et al., "Flat optics with designer metasurfaces", Review Article; Nature Materials, (Feb. 2014) 13: 139-150.

Yu, N. et al., "Light Propagation with Phase Discontinuities: Generalized Laws of Reflection and Refraction," Science, vol. 334, No. 333, Oct. 21, 2011, in 6 pages. URL: www.sciencemag.org.

EP23178818.3 Extended European Search Report dated Sep. 25, 2023.

JP Opposition No. 2023-700500 Notice of Reasons for Revocation dated Sep. 11, 2023.

Ruetschi M., et al., "Creation of submicron orientational structures in thin liquid crystal polymer layers", J.Appl. Phys., Sep. 15, 1996, vol. 80, No. 6, pp. 3155-3161.

JP2022-161547 Office Action mailed May 14, 2024.

* cited by examiner

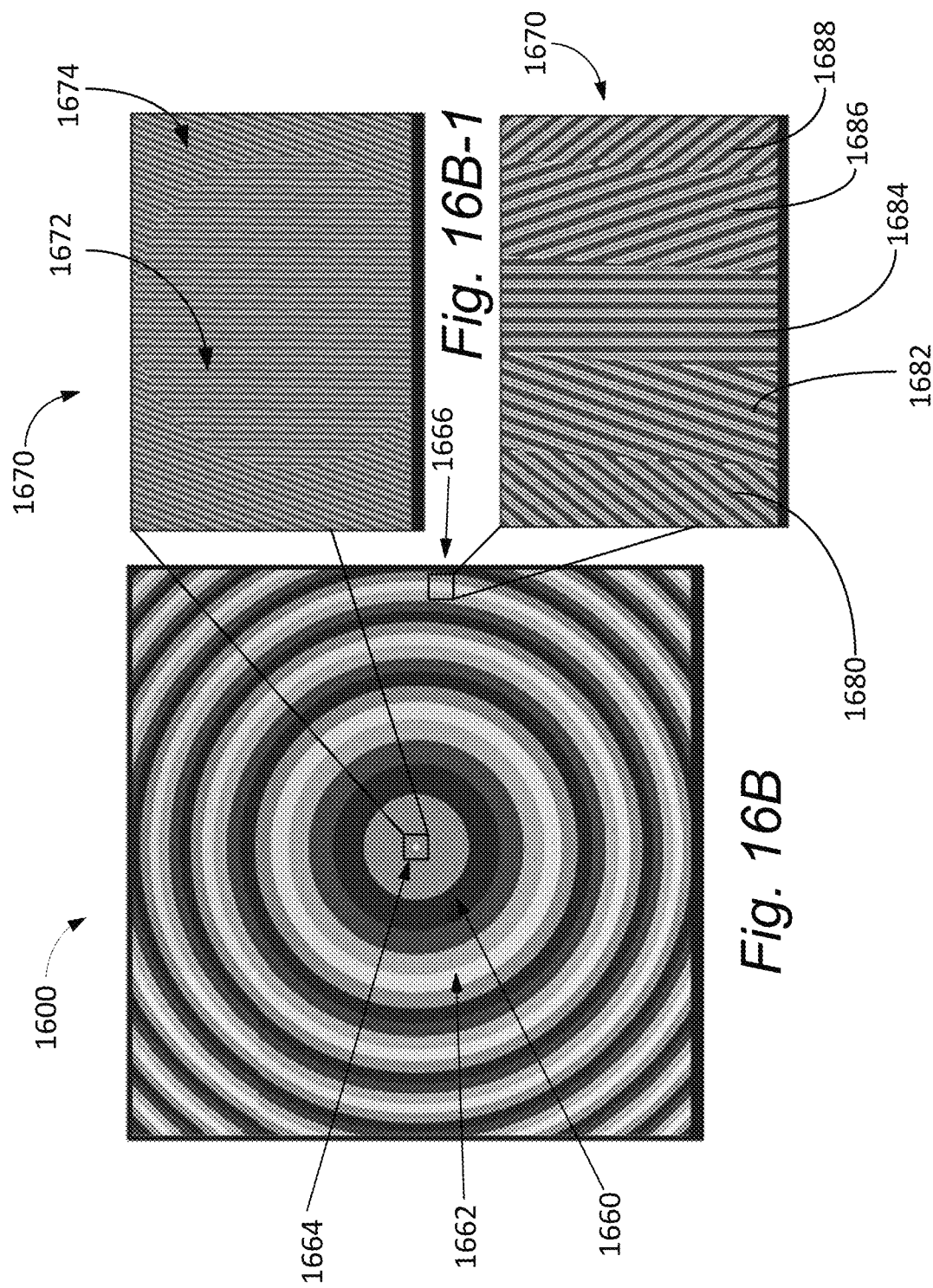

LIQUID CRYSTAL DIFFRACTIVE DEVICES WITH NANO-SCALE PATTERN AND METHODS OF MANUFACTURING THE SAME

PRIORITY CLAIM

This application is a continuation of U.S. application Ser. No. 17/379,895 filed on Jul. 19, 2021, which is a continuation of U.S. application Ser. No. 15/795,067 filed on Oct. 26, 2017 which claims the benefit of priority under 35 USC § 119(e) of U.S. Provisional Patent Application No. 62/424,341 filed on Nov. 18, 2016. Each of the above-identified applications is incorporated by reference herein in its entirety.

INCORPORATION BY REFERENCE

This application incorporates by reference the entirety of each of the following patent applications: U.S. application Ser. No. 14/555,585 filed on Nov. 27, 2014; U.S. application Ser. No. 14/690,401 filed on Apr. 18, 2015; U.S. application Ser. No. 14/212,961 filed on Mar. 14, 2014; U.S. application Ser. No. 14/331,218 filed on Jul. 14, 2014; and U.S. application Ser. No. 15/072,290 filed on Mar. 16, 2016.

BACKGROUND

Field

The present disclosure relates to optical devices, including virtual reality and augmented reality imaging and visualization systems.

Description of the Related Art

Modern computing and display technologies have facilitated the development of systems for so called "virtual reality" or "augmented reality" experiences, wherein digitally reproduced images or portions thereof are presented to a user in a manner wherein they seem to be, or may be perceived as, real. A virtual reality, or "VR", scenario typically involves presentation of digital or virtual image information without transparency to other actual real-world visual input; an augmented reality, or "AR", scenario typically involves presentation of digital or virtual image information as an augmentation to visualization of the actual world around the user. A mixed reality, or "MR", scenario is a type of AR scenario and typically involves virtual objects that are integrated into, and responsive to, the natural world. For example, in an MR scenario, AR image content may be blocked by or otherwise be perceived as interacting with objects in the real world.

Referring to FIG. 1, an augmented reality scene 10 is depicted wherein a user of an AR technology sees a real-world park-like setting 20 featuring people, trees, buildings in the background, and a concrete platform 30. In addition to these items, the user of the AR technology also perceives that he "sees" "virtual content" such as a robot statue 40 standing upon the real-world platform 30, and a cartoon-like avatar character 50 flying by which seems to be a personification of a bumble bee, even though these elements 40, 50 do not exist in the real world. Because the human visual perception system is complex, it is challenging to produce an AR technology that facilitates a comfortable, natural-feeling, rich presentation of virtual image elements amongst other virtual or real-world imagery elements.

Systems and methods disclosed herein address various challenges related to AR and VR technology.

SUMMARY

The systems, methods and devices of the disclosure each have several innovative aspects, no single one of which is solely responsible for the desirable attributes disclosed herein.

An innovative aspect of the subject matter of this application is embodied in an optical device comprising a liquid crystal layer having a first major surface, a second major surface and a thickness, the first and the second major surfaces extending across a transverse direction and the thickness extending along a direction parallel to a surface normal of the first or the second major surface, the liquid crystal layer comprising a plurality of sub-layers distributed across the thickness of the liquid crystal layer, each of the plurality of sub-layers comprising a single layer of liquid crystal molecules, each of the liquid crystal molecules having a longitudinal axis. Each sub-layer comprises a first domain in which the longitudinal axes of a plurality of the liquid crystal molecules are arranged to form a first pattern; and a second domain in which the longitudinal axes of a plurality of the liquid crystal molecules are arranged to form a second pattern. The first domain is spaced apart laterally along the transverse direction from the second domain by a domain gap having a distance D between about 10 nm and about 50 nm. The longitudinal axes of the liquid crystal molecules in the domain gap progressively transition from the first pattern to the second pattern.

In various embodiments of the device, the longitudinal axes of the molecules of the first domain of a sub-layer can be twisted with respect to the longitudinal axes of the molecules of the first domain of an adjacent sub-layer. Various embodiments of the device can further comprise a second liquid crystal layer comprising, wherein liquid crystal molecules of the second liquid crystal layer are configured to self-align to the first direction and the second direction in first and second domains respectively. The liquid crystal layer or the second liquid crystal layer can comprise a polymerizable liquid crystal material. Various embodiments of the device can further comprise a third liquid crystal layer over the second liquid crystal layer, wherein a plurality of liquid crystal molecules of the third liquid crystal can be arranged along a third direction. Various embodiments of the device can further comprise a fourth liquid crystal layer over the third liquid crystal layer, wherein a plurality of liquid crystals of the fourth liquid crystal layer can be configured to self-align to the third direction. In various embodiments, the second liquid crystal layer and/or the fourth liquid crystal layer can be disposed over a waveguide. The second liquid crystal layer and/or the fourth liquid crystal layer can comprise in-coupling optical elements configured to in-couple an incident beam of light into the waveguide such that the incident beam of light propagates through the waveguide by total internal reflection. Various embodiments of the device can comprise a light modulation device configured to direct light into the waveguide via the in-coupling optical elements. The second liquid crystal layer and/or the fourth liquid crystal layer can comprise out-coupling optical elements configured to out-couple an incident beam of light propagating through the waveguide by total internal reflection.

In various embodiments, the second liquid crystal layer and/or the fourth liquid crystal layer can comprise orthogonal pupil expanders configured to redirect light propagating through the waveguide by total internal reflection, wherein the redirected light continues to propagate through the waveguide by total internal reflection. In various embodiments of the device, the liquid crystal layer can comprise in-coupling optical elements configured to in-couple an incident beam of light into a waveguide such that an incident beam of light propagates through the waveguide by total internal reflection. In various embodiments of the device, the liquid crystal layer can comprise out-coupling optical elements configured to out-couple beam of light propagating through a waveguide by total internal reflection. The longitudinal axes of the plurality of the liquid crystal molecules in the first domain can be aligned along a first direction and the longitudinal axes of the plurality of the liquid crystal molecules in the second domain can be aligned along a second direction. The longitudinal axes of the liquid crystal molecules in the domain gap can progressively transition from the first direction to the second direction.

Another innovative aspect of the subject matter of this application includes a method for fabricating an optical device, the method comprising: providing a polymerizable liquid crystal layer over a substrate; patterning the polymerizable liquid crystal layer; and depositing a liquid crystal layer on the patterned polymerizable liquid crystal layer. Molecules of the deposited liquid crystal layer are self-aligned to the patterned polymerizable liquid crystal layer. Patterning the polymerizable liquid crystal layer comprises imprinting the polymerizable liquid crystal layer by an imprint template having a first domain comprising a first plurality of features and a second domain comprising a second plurality of features, the first domain spaced apart from the second domain by a region devoid of features, a dimension of the region devoid of features having a value between about 20 nm and about 100 nm. The dimension can comprise at least one of a length or a width. A width of the first plurality of features can be greater than or equal to about 20 nm and less than or equal to about 100 nm. A width of the second plurality of features can be greater than or equal to about 20 nm and less than or equal to about 100 nm. A distance between centers of two consecutive features of the first plurality of features can be greater than or equal to about 20 nm and less than or equal to about 100 nm. A height of the first plurality of features can be greater than or equal to about 10 nm and less than or equal to about 100 nm. A distance between centers of two consecutive features of the second plurality of features can be greater than or equal to about 20 nm and less than or equal to about 100 nm. A height of the second plurality of features can be greater than or equal to about 10 nm and less than or equal to about 100 nm.

The first plurality of features of the first domain can be arranged to form a first pattern and the second plurality of features of the second domain can be arranged to form a second pattern. The first pattern can be distinct from the second pattern. The first plurality of features can be oriented along a first direction and the second plurality of features of the second domain can be oriented along a second pattern. The first direction can be distinct from the second direction. The first plurality of features can comprise at least one of linear grooves, curvilinear grooves, linear facets or curvilinear facets. The second plurality of features can comprise at least one of linear grooves, curvilinear grooves, linear facets or curvilinear facets. The imprint template can comprise a semiconductor material. In various embodiments, the imprint template can be manufactured using at least one of optical lithography, nano-imprint, or ion- and electron-beam lithography.

Another innovative aspect of the subject matter of this application is included in a method of manufacturing a liquid crystal device. The method comprises depositing a layer of liquid crystal material on a substrate; and using an imprint template comprising a pattern to imprint a pattern on the layer of liquid crystal material such that molecules of the liquid crystal material are self-aligned to the pattern. The pattern comprises a first domain having a first plurality of features arranged to form a first pattern and a second domain having a second plurality of features arranged to form a second pattern. The first domain is spaced apart from the second domain by a region devoid of features. At least one of a width or a length of the region devoid of features is between about 20 nm and about 100 nm.

In various embodiments, the method further comprises depositing a layer of material having a refractive index lower than refractive index of the liquid crystal material. The layer of low refractive index material can be configured as a planarization layer using a planarization template. The first plurality of features or the second plurality of features can include surface relief features. At least one of a length, width or height of the first plurality of features or the second plurality of features can be between about 10 nm and about 100 nm. The first domain or the second domain can include PBPE structures. The liquid crystal device can comprise a metasurface and/or a metamaterial. The first domain or the second domain includes a grating array. In various embodiments, the first domain or the second domain can comprise curvilinear grooves or arcs.

In various embodiments of the method, depositing a layer of liquid crystal material can include jet depositing the layer of liquid crystal material. The method further comprises depositing an additional layer of liquid crystal material over the layer of liquid crystal material. The additional layer of liquid crystal material can be self-aligned to the pattern of the layer of liquid crystal material. A pattern can be imprinted on the additional layer of liquid crystal material. The pattern imprinted on the additional layer of liquid crystal material can be different from the pattern imprinted on the layer of liquid crystal material. In various embodiments, the pattern imprinted on the layer of liquid crystal material can be configured to act on a first wavelength, and the pattern imprinted on the additional layer of liquid crystal material can be configured to act on a second wavelength.

Yet another innovative aspect of the subject matter of this application is included in a method of manufacturing a liquid crystal device. The method comprises depositing a layer of polymerizable liquid crystal material on a substrate; imprinting a pattern on the polymerizable liquid crystal material using an imprint template; and depositing a layer of liquid crystal material on the patterned polymerizable liquid crystal material such that molecules of the liquid crystal material are self-aligned to the pattern.

The imprint template comprises an imprint pattern including a first domain having a first plurality of features arranged to form a first pattern and a second domain having a second plurality of features arranged to form a second pattern. The first domain is spaced apart from the second domain by a domain gap region devoid of features. At least one of a width or a length of the domain gap region is between about 20 nm and about 100 nm.

In various embodiments of the method, depositing a layer of polymerizable liquid crystal material can include jet depositing the polymerizable liquid crystal material. The first or the second plurality of features can comprise surface relief features. The first or the second plurality of features can have a size between about 10 nm and about 100 nm. The first or the second domain can include PBPE structures. The liquid crystal device can comprise a metasurface and/or a metamaterial. The first or the second domain can include a grating array. The first or the second plurality of features can include curvilinear grooves or arcs. In various embodiments of the method, depositing a layer of liquid crystal material can include jet depositing the layer of liquid crystal material.

The method can further comprise depositing an additional layer of liquid crystal material over the layer of liquid crystal material. The additional layer of liquid crystal material can be self-aligned to the pattern of the layer of liquid crystal material. A pattern can be imprinted on the additional layer of liquid crystal material. The pattern imprinted on the additional layer of liquid crystal material can be different from the pattern imprinted on the layer of liquid crystal material. The pattern imprinted on the layer of liquid crystal material can be configured to act on a first wavelength, and the pattern imprinted on the additional layer of liquid crystal material can be configured to act on a second wavelength.

Yet another innovative aspect of the subject matter of this application includes a method of manufacturing a liquid crystal device. The method comprises depositing a layer on a substrate; imprinting a pattern on the layer using an imprint template comprising an imprint pattern; and depositing a layer of liquid crystal material on the patterned layer such that molecules of the liquid crystal material are self-aligned to the pattern. The imprint pattern comprises a first domain having a first plurality of features arranged to form a first pattern and a second domain having a second plurality of features arranged to form a second pattern. The first domain is spaced apart from the second domain by a domain gap region devoid of features, and at least one of a width or a length of the domain gap region is between about 20 nm and about 100 nm.

The layer can comprise a polymerizable liquid crystal material. In various embodiments of the method, depositing a layer includes jet depositing the layer. The first or the second plurality of features can include surface relief features. The first or the second plurality of features can have a size between about 10 nm and about 100 nm. The first or the second domain can include PBPE structures or a metasurface. The first or the second domain can include a grating array. The first or the second plurality of features can include curvilinear grooves or arcs. In various embodiments, depositing a layer of liquid crystal material can include jet depositing the layer of liquid crystal material.

Various embodiments of the method can further comprise depositing an additional layer of liquid crystal material over the layer of liquid crystal material. The additional layer of liquid crystal material can be self-aligned to the pattern of the layer of liquid crystal material. A pattern can be imprinted on the additional layer of liquid crystal material. The pattern imprinted on the additional layer of liquid crystal material can be different from the pattern imprinted on the layer of liquid crystal material. The pattern imprinted on the layer of liquid crystal material can be configured to act on a first wavelength, and the pattern imprinted on the additional layer of liquid crystal material can be configured to act on a second wavelength.

Another innovative aspect of the subject matter of this application includes a liquid crystal device comprising a substrate; and a layer of liquid crystal material have a first surface adjacent the substrate and a second surface opposite the first surface. A first plurality of molecules of the layer of liquid crystal material on the second surface are arranged to form a first pattern and a second first plurality of molecules of the layer of liquid crystal material on the second surface are arranged to form a second pattern. The first plurality of molecules are spaced apart from the second plurality of molecules by a gap having a distance between about 20 nm and about 100 nm, and wherein molecules of the layer of liquid crystal material in the gap are arranged to progressively transition from the first pattern to the second pattern. In various embodiments, the layer of liquid crystal material is configured as a polarization grating.

Another innovative aspect of the subject matter of this application includes a liquid crystal device comprising a substrate; a material have a first surface adjacent the substrate and a second surface opposite the first surface; and a liquid crystal material on the second surface of the material. The material comprises a first pattern on the second surface; and a second pattern on the second surface. The first pattern is spaced apart from the second pattern by a gap having a distance between about 20 nm and about 100 nm. In various embodiments of the device, the material can comprise a polymerizable liquid crystal material.

An innovative aspect of the subject matter of this application is implemented in a method for fabricating a liquid crystal lens. The method comprises providing an imprint layer over a substrate. The imprint layer comprises at least a first zone comprising a first plurality of features oriented along a first direction and a second zone comprising a second plurality of features oriented along a second direction. The second direction can be rotated by an angle between about 1 degree and about 45 degrees with respect to the first direction. The method further comprises depositing a liquid crystal layer on the imprint layer, wherein molecules of the deposited liquid crystal layer are self-aligned to the first and the second plurality of features. In various implementations, the imprint layer can comprise between about five and thirty zones. The first and the second zones can be spaced apart by a gap less than or equal to about 10 nm. For example, the first and the second zones can be spaced apart by a gap less than or equal to about 5 nm, less than or equal to about 2 nm and/or less than or equal to about 1 nm.

The first or the second plurality of features can comprise nano-features, such as, for example, grooves. A length or a width of the first plurality of features and the second plurality of features can be less than or equal to about 200 nm. For example, the length or the width of the first plurality of features and the second plurality of features can be less than or equal to about 100 nm. A height or a depth of the first plurality of features and the second plurality of features can be less than or equal to about 200 nm. For example, the height or the depth of the first plurality of features and the second plurality of features can be less than or equal to about 100 nm.

The imprint layer can comprise a semiconductor material. The liquid crystal layer can comprise a polymerizable liquid crystal material. The method further comprises polymerizing the polymerizable liquid crystal material after the molecules of the polymerizable liquid crystal material are self-aligned to the first and the second plurality of features. Polymerizing the polymerizable liquid crystal material can comprise exposing the polymerizable liquid crystal material to ultra-violet light. The liquid crystal lens can comprise a diffractive lens. Depositing a liquid crystal layer on the imprint layer can comprise jet depositing the liquid crystal.

An innovative aspect of the subject matter of this application is implemented in a liquid crystal lens. The liquid crystal lens comprises a patterned substrate comprising at least a first zone comprising a first plurality of features oriented along a first direction and a second zone comprising a second plurality of features oriented along a second direction. The first plurality of features and the second plurality of features have a dimension less than or equal to about 100 nm. The lens comprises a liquid crystal layer over the patterned substrate, wherein molecules of the liquid crystal layer are self-aligned to the first and the second plurality of features. The dimension can comprise a length, a height, a depth or a width of the feature. The liquid crystal can comprise a polymerizable liquid crystal.

The patterned substrate can comprise a substrate having a layer disposed thereon that is patterned. The first and the second zones can comprise concentric ring-shaped zones. The lens can comprise between about 3 and 30 zones. For example, the lens can comprise at least five zones. A width of the zones can progressively decrease with distance from a center of the patterned substrate. In various implementations, the zones can have no gap therebetween. In some implementations, a gap between the zones can be less than or equal to 5 nm. For example, the gap between the zones can be less than or equal to 1 nm. The lens can be configured as a diffractive lens. The lens can be configured to provide positive or negative optical power.

Various embodiments of the liquid crystal devices described herein can be included with a waveguide of a display system. The embodiments of the liquid crystal devices described herein can be configured to selectively in-couple at least one light stream from a multiplexed light stream into the waveguide and transmit one or more other light streams from the multiplexed light stream. Various embodiments of the liquid crystal device described herein can be included with an eyepiece of a head mounted display.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIG. 16B illustrates a microscopic image of an implementation of the lens between crossed polarizers. FIGS. 16B-1 and 16B-2 depict a scanning electron microscope (SEM) image showing the pattern of the imprint layer that achieves the desired alignment of the longitudinal axes in various regions of the liquid crystal lens.

Like reference numbers and designations in the various drawings indicate like elements.

DETAILED DESCRIPTION

Figure 1:
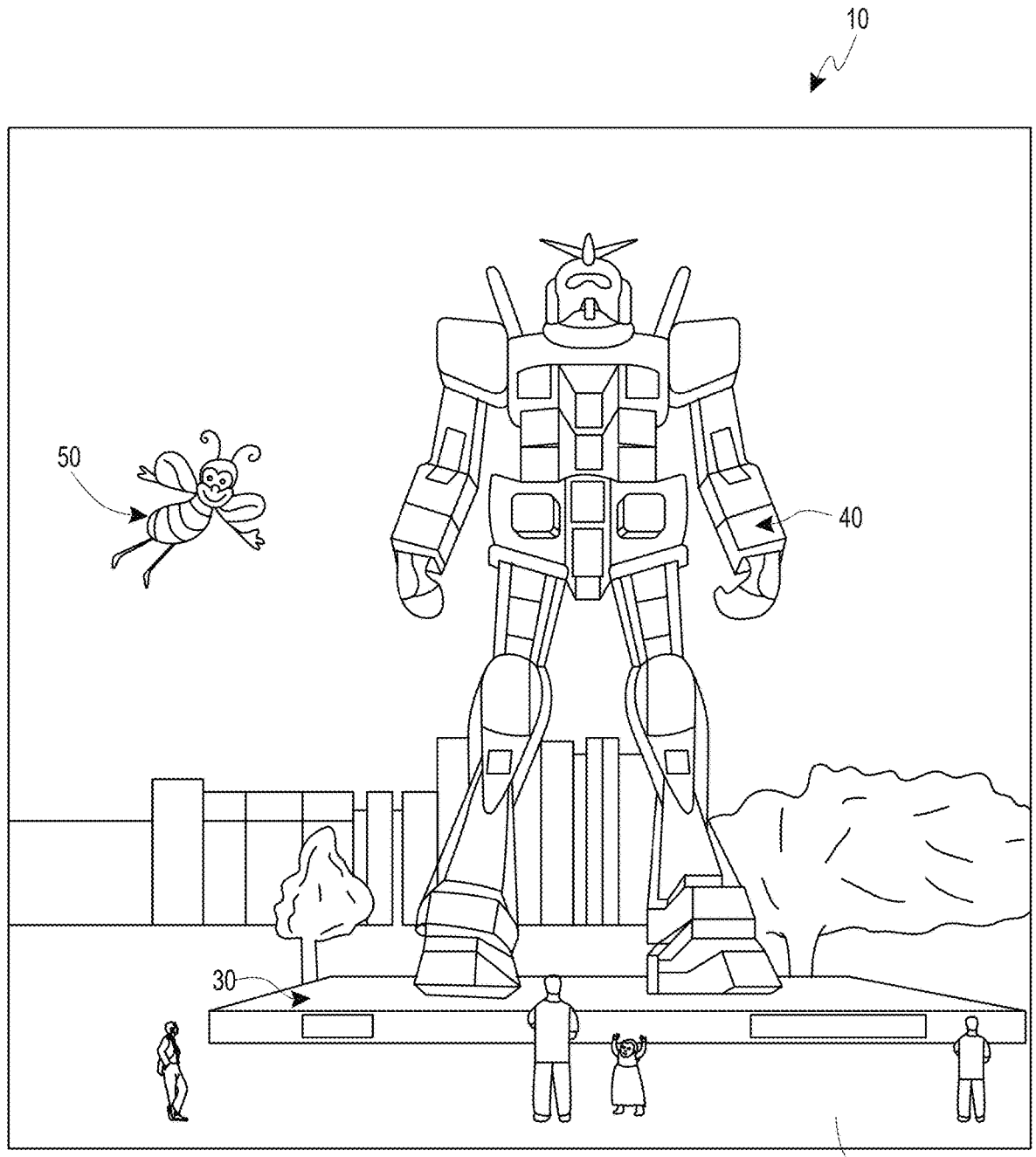
FIG. 1 illustrates a user's view of augmented reality (AR) through an AR device.

Liquid crystals (LCs) comprise liquid crystal molecules having a longitudinal axis which is arbitrarily oriented under certain conditions. However, under certain other conditions, the LC molecules can be ordered such that the longitudinal axes are oriented along an average direction (referred to herein as the director). Some liquid crystal molecules can be symmetric about the longitudinal axis. LCs are an anisotropic material that can have different optical properties for different wavelengths or polarizations of light depending on the direction of propagation of light through the LC and the polarization of light with respect to the direction along which the LC molecules are generally oriented. For example, LC molecules exhibit birefringence in which light polarized along a direction of the general orientation of the longitudinal axes of LC molecules has a refractive index different from the refractive index of light polarized a direction perpendicular to the general orientation of the longitudinal axes of LC molecules. As a result of birefringent nature of LC materials, they are widely used in various systems include displays, optical communications, optical data storage, sensors, etc. The refractive index of a LC material can be varied by varying the orientation of the longitudinal axes of the molecules of the LC material. Accordingly, LC materials can be configured as phase gratings. LC grating structures can be used to selectively diffract light along different directions based on wavelength and/or polarization.

One way of fabricating LC grating structures includes a mechanical method such as a rubbing process in which surface features are produced on an alignment layer (e.g., a polymer) by rubbing or a scratching the surface of the alignment layer using a mechanical object (e.g., a metal object, cloth, tip of an atomic force microscope, etc.). The molecules of a layer LC material deposited on the alignment layer are aligned to surface features on the alignment layer to form a grating pattern. However, the rubbing process can cause mechanical damage to the surface of the alignment layer and/or introduce electrostatic charges or impurities on the surface of the alignment layer which can reduce the diffraction efficiency of the liquid crystal grating structure. Furthermore, it may not be practical to fabricate complex grating structures (e.g., LC gratings comprising patterns with different orientations of LC molecules) using the rubbing method. Additionally, it may not be practical to fabricate space-variant nano-scale patterns of liquid crystal materials that can be used to manipulate phase, amplitude and/or polarization of incident light. In contrast, various implementations described herein can be used to fabricate space-variant nano-scale patterns of liquid crystal materials that can be used to manipulate phase, amplitude and/or polarization of incident light. Some embodiments of a liquid crystal material with space-variant nano-scale pattern can include a liquid crystal metasurface. Other embodiments of a liquid crystal material with space-variant nano-scale pattern can include a liquid crystal comprising a plurality of adjacent domains, wherein the liquid crystal molecules in each domain can be arranged to form a nano-scale pattern.

In some embodiments, the LC grating structures may be utilized as constituent parts of a display system. The display system may include a waveguide, and an image injection device configured to direct a light beam into the waveguide. The LC grating structures may be used as one or more of an in-coupling optical element, an out-coupling optical element, and an optical element for receiving incident light propagating in the waveguide and for redirecting that incident light so that the redirected light continues to propagate through the waveguide by total internal reflection. Examples of the latter type of optical element include pupil expanders such as orthogonal pupil expanders (OPEs).

In some embodiments, the LC grating structures may be used to in-couple, out-couple, and/or redirect light propagating within the waveguide. The light may be light of a single wavelength or a single range of wavelengths. In some other embodiments, the light may be a light stream that is part of a multiplexed light stream that includes a plurality of light streams having different light properties (e.g., each stream may have a different wavelength). For example, the waveguide may include the LC grating structures, which may be configured to selectively redirect a light beam formed of light having a particular light property (e.g., a first wavelength), while being substantially transmissive to one or more other streams of light (e.g., having wavelengths different from the first wavelength). In some embodiments, the waveguide is part of a stack of waveguides, which can include a second waveguide including in-coupling optical elements configured to selectively turn a second of the streams of light while being transmissive to one or more other streams of light. In some embodiments, the in-coupling LC grating structures of the waveguide are configured to transmit at least one of the streams of light to the in-coupling LC grating structures of the second waveguide.

Reference will now be made to the figures, in which like reference numerals refer to like parts throughout. It will be appreciated that embodiments disclosed herein include optical systems, including display systems, generally. In some embodiments, the display systems are wearable, which may advantageously provide a more immersive VR or AR experience. For example, displays containing one or more waveguides (e.g., a stack of waveguides) may be configured to be worn positioned in front of the eyes of a user, wearer and/or viewer. In some embodiments, two stacks of waveguides, one for each eye of a viewer, may be utilized to provide different images to each eye.

Example Display Systems

Figure 2:
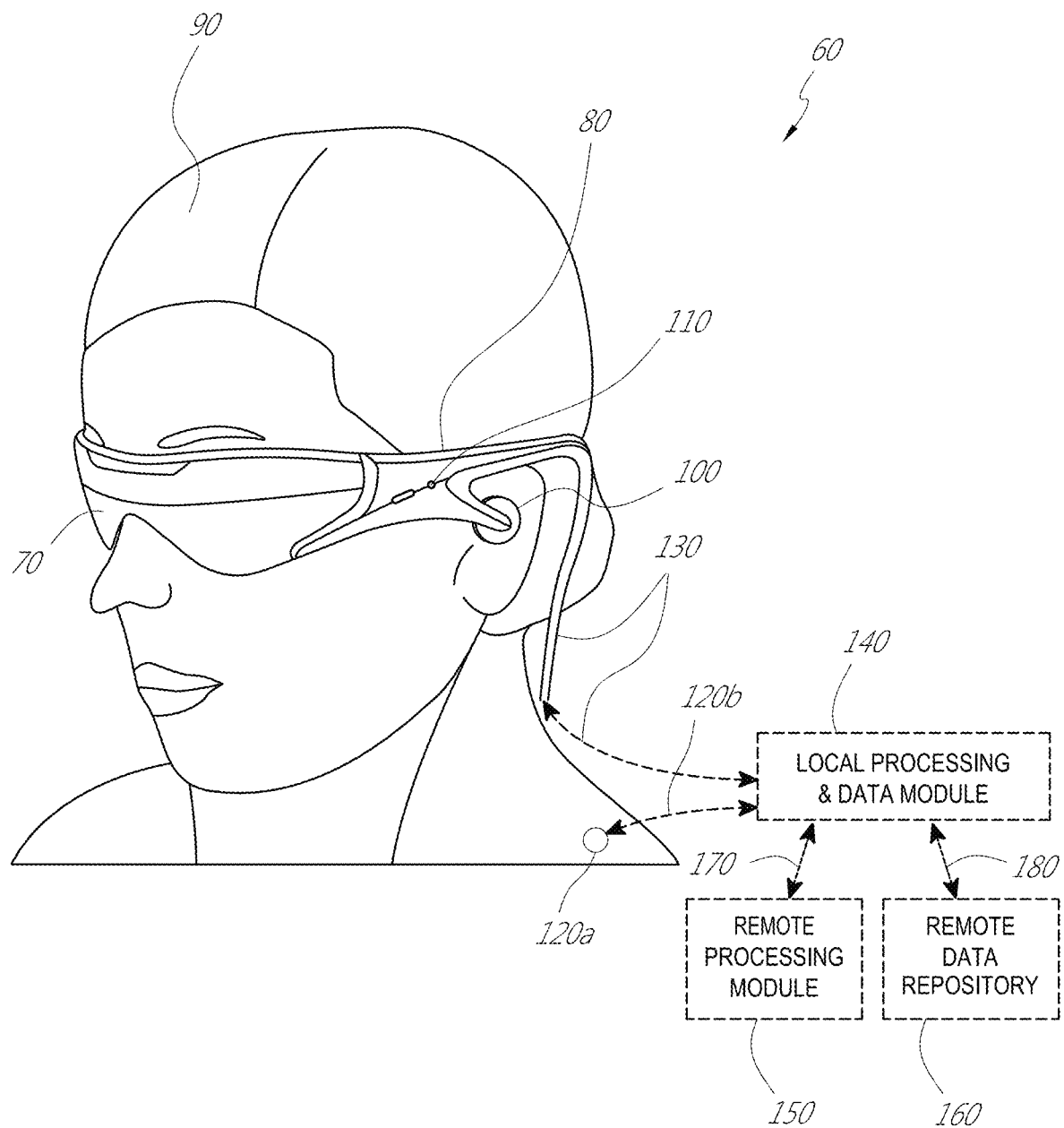
FIG. 2 illustrates an example of a wearable display system.

FIG. 2 illustrates an example of wearable display system 60. The display system 60 includes a display 70, and various mechanical and electronic modules and systems to support the functioning of that display 70. The display 70 may be coupled to a frame 80, which is wearable by a display system user or viewer 90 and which is configured to position the display 70 in front of the eyes of the user 90. The display 70 may be considered eyewear in some embodiments. In some embodiments, a speaker 100 is coupled to the frame 80 and configured to be positioned adjacent the ear canal of the user 90 (in some embodiments, another speaker, not shown, is positioned adjacent the other ear canal of the user to provide stereo/shapeable sound control). In some embodiments, the display system may also include one or more microphones 110 or other devices to detect sound. In some embodiments, the microphone is configured to allow the user to provide inputs or commands to the system 60 (e.g., the selection of voice menu commands, natural language questions, etc.), and/or may allow audio communication with other persons (e.g., with other users of similar display systems. The microphone may further be configured as a peripheral sensor to collect audio data (e.g., sounds from the user and/or environment). In some embodiments, the display system may also include a peripheral sensor 120a, which may be separate from the frame 80 and attached to the body of the user 90 (e.g., on the head, torso, an extremity, etc. of the user 90). The peripheral sensor 120a may be configured to acquire data characterizing the physiological state of the user 90 in some embodiments. For example, the sensor 120a may be an electrode.

With continued reference to FIG. 2, the display 70 is operatively coupled by communications link 130, such as by a wired lead or wireless connectivity, to a local data processing module 140 which may be mounted in a variety of configurations, such as fixedly attached to the frame 80, fixedly attached to a helmet or hat worn by the user, embedded in headphones, or otherwise removably attached to the user 90 (e.g., in a backpack-style configuration, in a belt-coupling style configuration). Similarly, the sensor 120a may be operatively coupled by communications link 120b, e.g., a wired lead or wireless connectivity, to the local processor and data module 140. The local processing and data module 140 may comprise a hardware processor, as well as digital memory, such as non-volatile memory (e.g., flash memory or hard disk drives), both of which may be utilized to assist in the processing, caching, and storage of data. The data include data a) captured from sensors (which may be, e.g., operatively coupled to the frame 80 or otherwise attached to the user 90), such as image capture devices (such as cameras), microphones, inertial measurement units, accelerometers, compasses, GPS units, radio devices, gyros, and/or other sensors disclosed herein; and/or b) acquired and/or processed using remote processing module 150 and/or remote data repository 160 (including data relating to virtual content), possibly for passage to the display 70 after such processing or retrieval. The local processing and data module 140 may be operatively coupled by communication links 170, 180, such as via a wired or wireless communication links, to the remote processing module 150 and remote data repository 160 such that these remote modules 150, 160 are operatively coupled to each other and available as resources to the local processing and data module 140. In some embodiments, the local processing and data module 140 may include one or more of the image capture devices, microphones, inertial measurement units, accelerometers, compasses, GPS units, radio devices, and/or gyros. In some other embodiments, one or more of these sensors may be attached to the frame 80, or may be standalone structures that communicate with the local processing and data module 140 by wired or wireless communication pathways.

With continued reference to FIG. 2, in some embodiments, the remote processing module 150 may comprise one or more processors configured to analyze and process data and/or image information. In some embodiments, the remote data repository 160 may comprise a digital data storage facility, which may be available through the internet or other networking configuration in a "cloud" resource configuration. In some embodiments, the remote data repository 160 may include one or more remote servers, which provide information, e.g., information for generating augmented reality content, to the local processing and data module 140 and/or the remote processing module 150. In some embodiments, all data is stored and all computations are performed in the local processing and data module, allowing fully autonomous use from a remote module.

Figure 3:
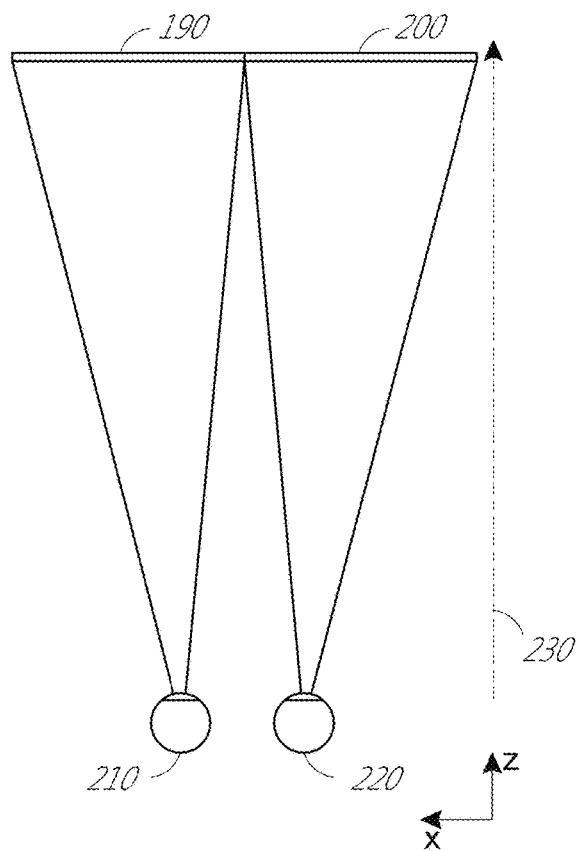
FIG. 3 illustrates a conventional display system for simulating three-dimensional imagery for a user.

The perception of an image as being "three-dimensional" or "3-D" may be achieved by providing slightly different presentations of the image to each eye of the viewer. FIG. 3 illustrates a conventional display system for simulating three-dimensional imagery for a user. Two distinct images 190, 200—one for each eye 210, 220—are outputted to the user. The images 190, 200 are spaced from the eyes 210, 220 by a distance 230 along an optical or z-axis that is parallel to the line of sight of the viewer. The images 190, 200 are flat and the eyes 210, 220 may focus on the images by assuming a single accommodated state. Such 3-D display systems rely on the human visual system to combine the images 190, 200 to provide a perception of depth and/or scale for the combined image.

It will be appreciated, however, that the human visual system is more complicated and providing a realistic perception of depth is more challenging. For example, many viewers of conventional "3-D" display systems find such systems to be uncomfortable or may not perceive a sense of depth at all. Without being limited by theory, it is believed that viewers of an object may perceive the object as being "three-dimensional" due to a combination of vergence and accommodation. Vergence movements (i.e., rotation of the eyes so that the pupils move toward or away from each other to converge the lines of sight of the eyes to fixate upon an object) of the two eyes relative to each other are closely associated with focusing (or "accommodation") of the lenses and pupils of the eyes. Under normal conditions, changing the focus of the lenses of the eyes, or accommodating the eyes, to change focus from one object to another object at a different distance will automatically cause a matching change in vergence to the same distance, under a relationship known as the "accommodation-vergence reflex," as well as pupil dilation or constriction. Likewise, a change in vergence will trigger a matching change in accommodation of lens shape and pupil size, under normal conditions. As noted herein, many stereoscopic or "3-D" display systems display a scene using slightly different presentations (and, so, slightly different images) to each eye such that a three-dimensional perspective is perceived by the human visual system. Such systems are uncomfortable for many viewers, however, since they, among other things, simply provide a different presentation of a scene, but with the eyes viewing all the image information at a single accommodated state, and work against the "accommodation-vergence reflex." Display systems that provide a better match between accommodation and vergence may form more realistic and comfortable simulations of three-dimensional imagery contributing to increased duration of wear and in turn compliance to diagnostic and therapy protocols.

Figure 4:
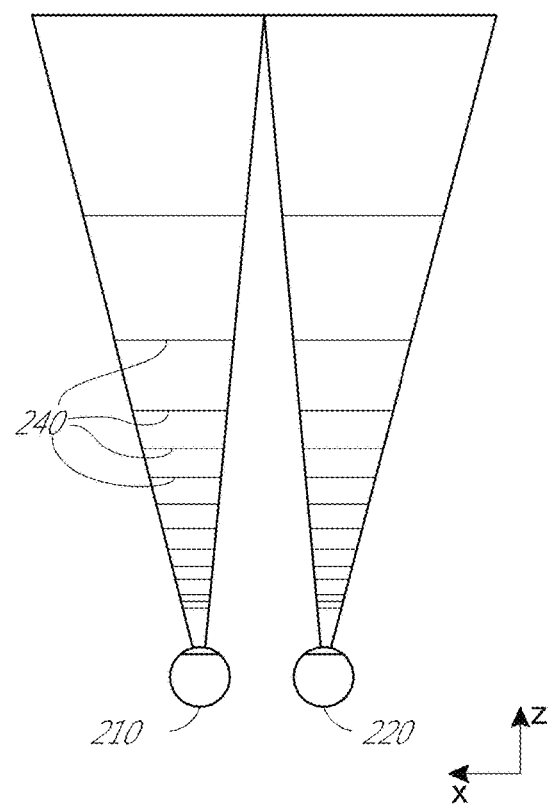
FIG. 4 illustrates aspects of an approach for simulating three-dimensional imagery using multiple depth planes.

FIG. 4 illustrates aspects of an approach for simulating three-dimensional imagery using multiple depth planes. With reference to FIG. 4, objects at various distances from eyes 210, 220 on the z-axis are accommodated by the eyes 210, 220 so that those objects are in focus. The eyes 210, 220 assume particular accommodated states to bring into focus objects at different distances along the z-axis. Consequently, a particular accommodated state may be said to be associated with a particular one of depth planes 240, with has an associated focal distance, such that objects or parts of objects in a particular depth plane are in focus when the eye is in the accommodated state for that depth plane. In some embodiments, three-dimensional imagery may be simulated by providing different presentations of an image for each of the eyes 210, 220, and also by providing different presentations of the image corresponding to each of the depth planes. While shown as being separate for clarity of illustration, it will be appreciated that the fields of view of the eyes 210, 220 may overlap, for example, as distance along the z-axis increases. In addition, while shown as flat for ease of illustration, it will be appreciated that the contours of a depth plane may be curved in physical space, such that all features in a depth plane are in focus with the eye in a particular accommodated state.

Figure 5A:
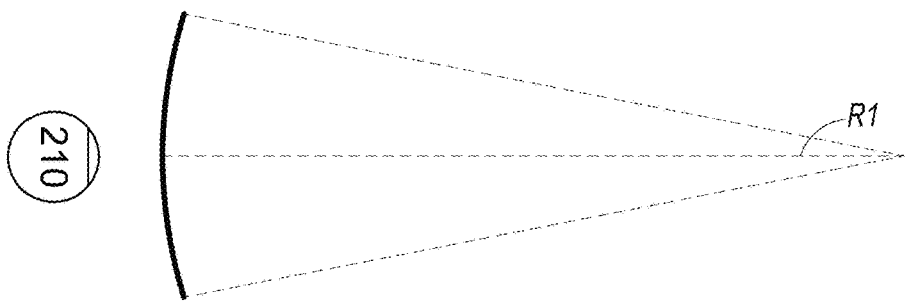
FIGS. 5A-5C illustrate relationships between radius of curvature and focal radius.
Figure 5B:
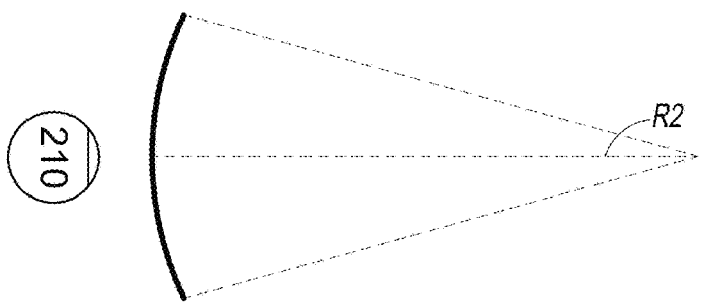
Figure 5C:
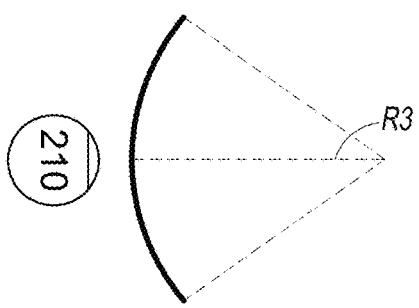

The distance between an object and the eye 210 or 220 may also change the amount of divergence of light from that object, as viewed by that eye. FIGS. 5A-5C illustrate relationships between distance and the divergence of light rays. The distance between the object and the eye 210 is represented by, in order of decreasing distance, R1, R2, and R3. As shown in FIGS. 5A-5C, the light rays become more divergent as distance to the object decreases. As distance increases, the light rays become more collimated. Stated another way, it may be said that the light field produced by a point (the object or a part of the object) has a spherical wavefront curvature, which is a function of how far away the point is from the eye of the user. The curvature increases with decreasing distance between the object and the eye 210. Consequently, at different depth planes, the degree of divergence of light rays is also different, with the degree of divergence increasing with decreasing distance between depth planes and the viewer's eye 210. While only a single eye 210 is illustrated for clarity of illustration in FIGS. 5A-5C and other figures herein, it will be appreciated that the discussions regarding eye 210 may be applied to both eyes 210 and 220 of a viewer.

Without being limited by theory, it is believed that the human eye typically can interpret a finite number of depth planes to provide depth perception. Consequently, a highly believable simulation of perceived depth may be achieved by providing, to the eye, different presentations of an image corresponding to each of these limited number of depth planes. The different presentations may be separately focused by the viewer's eyes, thereby helping to provide the user with depth cues based on the accommodation of the eye required to bring into focus different image features for the scene located on different depth plane and/or based on observing different image features on different depth planes being out of focus.

Figure 6:
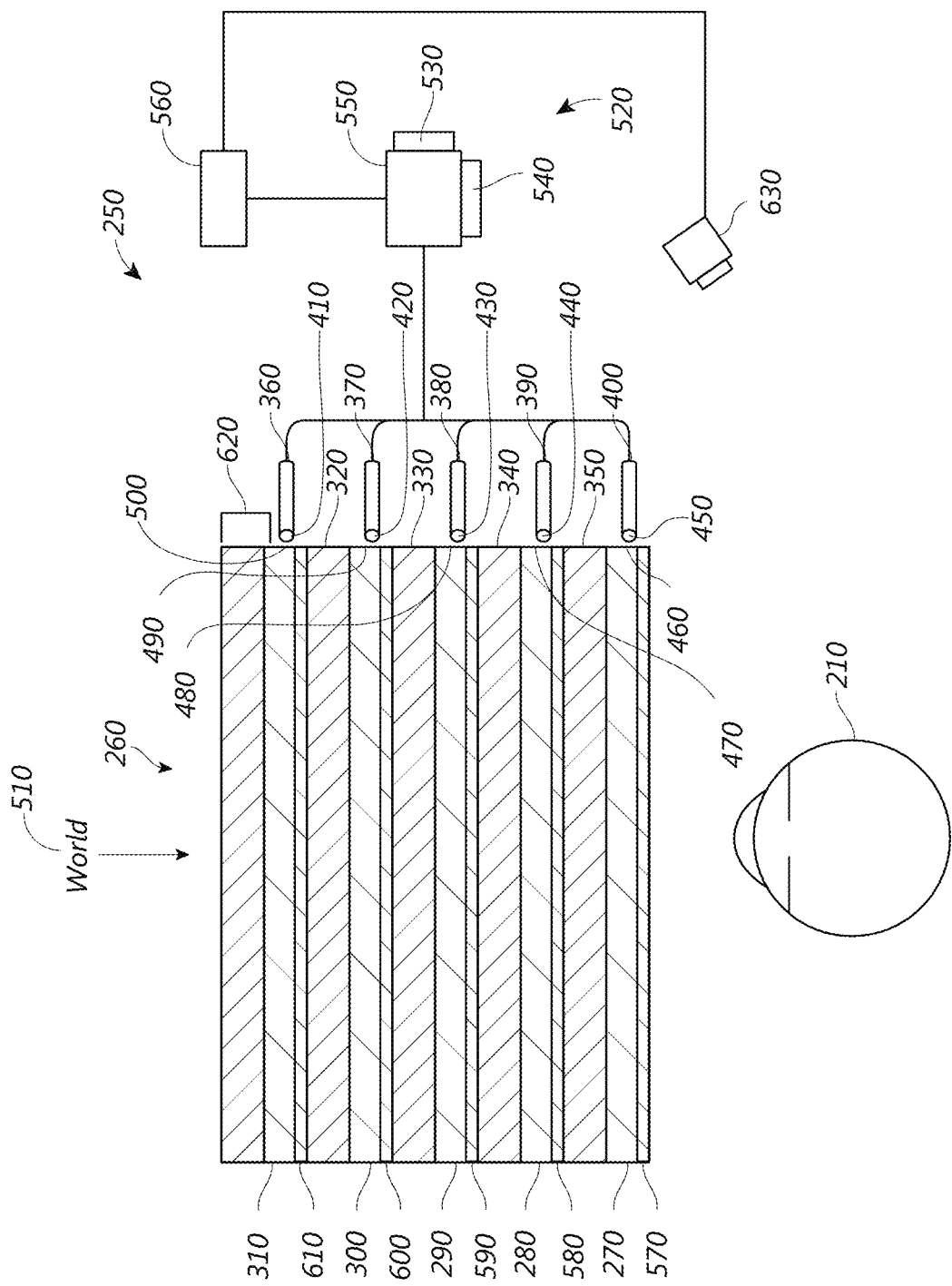
FIG. 6 illustrates an example of a waveguide stack for outputting image information to a user.

FIG. 6 illustrates an example of a waveguide stack for outputting image information to a user. A display system 250 includes a stack of waveguides, or stacked waveguide assembly, 260 that may be utilized to provide three-dimensional perception to the eye/brain using a plurality of waveguides 270, 280, 290, 300, 310. In some embodiments, the display system 250 is the system 60 of FIG. 2, with FIG. 6 schematically showing some parts of that system 60 in greater detail. For example, the waveguide assembly 260 may be part of the display 70 of FIG. 2. It will be appreciated that the display system 250 may be considered a light field display in some embodiments.

With continued reference to FIG. 6, the waveguide assembly 260 may also include a plurality of features 320, 330, 340, 350 between the waveguides. In some embodiments, the features 320, 330, 340, 350 may be one or more lenses. The waveguides 270, 280, 290, 300, 310 and/or the plurality of lenses 320, 330, 340, 350 may be configured to send image information to the eye with various levels of wavefront curvature or light ray divergence. Each waveguide level may be associated with a particular depth plane and may be configured to output image information corresponding to that depth plane. Image injection devices 360, 370, 380, 390, 400 may function as a source of light for the waveguides and may be utilized to inject image information into the waveguides 270, 280, 290, 300, 310, each of which may be configured, as described herein, to distribute incoming light across each respective waveguide, for output toward the eye 210. Light exits an output surface 410, 420, 430, 440, 450 of the image injection devices 360, 370, 380, 390, 400 and is injected into a corresponding input surface 460, 470, 480, 490, 500 of the waveguides 270, 280, 290, 300, 310. In some embodiments, the each of the input surfaces 460, 470, 480, 490, 500 may be an edge of a corresponding waveguide, or may be part of a major surface of the corresponding waveguide (that is, one of the waveguide surfaces directly facing the world 510 or the viewer's eye 210). In some embodiments, a single beam of light (e.g. a collimated beam) may be injected into each waveguide to output an entire field of cloned collimated beams that are directed toward the eye 210 at particular angles (and amounts of divergence) corresponding to the depth plane associated with a particular waveguide. In some embodiments, a single one of the image injection devices 360, 370, 380, 390, 400 may be associated with and inject light into a plurality (e.g., three) of the waveguides 270, 280, 290, 300, 310.

In some embodiments, the image injection devices 360, 370, 380, 390, 400 are discrete displays that each produce image information for injection into a corresponding waveguide 270, 280, 290, 300, 310, respectively. In some other embodiments, the image injection devices 360, 370, 380, 390, 400 are the output ends of a single multiplexed display which may, e.g., pipe image information via one or more optical conduits (such as fiber optic cables) to each of the image injection devices 360, 370, 380, 390, 400. It will be appreciated that the image information provided by the image injection devices 360, 370, 380, 390, 400 may include light of different wavelengths, or colors (e.g., different component colors, as discussed herein).

In some embodiments, the light injected into the waveguides 270, 280, 290, 300, 310 is provided by a light projector system 520, which comprises a light module 530, which may include a light emitter, such as a light emitting diode (LED). The light from the light module 530 may be directed to and modified by a light modulator 540, e.g., a spatial light modulator, via a beam splitter 550. The light modulator 540 may be configured to change the perceived intensity of the light injected into the waveguides 270, 280, 290, 300, 310. Examples of spatial light modulators include liquid crystal displays (LCD) including a liquid crystal on silicon (LCOS) displays.

In some embodiments, the display system 250 may be a scanning fiber display comprising one or more scanning fibers configured to project light in various patterns (e.g., raster scan, spiral scan, Lissajous patterns, etc.) into one or more waveguides 270, 280, 290, 300, 310 and ultimately to the eye 210 of the viewer. In some embodiments, the illustrated image injection devices 360, 370, 380, 390, 400 may schematically represent a single scanning fiber or a bundle of scanning fibers configured to inject light into one or a plurality of the waveguides 270, 280, 290, 300, 310. In some other embodiments, the illustrated image injection devices 360, 370, 380, 390, 400 may schematically represent a plurality of scanning fibers or a plurality of bundles of scanning fibers, each of which are configured to inject light into an associated one of the waveguides 270, 280, 290, 300, 310. It will be appreciated that one or more optical fibers may be configured to transmit light from the light module 530 to the one or more waveguides 270, 280, 290, 300, 310. It will be appreciated that one or more intervening optical structures may be provided between the scanning fiber, or fibers, and the one or more waveguides 270, 280, 290, 300, 310 to, e.g., redirect light exiting the scanning fiber into the one or more waveguides 270, 280, 290, 300, 310.

A controller 560 controls the operation of one or more of the stacked waveguide assembly 260, including operation of the image injection devices 360, 370, 380, 390, 400, the light source 530, and the light modulator 540. In some embodiments, the controller 560 is part of the local data processing module 140. The controller 560 includes programming (e.g., instructions in a non-transitory medium) that regulates the timing and provision of image information to the waveguides 270, 280, 290, 300, 310 according to, e.g., any of the various schemes disclosed herein. In some embodiments, the controller may be a single integral device, or a distributed system connected by wired or wireless communication channels. The controller 560 may be part of the processing modules 140 or 150 (FIG. 2) in some embodiments.

With continued reference to FIG. 6, the waveguides 270, 280, 290, 300, 310 may be configured to propagate light within each respective waveguide by total internal reflection (TIR). The waveguides 270, 280, 290, 300, 310 may each be planar or have another shape (e.g., curved), with major top and bottom surfaces and edges extending between those major top and bottom surfaces. In the illustrated configuration, the waveguides 270, 280, 290, 300, 310 may each include out-coupling optical elements 570, 580, 590, 600, 610 that are configured to extract light out of a waveguide by redirecting the light, propagating within each respective waveguide, out of the waveguide to output image information to the eye 210. Extracted light may also be referred to as out-coupled light and the out-coupling optical elements light may also be referred to light extracting optical elements. An extracted beam of light may be outputted by the waveguide at locations at which the light propagating in the waveguide strikes a light extracting optical element. The out-coupling optical elements 570, 580, 590, 600, 610 may, for example, be gratings, including diffractive optical features, as discussed further herein. While illustrated disposed at the bottom major surfaces of the waveguides 270, 280, 290, 300, 310, for ease of description and drawing clarity, in some embodiments, the out-coupling optical elements 570, 580, 590, 600, 610 may be disposed at the top and/or bottom major surfaces, and/or may be disposed directly in the volume of the waveguides 270, 280, 290, 300, 310, as discussed further herein. In some embodiments, the out-coupling optical elements 570, 580, 590, 600, 610 may be formed in a layer of material that is attached to a transparent substrate to form the waveguides 270, 280, 290, 300, 310. In some other embodiments, the waveguides 270, 280, 290, 300, 310 may be a monolithic piece of material and the out-coupling optical elements 570, 580, 590, 600, 610 may be formed on a surface and/or in the interior of that piece of material.

With continued reference to FIG. 6, as discussed herein, each waveguide 270, 280, 290, 300, 310 is configured to output light to form an image corresponding to a particular depth plane. For example, the waveguide 270 nearest the eye may be configured to deliver collimated light (which was injected into such waveguide 270), to the eye 210. The collimated light may be representative of the optical infinity focal plane. The next waveguide up 280 may be configured to send out collimated light which passes through the first lens 350 (e.g., a negative lens) before it can reach the eye 210; such first lens 350 may be configured to create a slight convex wavefront curvature so that the eye/brain interprets light coming from that next waveguide up 280 as coming from a first focal plane closer inward toward the eye 210 from optical infinity. Similarly, the third up waveguide 290 passes its output light through both the first 350 and second 340 lenses before reaching the eye 210; the combined optical power of the first 350 and second 340 lenses may be configured to create another incremental amount of wavefront curvature so that the eye/brain interprets light coming from the third waveguide 290 as coming from a second focal plane that is even closer inward toward the person from optical infinity than was light from the next waveguide up 280.

The other waveguide layers 300, 310 and lenses 330, 320 are similarly configured, with the highest waveguide 310 in the stack sending its output through all of the lenses between it and the eye for an aggregate focal power representative of the closest focal plane to the person. To compensate for the stack of lenses 320, 330, 340, 350 when viewing/interpreting light coming from the world 510 on the other side of the stacked waveguide assembly 260, a compensating lens layer 620 may be disposed at the top of the stack to compensate for the aggregate power of the lens stack 320, 330, 340, 350 below. Such a configuration provides as many perceived focal planes as there are available waveguide/lens pairings. Both the out-coupling optical elements of the waveguides and the focusing aspects of the lenses may be static (i.e., not dynamic or electro-active). In some alternative embodiments, either or both may be dynamic using electro-active features.

In some embodiments, two or more of the waveguides 270, 280, 290, 300, 310 may have the same associated depth plane. For example, multiple waveguides 270, 280, 290, 300, 310 may be configured to output images set to the same depth plane, or multiple subsets of the waveguides 270, 280, 290, 300, 310 may be configured to output images set to the same plurality of depth planes, with one set for each depth plane. This can provide advantages for forming a tiled image to provide an expanded field of view at those depth planes.

With continued reference to FIG. 6, the out-coupling optical elements 570, 580, 590, 600, 610 may be configured to both redirect light out of their respective waveguides and to output this light with the appropriate amount of divergence or collimation for a particular depth plane associated with the waveguide. As a result, waveguides having different associated depth planes may have different configurations of out-coupling optical elements 570, 580, 590, 600, 610, which output light with a different amount of divergence depending on the associated depth plane. In some embodiments, the light extracting optical elements 570, 580, 590, 600, 610 may be volumetric or surface features, which may be configured to output light at specific angles. For example, the light extracting optical elements 570, 580, 590, 600, 610 may be volume holograms, surface holograms, and/or diffraction gratings. In some embodiments, the features 320, 330, 340, 350 may not be lenses; rather, they may simply be spacers (e.g., cladding layers and/or structures for forming air gaps).

In some embodiments, the out-coupling optical elements 570, 580, 590, 600, 610 are diffractive features that form a diffraction pattern, or "diffractive optical element" (also referred to herein as a "DOE"). Preferably, the DOE's have a sufficiently low diffraction efficiency so that only a portion of the light of the beam is deflected away toward the eye 210 with each intersection of the DOE, while the rest continues to move through a waveguide via TIR. The light carrying the image information is thus divided into a number of related exit beams that exit the waveguide at a multiplicity of locations and the result is a fairly uniform pattern of exit emission toward the eye 210 for this particular collimated beam bouncing around within a waveguide.

In some embodiments, one or more DOEs may be switchable between "on" states in which they actively diffract, and "off" states in which they do not significantly diffract. For instance, a switchable DOE may comprise a layer of polymer dispersed liquid crystal, in which microdroplets comprise a diffraction pattern in a host medium, and the refractive index of the microdroplets may be switched to substantially match the refractive index of the host material (in which case the pattern does not appreciably diffract incident light) or the microdroplet may be switched to an index that does not match that of the host medium (in which case the pattern actively diffracts incident light).

In some embodiments, a camera assembly 630 (e.g., a digital camera, including visible light and infrared light cameras) may be provided to capture images of the eye 210 and/or tissue around the eye 210 to, e.g., detect user inputs and/or to monitor the physiological state of the user. As used herein, a camera may be any image capture device. In some embodiments, the camera assembly 630 may include an image capture device and a light source to project light (e.g., infrared light) to the eye, which may then be reflected by the eye and detected by the image capture device. In some embodiments, the camera assembly 630 may be attached to the frame 80 (FIG. 2) and may be in electrical communication with the processing modules 140 and/or 150, which may process image information from the camera assembly 630 to make various determinations regarding, e.g., the physiological state of the user, as discussed herein. It will be appreciated that information regarding the physiological state of user may be used to determine the behavioral or emotional state of the user. Examples of such information include movements of the user and/or facial expressions of the user. The behavioral or emotional state of the user may then be triangulated with collected environmental and/or virtual content data so as to determine relationships between the behavioral or emotional state, physiological state, and environmental or virtual content data. In some embodiments, one camera assembly 630 may be utilized for each eye, to separately monitor each eye.

Figure 7:
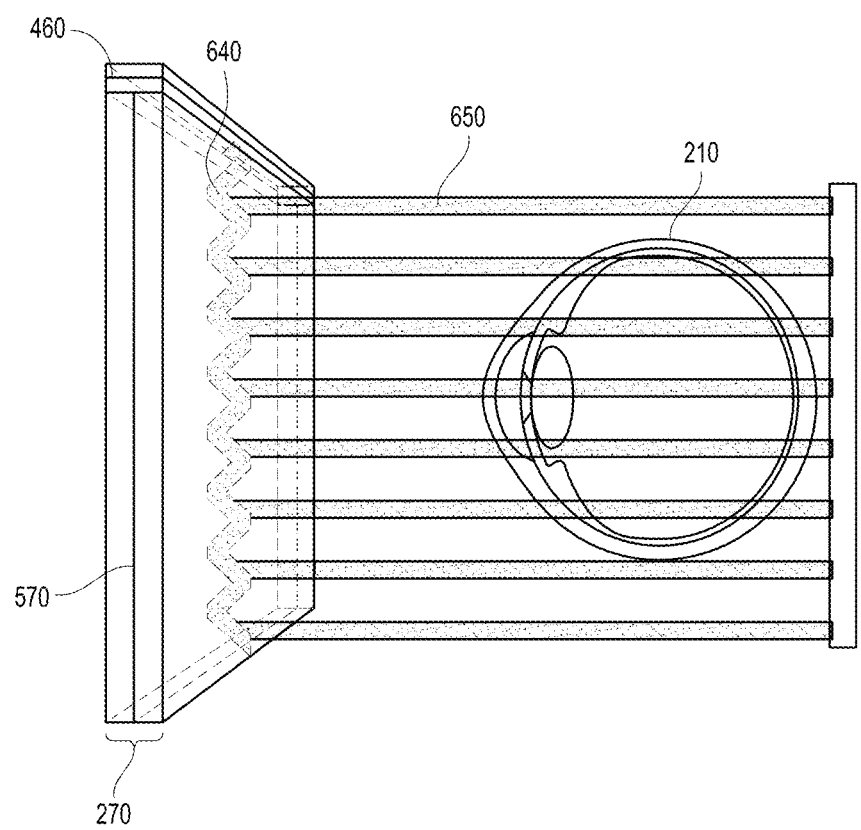
FIG. 7 illustrates an example of exit beams outputted by a waveguide.

With reference now to FIG. 7, an example of exit beams outputted by a waveguide is shown. One waveguide is illustrated, but it will be appreciated that other waveguides in the waveguide assembly 260 (FIG. 6) may function similarly, where the waveguide assembly 260 includes multiple waveguides. Light 640 is injected into the waveguide 270 at the input surface 460 of the waveguide 270 and propagates within the waveguide 270 by TIR. At points where the light 640 impinges on the DOE 570, a portion of the light exits the waveguide as exit beams 650. The exit beams 650 are illustrated as substantially parallel but, as discussed herein, they may also be redirected to propagate to the eye 210 at an angle (e.g., forming divergent exit beams), depending on the depth plane associated with the waveguide 270. It will be appreciated that substantially parallel exit beams may be indicative of a waveguide with out-coupling optical elements that out-couple light to form images that appear to be set on a depth plane at a large distance (e.g., optical infinity) from the eye 210. Other waveguides or other sets of out-coupling optical elements may output an exit beam pattern that is more divergent, which would require the eye 210 to accommodate to a closer distance to bring it into focus on the retina and would be interpreted by the brain as light from a distance closer to the eye 210 than optical infinity.

Figure 8:
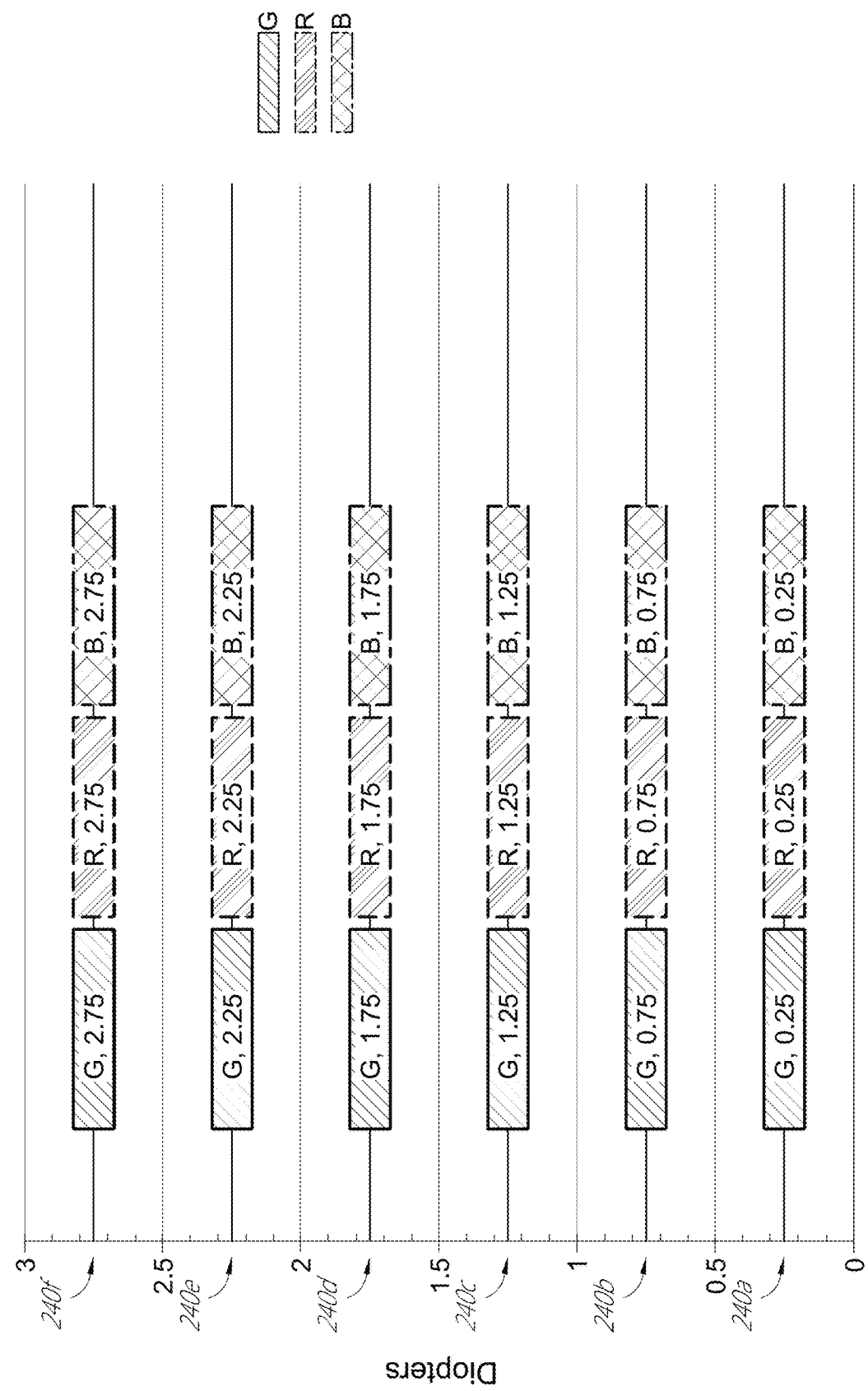
FIG. 8 illustrates an example of a stacked waveguide assembly in which each depth plane includes images formed using multiple different component colors.

In some embodiments, a full color image may be formed at each depth plane by overlaying images in each of the component colors, e.g., three or more component colors. FIG. 8 illustrates an example of a stacked waveguide assembly in which each depth plane includes images formed using multiple different component colors. The illustrated embodiment shows depth planes 240*a*-240*f*, although more or fewer depths are also contemplated. Each depth plane may have three or more component color images associated with it, including: a first image of a first color, G; a second image of a second color, R; and a third image of a third color, B. Different depth planes are indicated in the figure by different numbers for diopters (dpt) following the letters G, R, and B. Just as examples, the numbers following each of these letters indicate diopters (1/m), or inverse distance of the depth plane from a viewer, and each box in the figures represents an individual component color image. In some embodiments, to account for differences in the eye's focusing of light of different wavelengths, the exact placement of the depth planes for different component colors may vary. For example, different component color images for a given depth plane may be placed on depth planes corresponding to different distances from the user. Such an arrangement may increase visual acuity and user comfort and/or may decrease chromatic aberrations.

In some embodiments, light of each component color may be outputted by a single dedicated waveguide and, consequently, each depth plane may have multiple waveguides associated with it. In such embodiments, each box in the figures including the letters G, R, or B may be understood to represent an individual waveguide, and three waveguides may be provided per depth plane where three component color images are provided per depth plane. While the waveguides associated with each depth plane are shown adjacent to one another in this drawing for ease of description, it will be appreciated that, in a physical device, the waveguides may all be arranged in a stack with one waveguide per level. In some other embodiments, multiple component colors may be outputted by the same waveguide, such that, e.g., only a single waveguide may be provided per depth plane.

With continued reference to FIG. 8, in some embodiments, G is the color green, R is the color red, and B is the color blue. In some other embodiments, other colors associated with other wavelengths of light, including magenta and cyan, may be used in addition to or may replace one or more of red, green, or blue. In some embodiments, features 320, 330, 340, and 350 may be active or passive optical filters configured to block or selectively light from the ambient environment to the viewer's eyes.

It will be appreciated that references to a given color of light throughout this disclosure will be understood to encompass light of one or more wavelengths within a range of wavelengths of light that are perceived by a viewer as being of that given color. For example, red light may include light of one or more wavelengths in the range of about 620-780 nm, green light may include light of one or more wavelengths in the range of about 492-577 nm, and blue light may include light of one or more wavelengths in the range of about 435-493 nm.

In some embodiments, the light source 530 (FIG. 6) may be configured to emit light of one or more wavelengths outside the visual perception range of the viewer, for example, infrared and/or ultraviolet wavelengths. In addition, the in-coupling, out-coupling, and other light redirecting structures of the waveguides of the display 250 may be configured to direct and emit this light out of the display towards the user's eye 210, e.g., for imaging and/or user stimulation applications.

Figure 9A:
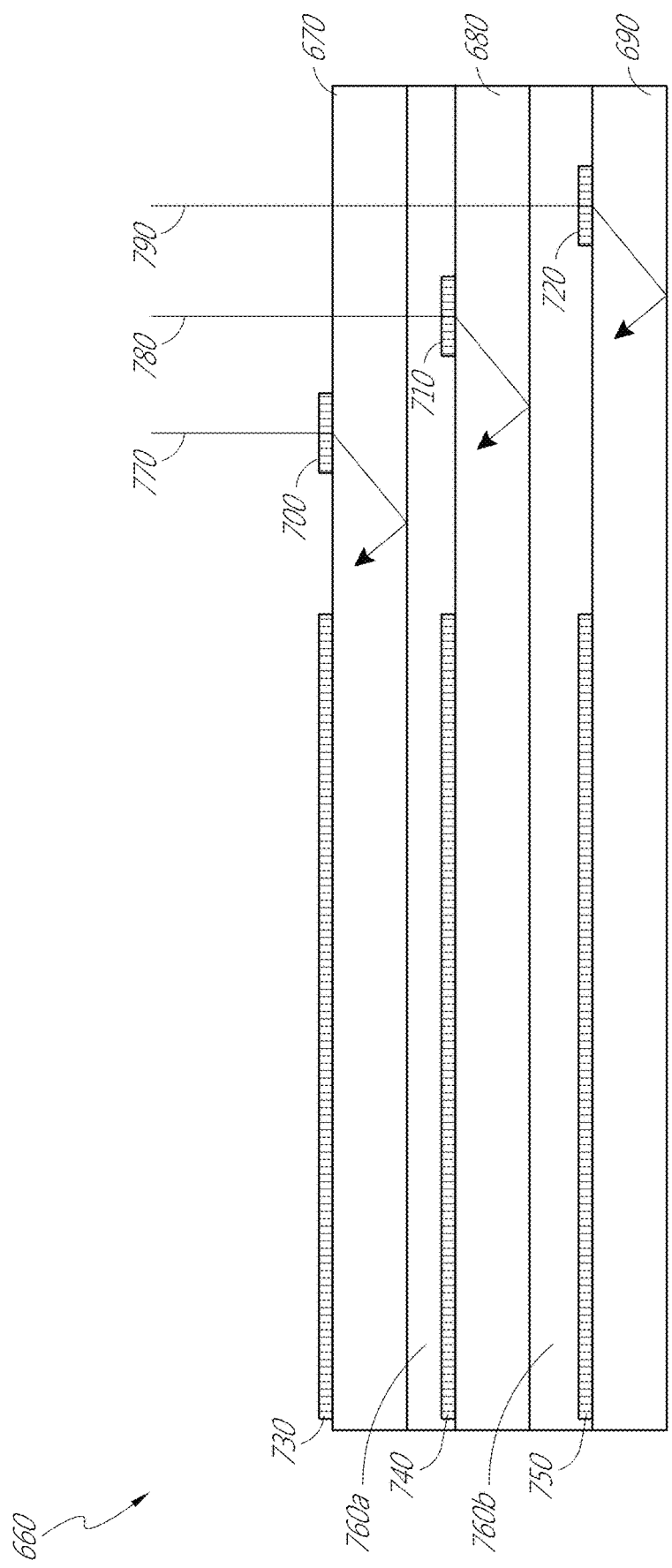
FIG. 9A illustrates a cross-sectional side view of an example of a set of stacked waveguides that each includes an in-coupling optical element.

With reference now to FIG. 9A, in some embodiments, light impinging on a waveguide may need to be redirected to in-couple that light into the waveguide. An in-coupling optical element may be used to redirect and in-couple the light into its corresponding waveguide. FIG. 9A illustrates a cross-sectional side view of an example of a plurality or set 660 of stacked waveguides that each includes an in-coupling optical element. The waveguides may each be configured to output light of one or more different wavelengths, or one or more different ranges of wavelengths. It will be appreciated that the stack 660 may correspond to the stack 260 (FIG. 6) and the illustrated waveguides of the stack 660 may correspond to part of the plurality of waveguides 270, 280, 290, 300, 310, except that light from one or more of the image injection devices 360, 370, 380, 390, 400 is injected into the waveguides from a position that requires light to be redirected for in-coupling.

The illustrated set 660 of stacked waveguides includes waveguides 670, 680, and 690. Each waveguide includes an associated in-coupling optical element (which may also be referred to as a light input area on the waveguide), with, e.g., in-coupling optical element 700 disposed on a major surface (e.g., an upper major surface) of waveguide 670, in-coupling optical element 710 disposed on a major surface (e.g., an upper major surface) of waveguide 680, and in-coupling optical element 720 disposed on a major surface (e.g., an upper major surface) of waveguide 690. In some embodiments, one or more of the in-coupling optical elements 700, 710, 720 may be disposed on the bottom major surface of the respective waveguide 670, 680, 690 (particularly where the one or more in-coupling optical elements are reflective, deflecting optical elements). As illustrated, the in-coupling optical elements 700, 710, 720 may be disposed on the upper major surface of their respective waveguide 670, 680, 690 (or the top of the next lower waveguide), particularly where those in-coupling optical elements are transmissive, deflecting optical elements. In some embodiments, the in-coupling optical elements 700, 710, 720 may be disposed in the body of the respective waveguide 670, 680, 690. In some embodiments, as discussed herein, the in-coupling optical elements 700, 710, 720 are wavelength selective, such that they selectively redirect one or more wavelengths of light, while transmitting other wavelengths of light. While illustrated on one side or corner of their respective waveguide 670, 680, 690, it will be appreciated that the in-coupling optical elements 700, 710, 720 may be disposed in other areas of their respective waveguide 670, 680, 690 in some embodiments.

As illustrated, the in-coupling optical elements 700, 710, 720 may be laterally offset from one another. In some embodiments, each in-coupling optical element may be offset such that it receives light without that light passing through another in-coupling optical element. For example, each in-coupling optical element 700, 710, 720 may be configured to receive light from a different image injection device 360, 370, 380, 390, and 400 as shown in FIG. 6, and may be separated (e.g., laterally spaced apart) from other in-coupling optical elements 700, 710, 720 such that it substantially does not receive light from the other ones of the in-coupling optical elements 700, 710, 720.

Each waveguide also includes associated light distributing elements, with, e.g., light distributing elements 730 disposed on a major surface (e.g., a top major surface) of waveguide 670, light distributing elements 740 disposed on a major surface (e.g., a top major surface) of waveguide 680, and light distributing elements 750 disposed on a major surface (e.g., a top major surface) of waveguide 690. In some other embodiments, the light distributing elements 730, 740, 750, may be disposed on a bottom major surface of associated waveguides 670, 680, 690, respectively. In some other embodiments, the light distributing elements 730, 740, 750, may be disposed on both top and bottom major surface of associated waveguides 670, 680, 690, respectively; or the light distributing elements 730, 740, 750, may be disposed on different ones of the top and bottom major surfaces in different associated waveguides 670, 680, 690, respectively.

The waveguides 670, 680, 690 may be spaced apart and separated by, e.g., gas, liquid, and/or solid layers of material. For example, as illustrated, layer 760a may separate waveguides 670 and 680; and layer 760b may separate waveguides 680 and 690. In some embodiments, the layers 760a and 760b are formed of low refractive index materials (that is, materials having a lower refractive index than the material forming the immediately adjacent one of waveguides 670, 680, 690). Preferably, the refractive index of the material forming the layers 760a, 760b is 0.05 or more, or 0.10 or less than the refractive index of the material forming the waveguides 670, 680, 690. Advantageously, the lower refractive index layers 760a, 760b may function as cladding layers that facilitate TIR of light through the waveguides 670, 680, 690 (e.g., TIR between the top and bottom major surfaces of each waveguide). In some embodiments, the layers 760a, 760b are formed of air. While not illustrated, it will be appreciated that the top and bottom of the illustrated set 660 of waveguides may include immediately neighboring cladding layers.

Preferably, for ease of manufacturing and other considerations, the material forming the waveguides 670, 680, 690 are similar or the same, and the material forming the layers 760a, 760b are similar or the same. In some embodiments, the material forming the waveguides 670, 680, 690 may be different between one or more waveguides, and/or the material forming the layers 760a, 760b may be different, while still holding to the various refractive index relationships noted above.

With continued reference to FIG. 9A, light rays 770, 780, 790 are incident on the set 660 of waveguides. It will be appreciated that the light rays 770, 780, 790 may be injected into the waveguides 670, 680, 690 by one or more image injection devices 360, 370, 380, 390, 400 (FIG. 6).

In some embodiments, the light rays 770, 780, 790 have different properties, e.g., different wavelengths or different ranges of wavelengths, which may correspond to different colors. The in-coupling optical elements 700, 710, 720 each deflect the incident light such that the light propagates through a respective one of the waveguides 670, 680, 690 by TIR.

For example, in-coupling optical element 700 may be configured to deflect ray 770, which has a first wavelength or range of wavelengths. Similarly, the transmitted ray 780 impinges on and is deflected by the in-coupling optical element 710, which is configured to deflect light of a second wavelength or range of wavelengths. Likewise, the ray 790 is deflected by the in-coupling optical element 720, which is configured to selectively deflect light of third wavelength or range of wavelengths.

With continued reference to FIG. 9A, the deflected light rays 770, 780, 790 are deflected so that they propagate through a corresponding waveguide 670, 680, 690; that is, the in-coupling optical elements 700, 710, 720 of each waveguide deflects light into that corresponding waveguide 670, 680, 690 to in-couple light into that corresponding waveguide. The light rays 770, 780, 790 are deflected at angles that cause the light to propagate through the respective waveguide 670, 680, 690 by TIR. The light rays 770, 780, 790 propagate through the respective waveguide 670, 680, 690 by TIR until impinging on the waveguide's corresponding light distributing elements 730, 740, 750.

Figure 9B:
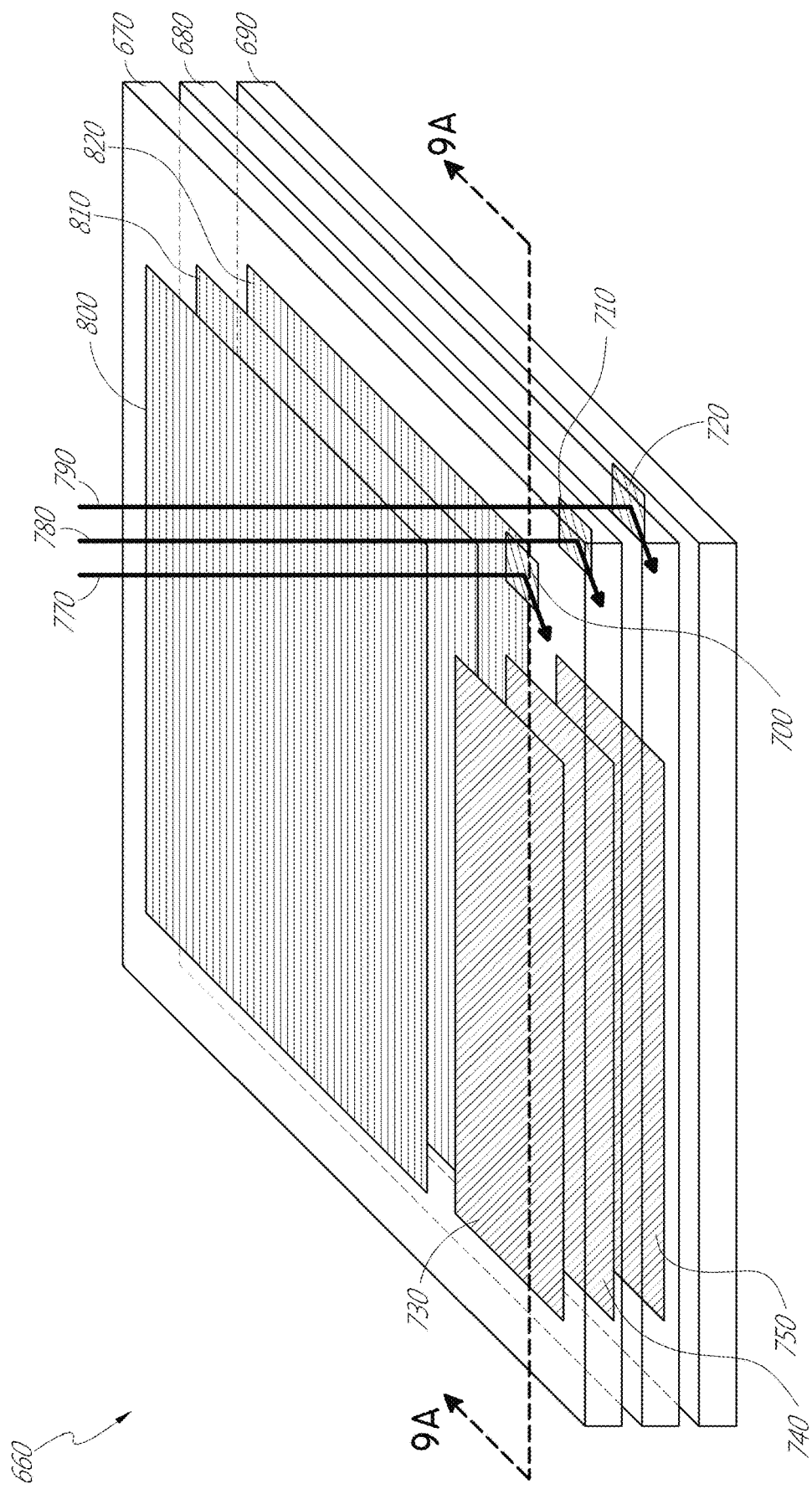
FIG. 9B illustrates a perspective view of an example of the plurality of stacked waveguides of FIG. 9A.

With reference now to FIG. 9B, a perspective view of an example of the plurality of stacked waveguides of FIG. 9A is illustrated. As noted above, the in-coupled light rays 770, 780, 790, are deflected by the in-coupling optical elements 700, 710, 720, respectively, and then propagate by TIR within the waveguides 670, 680, 690, respectively. The light rays 770, 780, 790 then impinge on the light distributing elements 730, 740, 750, respectively. The light distributing elements 730, 740, 750 deflect the light rays 770, 780, 790 so that they propagate towards the out-coupling optical elements 800, 810, 820, respectively.

In some embodiments, the light distributing elements 730, 740, 750 are orthogonal pupil expanders (OPE's). In some embodiments, the OPE's both deflect or distribute light to the out-coupling optical elements 800, 810, 820 and also increase the beam or spot size of this light as it propagates to the out-coupling optical elements. In some embodiments, e.g., where the beam size is already of a desired size, the light distributing elements 730, 740, 750 may be omitted and the in-coupling optical elements 700, 710, 720 may be configured to deflect light directly to the out-coupling optical elements 800, 810, 820. For example, with reference to FIG. 9A, the light distributing elements 730, 740, 750 may be replaced with out-coupling optical elements 800, 810, 820, respectively. In some embodiments, the out-coupling optical elements 800, 810, 820 are exit pupils (EP's) or exit pupil expanders (EPE's) that direct light in a viewer's eye 210 (FIG. 7). It will be appreciated that the OPE's may be configured to increase the dimensions of the eye box in at least one axis and the EPE's may be to increase the eye box in an axis crossing, e.g., orthogonal to, the axis of the OPEs.

Accordingly, with reference to FIGS. 9A and 9B, in some embodiments, the set 660 of waveguides includes waveguides 670, 680, 690; in-coupling optical elements 700, 710, 720; light distributing elements (e.g., OPE's) 730, 740, 750; and out-coupling optical elements (e.g., EP's) 800, 810, 820 for each component color. The waveguides 670, 680, 690 may be stacked with an air gap/cladding layer between each one. The in-coupling optical elements 700, 710, 720 redirect or deflect incident light (with different in-coupling optical elements receiving light of different wavelengths) into its waveguide. The light then propagates at an angle which will result in TIR within the respective waveguide 670, 680, 690. In the example shown, light ray 770 (e.g., blue light) is deflected by the first in-coupling optical element 700, and then continues to bounce down the waveguide, interacting with the light distributing element (e.g., OPE's) 730 and then the out-coupling optical element (e.g., EPs) 800, in a manner described earlier. The light rays 780 and 790 (e.g., green and red light, respectively) will pass through the waveguide 670, with light ray 780 impinging on and being deflected by in-coupling optical element 710. The light ray 780 then bounces down the waveguide 680 via TIR, proceeding on to its light distributing element (e.g., OPEs) 740 and then the out-coupling optical element (e.g., EP's) 810. Finally, light ray 790 (e.g., red light) passes through the waveguide 690 to impinge on the light in-coupling optical elements 720 of the waveguide 690. The light in-coupling optical elements 720 deflect the light ray 790 such that the light ray propagates to light distributing element (e.g., OPEs) 750 by TIR, and then to the out-coupling optical element (e.g., EPs) 820 by TIR. The out-coupling optical element 820 then finally out-couples the light ray 790 to the viewer, who also receives the out-coupled light from the other waveguides 670, 680.

Figure 9C:
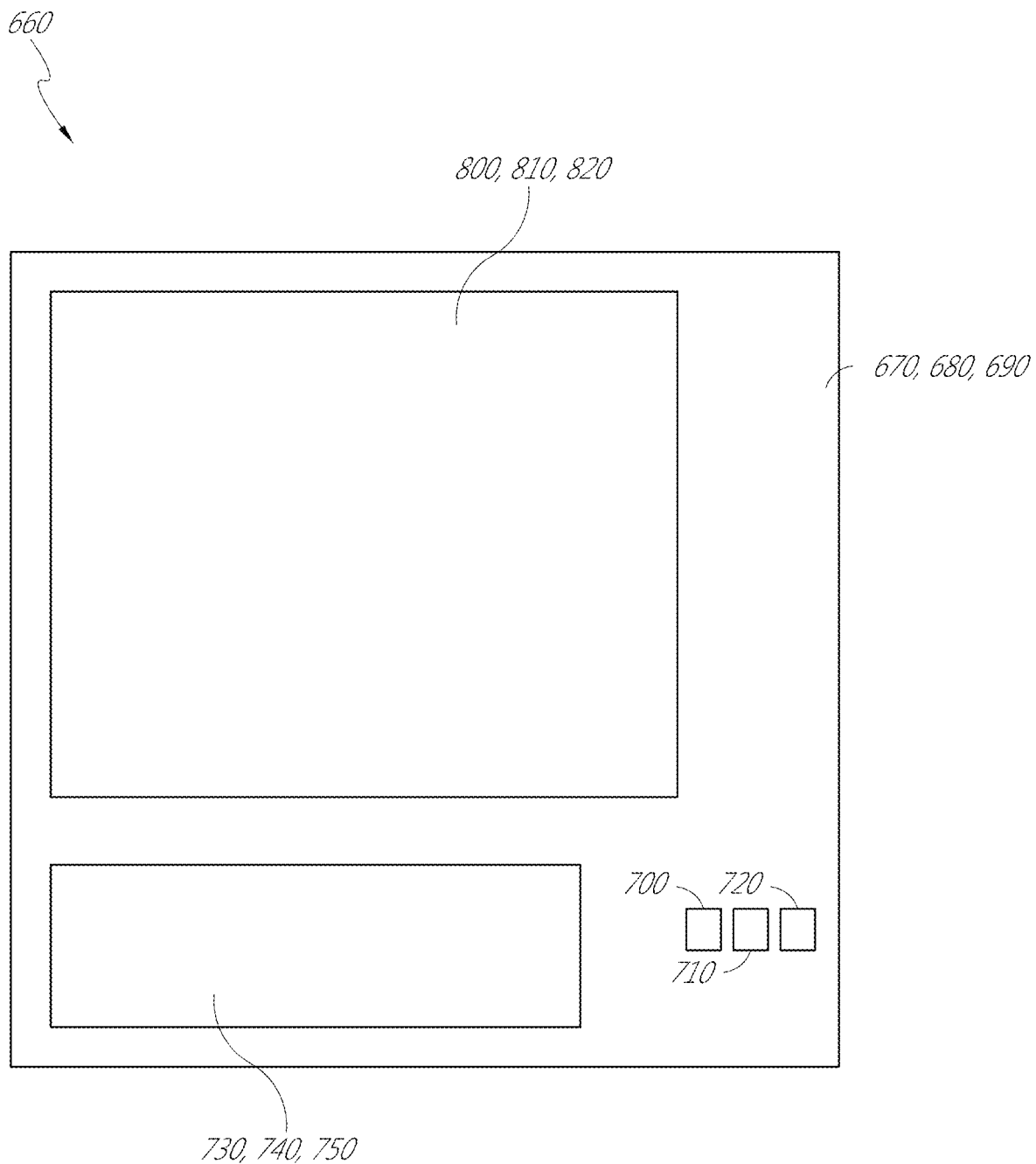
FIG. 9C illustrates a top-down plan view of an example of the plurality of stacked waveguides of FIGS. 9A and 9B.

FIG. 9C illustrates a top-down plan view of an example of the plurality of stacked waveguides of FIGS. 9A and 9B. As illustrated, the waveguides 670, 680, 690, along with each waveguide's associated light distributing element 730, 740, 750 and associated out-coupling optical element 800, 810, 820, may be vertically aligned. However, as discussed herein, the in-coupling optical elements 700, 710, 720 are not vertically aligned; rather, the in-coupling optical elements are preferably non-overlapping (e.g., laterally spaced apart as seen in the top-down view). As discussed further herein, this nonoverlapping spatial arrangement facilitates the injection of light from different resources into different waveguides on a one-to-one basis, thereby allowing a specific light source to be uniquely coupled to a specific waveguide. In some embodiments, arrangements including nonoverlapping spatially-separated in-coupling optical elements may be referred to as a shifted pupil system, and the in-coupling optical elements within these arrangements may correspond to sub pupils.

Liquid Crystal Gratings

Liquid crystals are partly ordered materials whose molecules are often shaped like rods or plates that may be aligned along a certain direction. The direction and pattern along which the molecules of the liquid crystal are oriented may be manipulated by the use of a template pattern that interacts with the molecules (e.g., through steric and/or anchoring energy interactions). In addition, the liquid crystal materials may comprise chiral dopants and/or reactive mesogens (RMs). The chiral dopants may cause rotation of the liquid crystal molecules over the thickness of the liquid crystal material and the reactive mesogens may allow the orientations and positions of the liquid crystal molecules to be fixed through polymerization. The rotation may be by increments corresponding to a twist angle ($\Phi$) such as shown in FIG. 10C.

As described herein, the in-coupling optical elements 700, 710, 720; light distributing elements (e.g., OPE's) 730, 740, 750; and out-coupling optical elements (e.g., EP's) 800, 810, 820 discussed above with reference to FIGS. 9A and 9B can include liquid crystal grating structures for steering light into and/or out of the waveguides 670, 680, 690. The liquid crystal grating structures can preferably diffract or redirect light at large angles relative to a normal to the grating to, e.g., facilitate the in-coupling of light into a waveguide such that the light propagates through the waveguide by TIR. Additionally, it may be preferable if the liquid crystal grating structures have high diffraction efficiencies for a wide range of incident angles. Some types of liquid crystal gratings, i.e., polarization gratings, can exhibit high diffraction efficiencies over a wide range of incident angles at large diffraction angles, which can guide light into a waveguide by TIR. Conventional alignment methods, however, including photo-alignment and micro-rubbing techniques have challenges for scaling for volume manufacturing and fundamental limits in spatial patterns of LC materials. LC alignment with imprint templates having sub-wavelength features (e.g., nano-scale patterns) can allow for volume manufacturing and/or provide flexibility to create arbitrary spatial patterns.

Various embodiments of conventional diffraction gratings may achieve high diffraction efficiencies for only a small range of wavelengths. Thus, they may not be capable of broadband operation. It has been found that metasurfaces comprising sub-wavelength features are capable of shaping the optical wavefront by altering phase, amplitude and/or polarization of an incoming light. LC material in which the LC molecules are aligned using an imprint template having nano-scale features that form a metasurface may be used to obtain a liquid crystal metasurface which may have optical properties that are different from the optical properties of a liquid crystal bulk material. For example, a liquid crystal metasurface be broadband and have the ability to diffract incoming light in a wide range of wavelength incident in a wide range of incident angles with high efficiency. For example, a LC metasurface may be capable of diffracting red, green and blue wavelengths of incoming light along a desired direction with approximately same diffraction efficiency. Examples of LC metasurface can include liquid crystal metamaterials and/or liquid crystal based Pancharatnam-Berry phase optical elements (PBPE).

Alignment of liquid crystal molecules using nano-imprint technology as discussed herein can be used to fabricate liquid crystal material with a plurality of distinct alignment patterns with progressive transition (e.g., continuous transition) of the liquid crystal molecule director between neighboring alignment patterns. In various embodiments, grating period can refer to the distance between centers of two consecutive liquid crystal molecules of a grating structure having longitudinal axes oriented along the same direction. In some embodiments of liquid crystal materials having a plurality of neighboring alignment patterns, grating period can refer to the distance between centers of consecutive liquid crystal molecules of each alignment pattern.

Advantageously, various liquid crystal grating structures discussed herein are preferably configured to provide high diffraction efficiency for a wide range of incident angles (e.g., between at least about ±20-degrees about the surface normal, between at least about ±30-degrees about the surface normal, between at least about ±45-degrees about the surface normal, etc.). For example, the liquid crystal grating structures can be configured to provide a diffraction efficiency of at least about 10% (e.g., at least 20%, 30%, 40%, 50%, 60% or 75%) for light incident at an angle between about ±50 degrees with respect to a surface normal for wavelengths between about 400 nm and about 700 nm. Accordingly, the liquid crystal grating structures described herein may advantageously have low sensitivity to the angle of incidence of light. In some embodiments, the liquid crystal grating structures discussed herein are configured to be narrowband. For example, the liquid crystal grating structures discussed herein can be configured to diffract wavelengths in the visible spectral range between about 400 nm and about 450 nm; between about 450 nm and about 500 nm; between about 500 nm and about 550 nm; between about 550 nm and about 600 nm; between about 600 nm and about 650 nm; between about 650 nm and about 700 nm. In some other embodiments, the liquid crystal grating structures discussed herein are configured to be broadband. For example, the liquid crystal grating structures discussed herein can be configured to diffract wavelengths in the visible spectral range between about 400 nm and about 700 nm. As another example, the liquid crystal grating structures discussed herein can be configured to diffract wavelengths in the ultraviolet spectral range between about 250 nm-400 nm. As yet another example, the liquid crystal grating structures discussed herein can be configured to diffract wavelengths in the infrared spectral range, such as, for example, between about 700 nm-1 micron, between about 1 micron-3 micron, between about 1.5 micron-5 micron, between about 3 micron-10 micron or any combination of these ranges or any subrange within these ranges or combination of sub-ranges. As another example, the grating structures can be configured to diffract incident light having a wavelength in a range between about 300 nm and about 10 µm. Preferably, when liquid crystal grating structures as discussed herein are employed in display applications, the grating structure is configured to diffract visible light (e.g., in red, green and/or blue spectral ranges). In various embodiments, the liquid crystal grating structures can diffract visible light (such as in red, green and/or blue spectral ranges) so that the light propagates away from the grating structure at wide diffraction angles, e.g., angles suitable for TIR within a waveguide on which the grating structure may be formed. The liquid crystal grating structures discussed herein can have a grating period in the range between about 100 nm and about 100 µm depending on the wavelength range that the grating structure is configured to operate on. For example, the periodicity of the grating structure may be between about 10 nm and about 50 nm; between about 20 nm and about 60 nm; between about 30 nm and about 70 nm; between about 40 nm and about 80 nm; between about 50 nm and about 90 nm; between about 60 nm and about 100 nm; between about 100 nm and about 200 nm; between about 200 nm and about 350 nm; between about 330 nm and about 410 nm; between about 370 nm and about 480 nm; between about 450 nm and about 510 nm; between about 500 nm and about 570 nm; between about 550 nm and about 700 nm; between about 650 nm and about 1 µm; between about 980 nm and about 3 µm; between about 1.3 µm and about 3.2 µm; between about 2.3 µm and about 5 µm; between about 5 µm and about 10 µm; between about 5 µm and about 20 µm; between about 15 µm and about 45 µm; between about 25 µm and about 60 µm; between about 35 µm and about 75 µm; between about 45 µm and about 100 µm or any combination of these ranges or any subrange within these ranges or combination of sub-ranges.

The grating structures may be fabricated using a variety of methods including but not limited to aligning liquid crystal molecules in a layer of polymerizable liquid crystal material using a patterned alignment layer, which may underlie the liquid crystal material. The alignment layer may be patterned using imprint technology or by using optical methods.

As discussed above, in some embodiments, the liquid crystal grating structures may form light redirecting elements for the various waveguides of the waveguide stacks 260 (FIG. 6) or 660 (FIGS. 9A-9C). For example, such liquid crystal grating structures may advantageously be applied to form the in-coupling optical elements 3012, 3014, 3016, and/or 3018 (FIGS. 8A-8E) and/or the in-coupling optical elements 700, 710, 720; the light distributing elements 730, 740, 750; and/or the out-coupling optical elements 800, 810, 820 (FIGS. 9A-9C). In addition to AR display systems, the liquid crystal grating structures may be applied in other applications in which diffractive optical elements are utilized. For example, the liquid crystal grating structures may be utilized to steer light in other optical systems, including VR display systems, flat panel computer monitors or televisions, illuminated signs, imaging systems, etc.

Figure 10A:
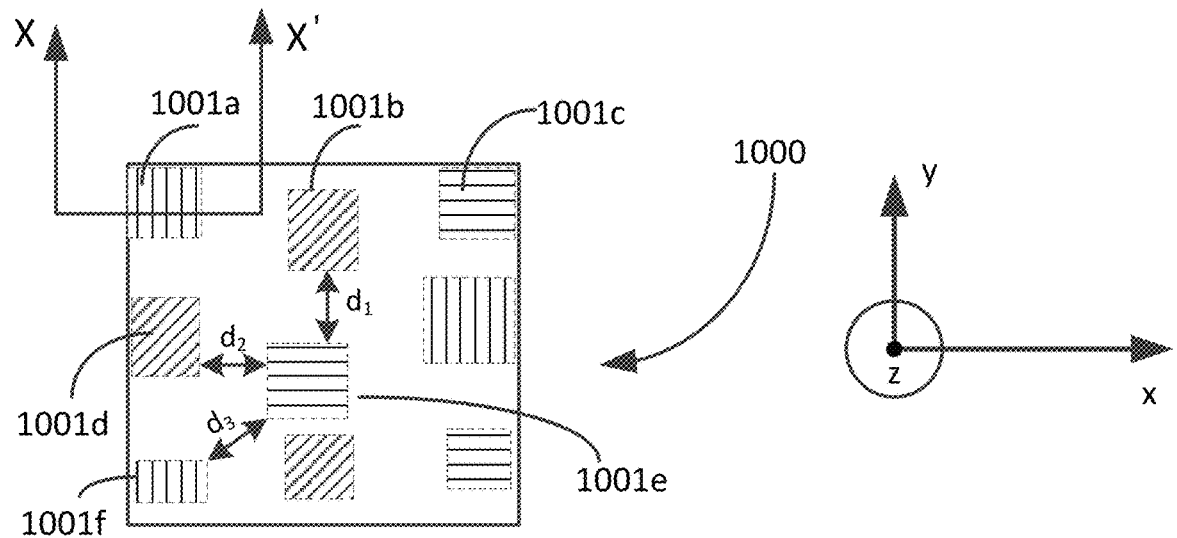
FIG. 10A illustrates a top view of an example of a liquid crystal layer comprising a plurality of domains of liquid crystal molecules.

FIG. 10A illustrates a top-down perspective view of an example of a liquid crystal layer 1000 comprising a plurality of domains (e.g., domains 1001a, 1001b, 1001c, 1001d, 1001e and 1001f) adjacent each other. The longitudinal axes of the liquid crystal molecules in each domain may be generally oriented along the same direction. The longitudinal axes of the liquid crystal molecules in adjacent domains need not be oriented along the same direction. For example, the longitudinal axes of liquid crystal molecules in each domain 1001b and 1001d, which are adjacent to the domain 1001a, are oriented along a direction different from the direction along which the longitudinal axes of the liquid crystal molecules of domain 1001a are oriented. Although, in the embodiment illustrated in FIG. 10A only nine domains are illustrated, other embodiments may have fewer than or greater than nine domains. Furthermore, although only three different orientations of the longitudinal axes of the liquid crystal molecules are shown in FIG. 10A, other embodiments may comprise domains with more or less than three different orientations. Additionally, in various embodiments of liquid crystal layers, different domains can have different shapes and/or sizes. In various embodiments, the different domains can have different shapes (e.g., square, rectangular, hexagon, octagon, oval, circle, etc.). In various embodiments, different domains can have irregular shapes.

Figure 10B:
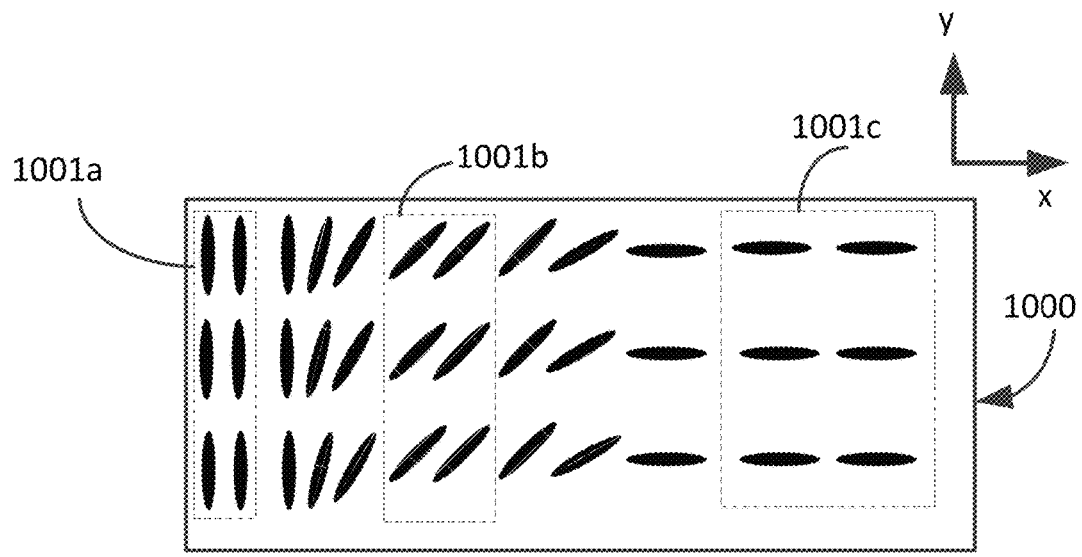
FIG. 10B illustrates a magnified top view of the liquid crystal layer depicted in FIG. 10A showing the orientation of the liquid crystal molecules in each domain.
Figure 10C:
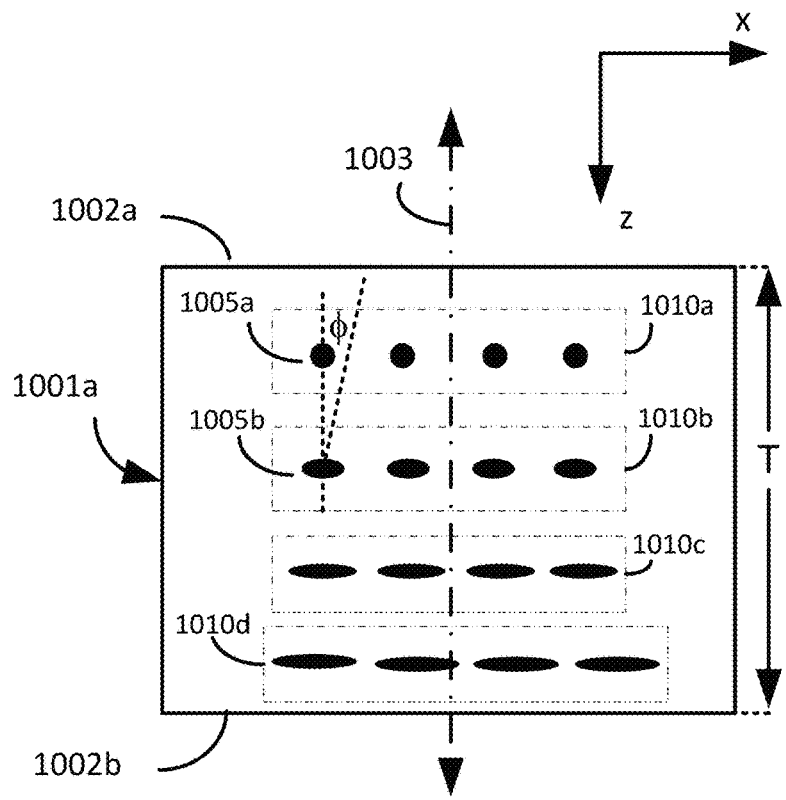
FIGS. 10C, 10D, 10E and 10F illustrate side views of various embodiment of the liquid crystal layer depicted in FIG. 10A.

FIG. 10B illustrates a magnified top view of the liquid crystal layer 1000 illustrated in FIG. 10A. This top view of FIG. 10B shows the liquid crystal molecules on the top of the liquid crystal layer 1000 which may be referred to herein as the top-sublayer. The liquid crystal molecules beneath the top or uppermost liquid crystal molecules (e.g., beneath the top or uppermost sublayer) may have different orientations as shown in FIG. 10C. FIGS. 10C-10F illustrate a cross-section view of the liquid along the axis X-X' of the liquid crystal layer 1000. The liquid crystal layer 1000 has two major surfaces 1002a and 1002b as seen in the cross-sectional view depicted in FIGS. 10C-10F. The two major surfaces 1002a and 1002b are intersected by a surface normal 1003. The two major surfaces 1002a and 1002b extend in the x-y plane and the surface normal 1003 extends parallel to the z-axis. As noted from magnified top view depicted in FIG. 10B, the longitudinal axes of uppermost liquid crystal molecules in the first domain 1001a are generally oriented parallel to the y-axis. The longitudinal axes of liquid crystal molecules in the second domain 1001b are generally oriented at an angle (e.g., between about 30 degrees and 60 degrees) with respect to the y-axis. The longitudinal axes of liquid crystal molecules in the third domain 1001c are generally oriented perpendicular to the y- and z-axis.

The liquid crystal layer 1000 can be considered to have a plurality of sub-layers, such as, for example, sub-layers 1010a, 1010b, 1010c, and 1010d. Each sublayer (e.g., 1010a, 1010b, 1010c, or 1010d) may be defined by a plurality of liquid crystal molecules arranged in a common plane and, as such, each sublayer may only be a single liquid crystal molecule thick. The sublayers form an aggregate layer of liquid crystal material having a thickness T, which may be equal to the total thickness of all sublayers. While three/four sublayers are illustrated, it will be appreciated that the liquid crystal layer 1000 may include more or fewer sublayers.

In various embodiments the liquid crystal layer 1000 can comprise a chiral nematic liquid crystal material. For example, the plurality of sublayers of liquid crystal material may comprise a cholesteric liquid crystal material. In embodiments of liquid crystal layer 1000 comprising chiral materials, the liquid crystal molecules may have a twist angle ϕ defined by the angular rotation between the longitudinal axis of a liquid crystal molecule (e.g., 1005a) of a sub-layer (e.g., 1010a) of the liquid crystal layer 1000, and the longitudinal axis of an underlying liquid crystal molecule (e.g., 1005b) of an adjacent sub-layer (e.g., 1010b) as shown in FIG. 10C. The liquid crystal material may also be polymerizable. As discussed herein, the liquid crystal material may comprise a reactive mesogen (RM), such as, for example, liquid crystalline di-acrylate. As also discussed herein, the liquid crystal layer 1000 can include chiral dopants. Examples of chiral dopants include cholesteryl benzoate, cholesteryl nonanoate, cholesteryl chloride, and cholesteryl oleyl carbonate.

Figure 10D:
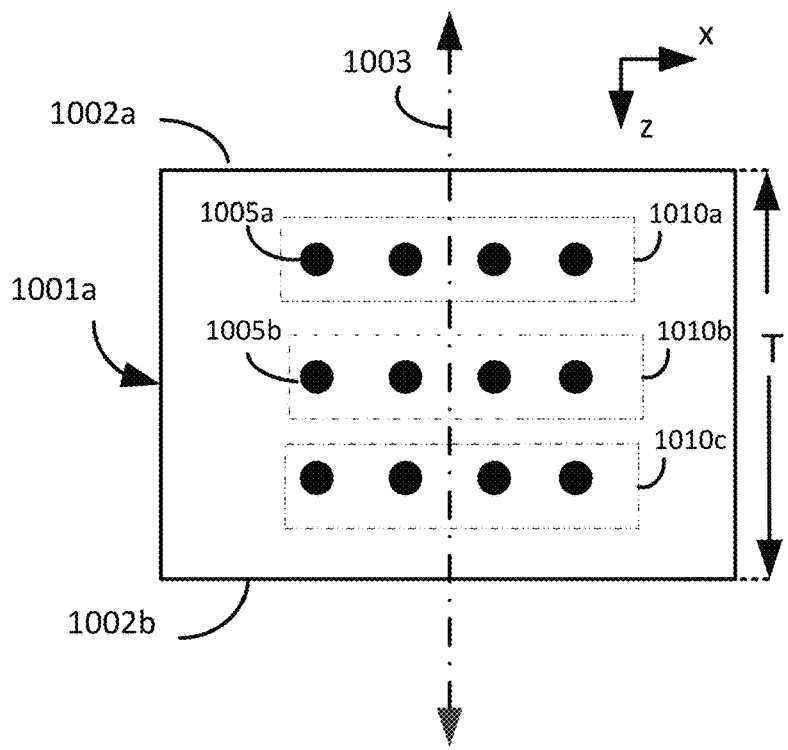
Figure 10E:
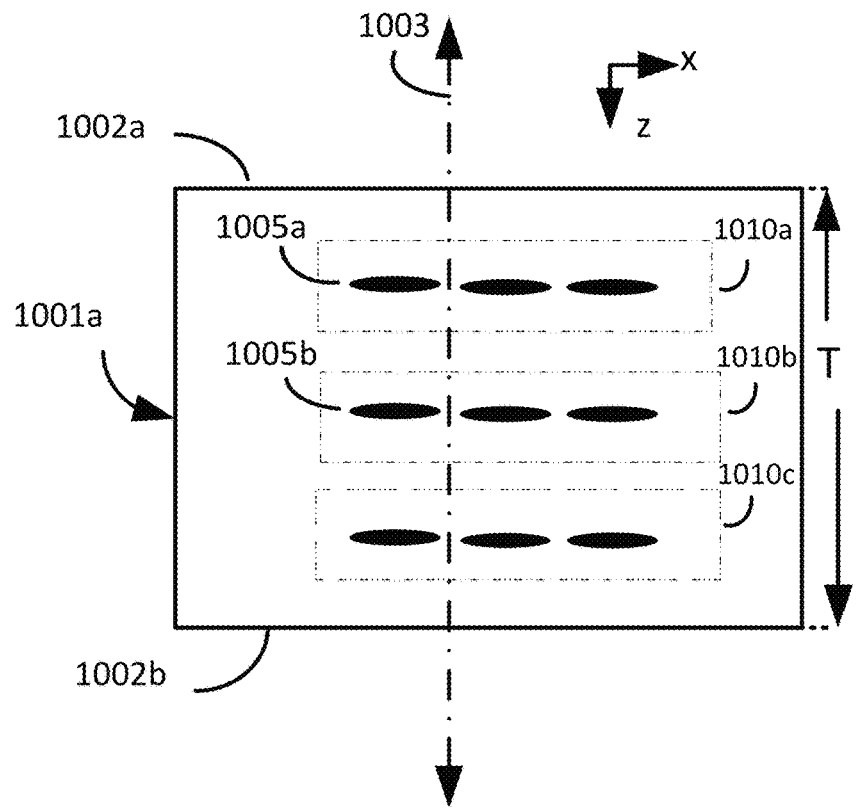
Figure 10F:
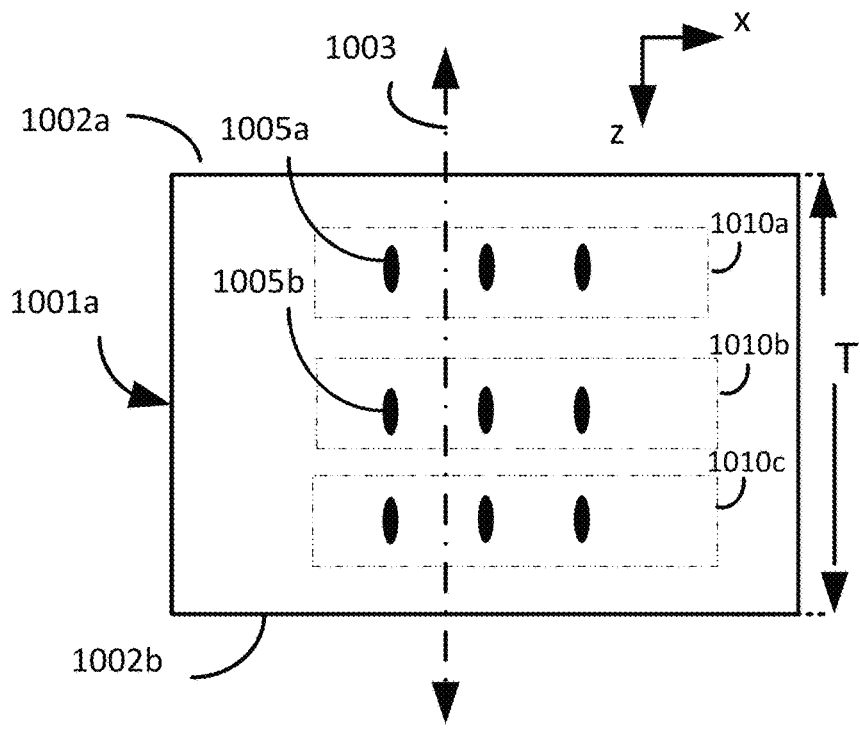

The liquid crystal however need not be chiral liquid crystal material. As shown in FIGS. 10D-10F, the longitudinal axes of the molecules of sub-layer 1010a are not twisted with respect to the molecules of the underlying sub-layers 1010b or 1010c. The longitudinal axes of the liquid crystal molecules can be aligned along any of the x, y or z-axis. For example, as shown in FIG. 10D, the longitudinal axis of the liquid crystal molecules is aligned parallel to the y-axis. As another example, as shown in FIG. 10E, the longitudinal axis of the liquid crystal molecules is aligned parallel to the x-axis. As yet another example, as shown in FIG. 10F, the longitudinal axis of the liquid crystal molecules is aligned parallel to the z-axis. The side-views shown in FIGS. 10C-10F can correspond equally to FIG. 10A or 10B.

With reference to FIGS. 10A and 10B, it may be desirable to introduce a small domain gap 'd' between adjacent domains with different alignment patterns. The presence of the small gap between adjacent domains with different alignment patterns can advantageously reduce occurrence of disclinations or other surface defects along the domain boundary during manufacture of the liquid crystal layer 1000. Reduced disclinations or other surface defects along the domain boundaries of the liquid crystal layer 1000 can reduce unwanted light scattering and other undesirable optical effects. The domain gap 'd' can refer to the shortest distance between the nearest edges of an adjacent pair of domains. For example, in the illustrated embodiment, the domain gap between the domain 1001e and the domain 1001b is $d_1$, the domain distance between the domain 1001e and the domain 1001d is $d_2$, the domain distance between the domain 1001e and the domain 1001f is $d_3$. The domain gap 'd' between adjacent domains with different alignment patterns can be configured to achieve progressive transition of the longitudinal axes of the liquid crystal molecules between adjacent domains with different alignment patterns and have reduced occurrence of disclinations or other surface defects along the domain boundary. For example, the domain gap 'd' between adjacent domains with different alignment patterns can be configured to achieve continuous transition of the longitudinal axes of the liquid crystal molecules between adjacent domains with different alignment patterns. The domain gap between adjacent domains with different alignment patterns that is configured to achieve continuous transition of liquid crystal molecule can be less than 200 nm. For example, the domain gap between adjacent domains with different alignment patterns can be between about 1 nm and about 20 nm, between about 5 nm and about 30 nm, between about 10 nm and about 50 nm, between about 25 nm and about 75 nm, between about 45 nm and about 100 nm, between about 60 nm and about 120 nm, between about 80 nm and about 150 nm, between 100 nm and about 200 nm or any combination of these ranges or any subrange within these ranges or combination of sub-ranges. As discussed above, the domain gaps are configured such that while the longitudinal axes of the liquid crystal molecules in each domain are aligned in accordance with the alignment pattern in each pattern, the longitudinal axes of the liquid crystal molecules in the gaps between adjacent domains are oriented to provide a gradient or graded transition such as generally smooth or continuous transition of the longitudinal axis of the liquid crystal molecules between adjacent domains.

The liquid crystal layer 1000 can be manufactured using an alignment layer comprising surface relief features. The surface relief features of the alignment layer can induce alignment of molecules of a liquid crystal material deposited on the alignment layer. Under certain conditions, the anchoring energy (W) provided by surface relief structures of an alignment layer, is given by the equation $$W = 2\pi^3 K \frac{D^2}{\Lambda^3},$$

where K is the deformation constant of the liquid crystal material, D is the depth of the surface relief features of the alignment layer and Λ is the width or pitch (distance between two consecutive surface relief features) of the surface relief features. Without any loss of generality, the anchoring energy (W) discussed above can provide a measure of the energy required to change the longitudinal axes of the LC molecule from an initial direction to the desired direction in the plane of the liquid crystal surface. From the above equation, it is noted that as the width or pitch of surface relief structures (Λ) is reduced (assuming the same aspect ratio of the pattern, i.e., depth/period $$\left(\frac{D}{\Lambda}\right)$$

is a constant), a higher anchoring energy is provided by the surface relief features.

Accordingly, an alignment layer comprising surface relief features can be used to manufacture liquid crystal devices in which the liquid crystal molecules are aligned to the pattern formed by the surface relief features. The surface relief features of the alignment layer can comprise a wide variety of groove geometries that can vary in width, pitch and/or direction along length scales of the order of a few nanometers, a few hundred nanometers and/or a few microns. Since, the anchoring energy discussed above is inversely proportional to the cube of the width or pitch of the surface relief features, large variations in anchoring energy can be obtained across the surface of the liquid crystal by making small variations in the width or pitch of the surface relief features. For example, consider an embodiment of an alignment layer including a first domain including a first set of surface relief features arranged to form a first pattern spaced apart by a region not including surface relief features from a second domain including a second set of surface relief features arranged to form a first pattern. Such an embodiment of the alignment layer can be used to fabricate a liquid crystal device with a first domain in which longitudinal axes of the liquid crystal molecules are aligned along directions of the first set of surface relief features and a second domain in which longitudinal axes of the liquid crystal molecules are aligned along directions of the second set of surface relief features. The longitudinal axes of the liquid crystal molecules in the region of the liquid crystal device between the first and the second domains can progressively transition from the directions of the first set of surface relief features to the directions of the second set of surface relief features. The domain gap can be selected such that the transition between the orientation of the longitudinal axes of the liquid crystal molecules of the first domain and the longitudinal axes of the liquid crystal molecules of the second domain is not abrupt or discontinuous but generally smooth. For example, the domain gap corresponding to the region of the alignment layer not including surface relief features can be selected such that the transition between the orientation of the longitudinal axes of the liquid crystal molecules of the first domain and the longitudinal axes of the liquid crystal molecules of the second domain is continuous.

In an embodiment of a method of manufacturing a liquid crystal device in which the liquid crystal molecules are aligned to a wide variety of groove geometries that can vary in width or period and/or direction along length scales of the order of a few nanometers, a few hundred nanometers and/or a few microns, the alignment layer can comprise a polymerizable liquid crystal (PLC), also known as reactive mesogen (RM). The alignment layer can be manufactured by contacting a layer of PLC material with an imprint template comprising a wide variety of grooves that can vary in width or period and direction along length scales of the order of a few nanometers, a few hundred nanometers and/or a few microns. The longitudinal axes of the molecules of the PLC layer can be allowed to self-align to the grooves of the imprint template. For example, the longitudinal axes of the molecules of the PLC layer can self-align to the grooves of the imprint template upon application of heat, upon irradiation with UV light and/or after sufficient passage of time. Once the longitudinal axes of the molecules of the PLC layer are self-aligned to the grooves of the imprint template, the PLC layer is polymerized for example by heat and/or irradiation with UV illumination. Polymerization advantageously fixes the longitudinal axes of the molecules of the PLC layer such that the orientation of the molecules of the PLC layer is maintained even after the PLC layer is separated from the imprint template.

Using an imprint template to manufacture the alignment layer comprising surface relief features having dimensions (e.g., length, width and/or depth) of the order of a few nanometers, a few hundred nanometers and/or a few microns and/or surface relief features arranged to form complex geometric patterns in which the direction and/or the period between consecutive features changes along length scales of the order of a few nanometers, a few hundred nanometers and/or a few microns can be advantageous over other liquid crystal manufacturing methods such as, for example, the rubbing method or the photo-alignment method. For example, as discussed above, it may not be practical to produce surface relief features of the having dimensions (e.g., length, width and/or depth) of the order of a few nanometers, a few hundred nanometers using some micro-rubbing methods that are low resolution methods. Additionally, it may not be possible to manufacture the alignment layer with the throughput necessary to achieve volume manufacturing using some rubbing methods. While, a photo-alignment method can be used to manufacture alignment layer with uniform and non-uniform alignment of liquid crystal molecules, in some instances it may not be practical to produce alignment layer with complex spatial patterns using the photo-alignment method. Similarly to rubbing methods, it is hard to achieve the throughput necessary to achieve volume manufacturing of complex spatial LC patterns using some photo-alignment methods.

Figure 11A:
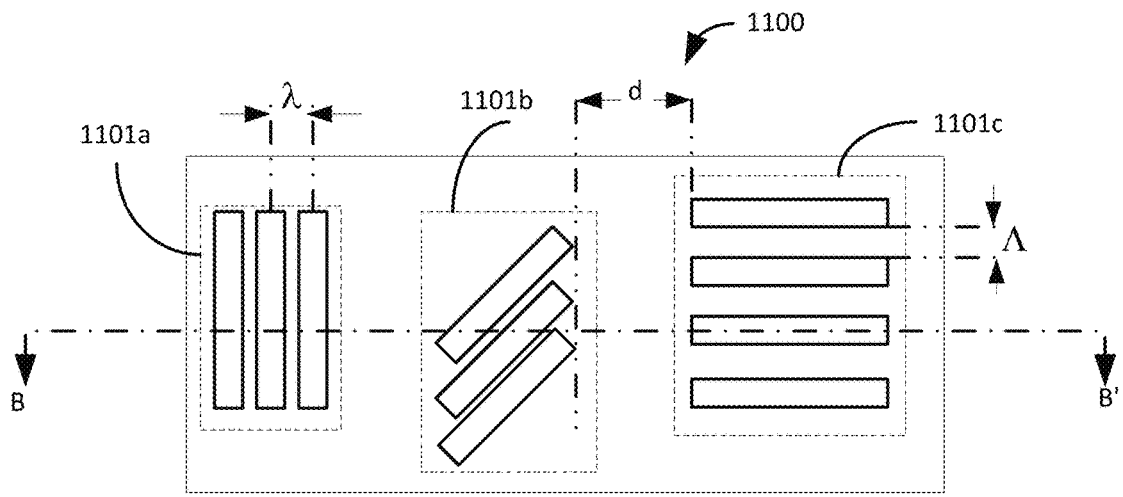
FIG. 11A illustrates a top view of an imprint template including a plurality surface features configured to manufacture the liquid crystal layer depicted in FIG. 10A.
Figure 11B:
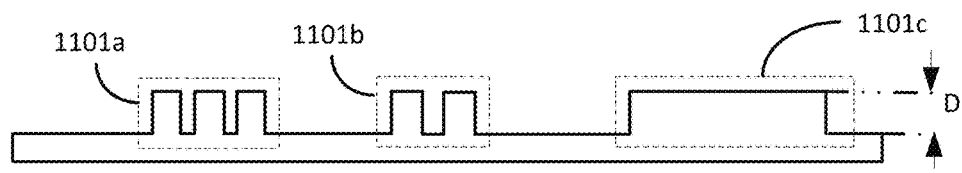
FIG. 11B illustrates a side view of the imprint template depicted in FIG. 11A.

FIG. 11A illustrates a plan view of an embodiment of an imprint template 1100 comprising a plurality of features that can be used to manufacture a liquid crystal layer 1000, such as, for example, the layer 1000 shown in FIG. 10A. FIG. 11B illustrates a cross-sectional view of the imprint template 1100 along the axis B-B'. The imprint template 1100 comprises a plurality of domains (e.g., 1101a, 1101b and 1101c). Each of the plurality of domains includes a plurality of surface relief features. The surface relief features can include linear or curvilinear elongate grooves and/or protrusions, prisms, arcs, raised bumps or depressions. The surface relief features in each of the plurality of domains can be arranged to form a simple or complex geometric pattern. The arrangement of the surface relief features can be configured to manipulate amplitude, phase and/or polarization of incident light to achieve a desired optical effect.

In various embodiments, each of the domains can include sub-wavelength features. In such embodiments, a size of the surface relief features or a gap between adjacent surface relief features can have short length scales of the order of a few nanometers, a few hundred nanometers or a few microns. For example, a width 'λ' of each surface relief feature in each of the plurality of domains can be between about 20 nm and about 100 nm, between about 30 nm and about 90 nm, between about 40 nm and about 80 nm, between about 50 nm and about 75 nm, between about 60 nm and about 70 nm or any combination of these ranges or any subrange within these ranges or combination of subranges. As another example, a gap 'Λ' between consecutive features in each of the plurality of domains can be between about 20 nm and about 100 nm, between about 30 nm and about 90 nm, between about 40 nm and about 80 nm, between about 50 nm and about 75 nm, between about 60 nm and about 70 nm or any combination of these ranges or any subrange within these ranges or combination of sub-ranges. Without any loss of generality, the gap 'Λ' between consecutive features may correspond to the pitch. As yet another example, a depth (or height) 'D' of the features in each of the plurality of domains can be between about 10 nm and about 100 nm, between about 20 nm and about 90 nm, between about 30 nm and about 80 nm, between about 40 nm and about 75 nm, between about 50 nm and about 70 nm or any combination of these ranges or any subrange within these ranges or combination of sub-ranges.

In various embodiments, the domain gap 'd' between adjacent domains can be between about 10 nm and about 100 nm, between about 20 nm and about 90 nm, between about 30 nm and about 80 nm, between about 40 nm and about 75 nm, between about 50 nm and about 70 nm or any combination of these ranges or any subrange within these ranges or combination of sub-ranges. In various embodiments, the plurality of domains comprising surface relief features can be arranged as a square grid across the surface of the imprint template 1100 such that the domain gap 'd' between each pair of adjacent domains is uniform. In other embodiments, the plurality of domains comprising surface relief features can be arranged irregularly across the surface of the imprint template 1100 such that the domain gap 'd' between different pairs of adjacent domains is not uniform. As discussed above, the domain gap introduced between adjacent domains can help in reducing disclination or other surface defects that may occur along the domain boundaries during manufacture of the liquid crystal.

Example Method of Manufacturing a Liquid Crystal Device

Figure 12A:
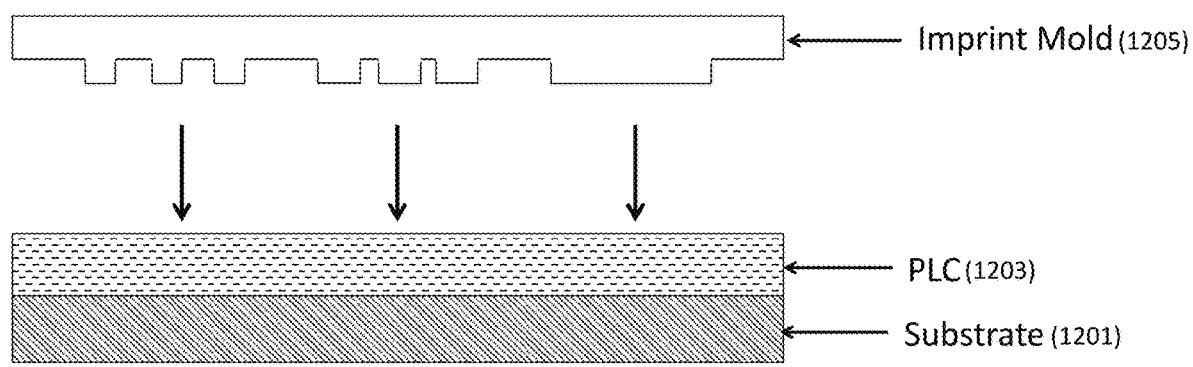
FIGS. 12A-12D illustrate an embodiment of a method of manufacturing a liquid crystal layer including a plurality of liquid crystal molecules arranged in different patterns.

FIGS. 12A-12D illustrates an example of a method of manufacturing various liquid crystal devices described herein. Referring to FIG. 12A, a polymer liquid crystal (PLC) layer 1203 is disposed over a substrate 1201. The substrate 1201 is preferably optically transmissive. Examples of suitable materials for the substrate 1201 include glass, quartz, sapphire, indium tin oxide (ITO), or polymeric materials, including polycarbonate, polyacetate, and acrylic. In some embodiments, the substrate 1201 can be transmissive to light of at least one of visible wavelengths or infrared wavelengths. The substrate can include a pair of major surfaces and surrounding edges. The major surface may be the largest area surface of the substrate, or may be one of a pair of similarly-sized opposing surfaces each having larger areas than other surfaces. The liquid crystal devices can be configured to reflect, refract, diffract or otherwise redirect light incident on or with respect to the major surfaces of the substrate.

In some embodiments, the PLC layer 1203 is configured as an alignment layer that causes the liquid crystal molecules to assume a particular orientation or pattern, for example, due to steric interactions with the liquid crystal molecules, and/or anchoring energy exerted on the subsequently deposited liquid crystal molecules by the photo-alignment layer. The PLC layer 1203 can include polymerizable liquid crystal materials (reactive mesogen). In some embodiments, the PLC layer 1203 can include Azo-containing polymers. The PLC layer 1203 can be disposed on one of the major surfaces of the substrate, e.g., by a spin-coating process or jet deposition. The PLC layer 1203 can have a thickness between about 10 nm and 10 micron.

Figure 12B:
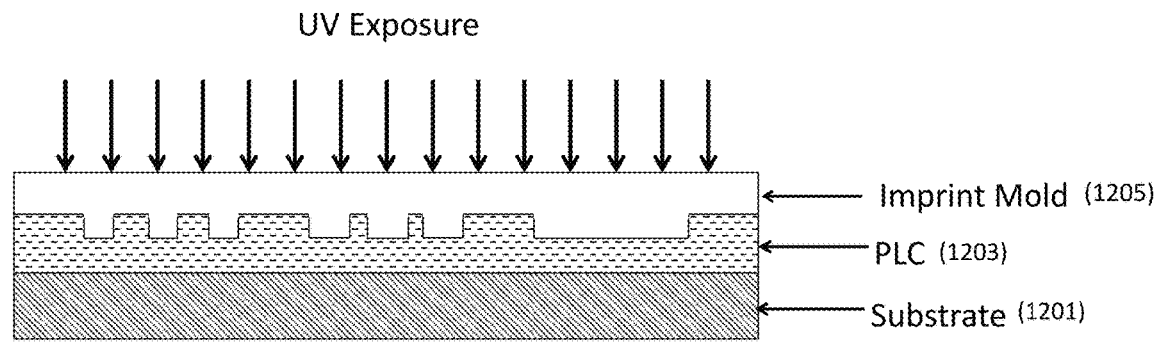

The PLC layer 1203 is imprinted with a plurality of surface relief features by bringing an exposed surface of the PLC layer into contact with an imprint template 1205 as depicted in FIGS. 12A and 12B. The imprint template 1205 can include features that are inverse of the features imprinted on the exposed surface of the PLC layer. In various embodiments, the imprint template 1205 can include features sub-wavelength dimensions. For example, the imprint template 1205 can include features having dimensions (e.g., length, width and/or depth) of the order of a few nanometers, a few hundred nanometers and/or a few microns. For example, the imprint template 1205 can include features having a length greater than or equal to about 20 nm and less than or equal to about 100 nm. As another example, the imprint template 1205 can include features having a width greater than or equal to about 20 nm and less than or equal to about 100 nm. As yet another example, the imprint template 1205 can include features having a depth greater than or equal to about 10 nm and less than or equal to about 100 nm. In various embodiments, the length and/or width of the features can be greater than the depth of the features. However, in some embodiments, the depth can be approximately equal to the length and/or width of the features. The features of each domain of the imprint template 1205 can be arranged to form complex geometric patterns within each domain in which the direction and/or the period between consecutive features changes along length scales of the order of a few nanometers, a few hundred nanometers and/or a few microns. In various embodiments, the imprint template 1205 can include a plurality of spaced-apart domains. Each domain can include a plurality of features having sub-wavelength dimensions. Each domain can be spaced-apart from a neighboring domain by a domain gap. The domain gap can have a value between about 10 nm and about 100 nm, between about 20 nm and about 90 nm, between about 30 nm and about 80 nm, between about 40 nm and about 75 nm, between about 50 nm and about 70 nm or any combination of these ranges or any subrange within these ranges or combination of sub-ranges. In various implementations, the domain gap can be less than or equal to 10 nm and/or greater than or equal to 100 nm. For example, the domain gap can be less than or equal to 5 nm, less than or equal to 2 nm, less than or equal to 1 nm or a value greater than or equal to 0 nm and less than or equal to 10 nm. The imprint template 1205 can have characteristics similar to the imprint template 1100 discussed above with reference to FIGS. 11A and 11B. For example, the plurality of domains of the imprint template 1205 can be arranged as a square grid across the surface of the imprint template 1205 such that the domain gap between neighboring domains is uniform. As another example, the plurality of domains of the imprint template 1505 can be arranged as concentric circular or elliptical regions. In other embodiments, the plurality of domains can be arranged irregularly across the surface of the imprint template 1205 such that the domain gap between neighboring domains is not uniform.

The imprint template 1205 with sub-wavelength features can be designed and fabricated using nano-patterning techniques including optical lithography, nano-imprint, and ion- and electron-beam lithography. In various embodiments, the imprint template can comprise a semiconductor material such as silicon or a glass material.

Figure 12C:
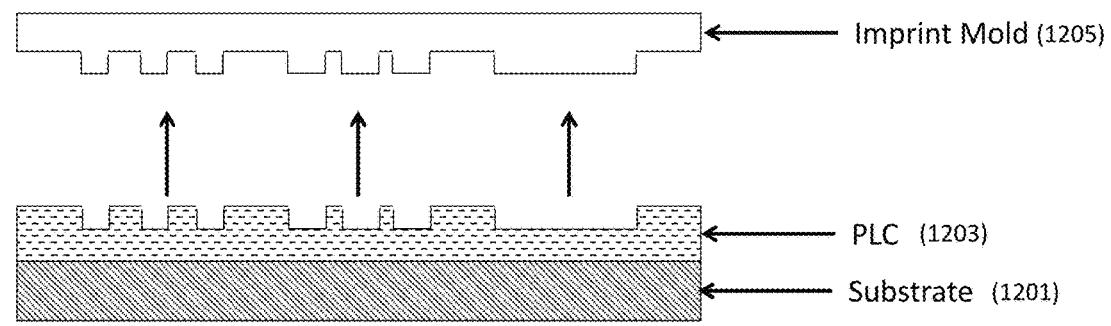
Figure 12D:
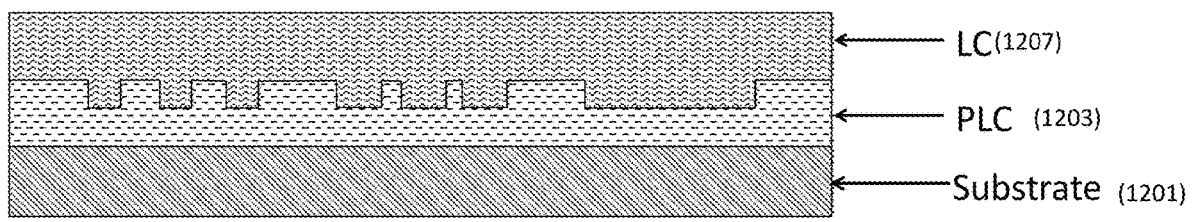

When PLC layer 1203 is in direct contact with features of the imprint template 1205, the longitudinal axes of the liquid crystal molecules of the PLC layer 1203 are aligned to the features of the imprint template. In this manner, the exposed surface of the PLC layer is imprinted with the pattern that corresponds to or is complementary to the pattern of the imprint template. After the exposed surface of the PLC layer 1203 is patterned by the imprint template 1205, the PLC layer 1203 is polymerized. Polymerization of the PLC layer 1203 can be achieved by a variety of methods including but not limited to exposure to ultraviolet (UV) radiation as shown in FIG. 12B, application of heat, passage of time, etc. Polymerization of the PLC layer 1203 can advantageously fix the orientation of the longitudinal axes of the liquid crystal molecules of the PLC layer 1203 even after the PLC layer 1203 is separated from the imprint template as shown in FIG. 12C.

After polymerization of the patterned PLC layer 1203, a layer of liquid crystal material 1207 is disposed over the polymerized patterned PLC layer 1203. The liquid crystal layer can be deposited over the PLC layer 1203 by spin-coating, slot-coating, bar-coating or jet deposition. The layer of liquid crystal material 1207 can have a thickness between about 10 nm and 10 micron. The layer of liquid crystal material 1207 can include a doped or an un-doped liquid crystal material. In various embodiments, the layer of liquid crystal material 1207 can be a polymerizable liquid crystal material, polymer-stabilized liquid crystal material or a non-polymerizable liquid crystal material.

The longitudinal axes of the molecules of the layer of liquid crystal material 1207 align themselves to the pattern imprinted on the PLC layer 1203. Accordingly, the PLC layer 1203 serves as an alignment layer for the layer of liquid crystal material 1207. In some embodiments, the alignment of the longitudinal axes of the molecules of the layer of liquid crystal material 1207 can be facilitated by application of heat and/or sufficient passage of time. Using the PLC layer 1203 as an alignment layer for the layer of liquid crystal material 1207 can have several advantages. A first advantage is that the PLC layer 1203 can provide stronger alignment conditions for the layer of liquid crystal material 1207 as compared to alignment layers that do not comprise a polymerizable liquid crystal material. A second advantage is that a homogeneous interface can be achieved when the material of the PLC layer 1203 has similar optical properties as the material of the layer of liquid crystal material 1207. This can advantageously reduce refractions/diffractions from the boundary between the PLC layer 1203 and the layer of liquid crystal material 1207.

Figure 12E:
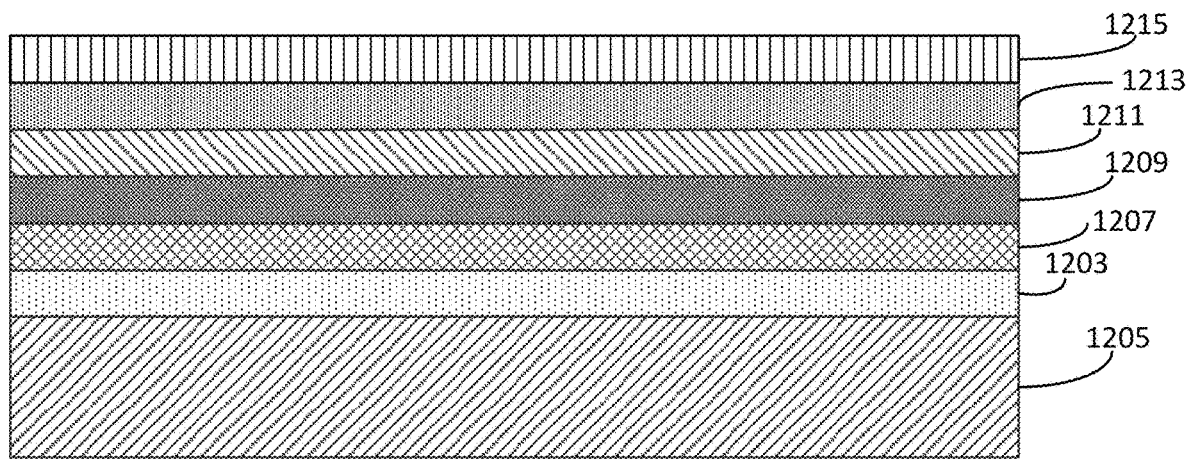
FIG. 12E illustrates an embodiment of a stacked liquid crystal device comprising a plurality of liquid crystal layers.

As shown in FIG. 12E, additional PLC layers 1209 and 1213 that serve as alignment layers for additional liquid crystal layers 1211 and 1215 may be successively deposited over the aligned layer of liquid crystal material 1207 by repeating the processes of FIGS. 12A-12D. For example, the second PLC layer 1209 is disposed over the layer of liquid crystal material 1207 and subsequently patterned with an imprint template and polymerized. A second layer of liquid crystal material 1211 is disposed over the patterned and polymerized PLC layer 1209 and allowed to self-organize such that the molecules of the second layer of liquid crystal material 1211 are aligned to the pattern imprinted on the second PLC layer 1209. The second PLC layer 1213 is disposed over the layer of liquid crystal material 1209 and subsequently patterned with an imprint template and polymerized. A third layer of liquid crystal material 1215 is disposed over the patterned and polymerized PLC layer 1213 and allowed to self-organize such that the molecules of the third layer of liquid crystal material 1215 are aligned to the pattern imprinted on the third PLC layer 1213. This sequence may be repeated for further liquid crystal layers. Preferably, the additional PLC layers 1209 and 1213 can comprise polymerizable liquid crystal materials (reactive mesogens). Preferably the liquid crystal material 1207, 1211 and 1215 can comprise polymerizable liquid crystal materials (reactive mesogens). The pattern imprinted on the PLC layers 1209 and/or 1213 can be different from the pattern imprinted on the PLC layer 1203. However, in some embodiments, the pattern imprinted on the PLC layers 1209 and/or 1213 can be identical to the pattern imprinted on the PLC layer 1203. In various embodiments, an isolation layer such as thin oxide film (with a thickness ranging from a few nm to a few hundred nm) may be deposited over the layers of liquid crystal material (e.g., layer 1207 or layer 1211) before providing additional PLC layers to reduce the effect of the pattern on the liquid crystal layers (e.g., layer 1207 or layer 1211) underneath. In some embodiments, a planarization template can be used to planarize the exposed surface of the layers of liquid crystal material (e.g., layer 1207, layer 1211 or layer 1215) before providing additional PLC layers.

Figure 13A:
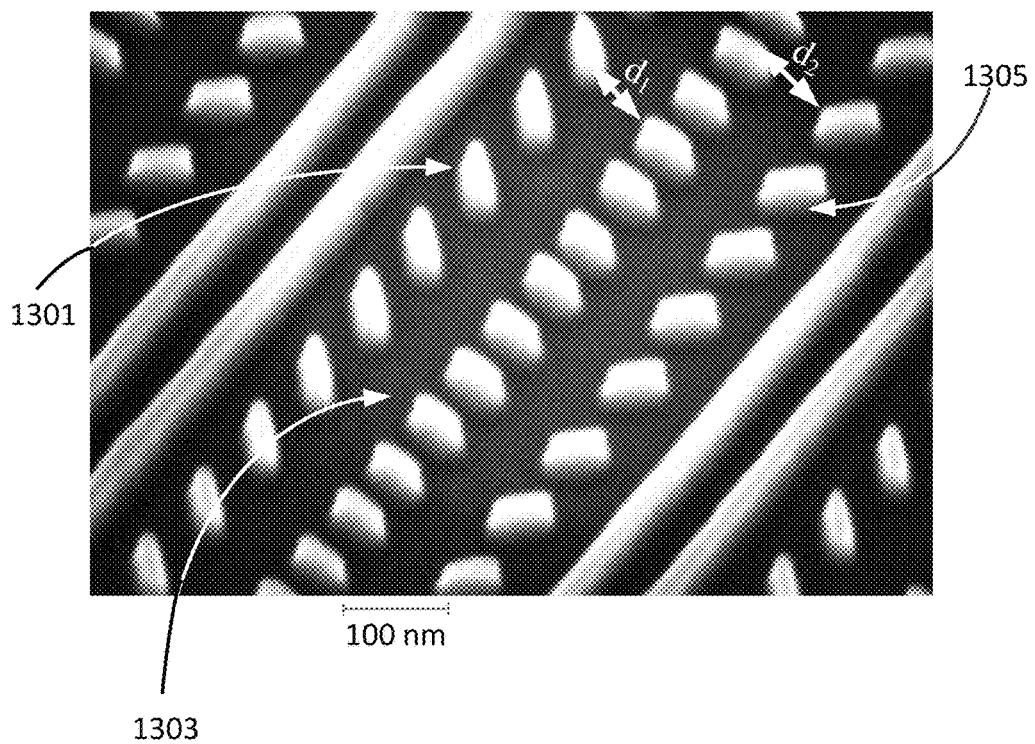
FIG. 13A illustrates a scanning electron microscope (SEM) image of an embodiment of an imprint template.
Figure 13B:
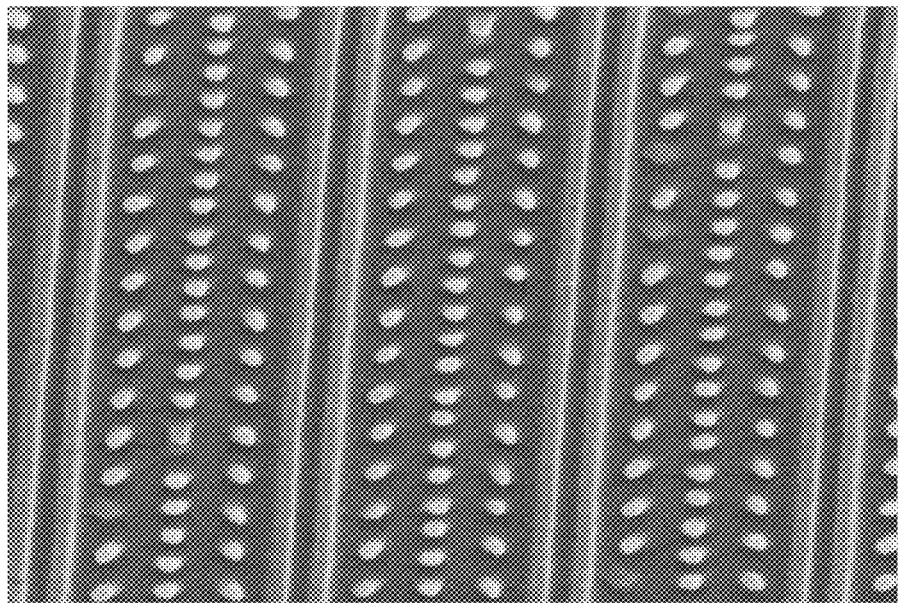
FIG. 13B is a SEM image of a patterned PLC layer manufactured using the imprint template of FIG. 13A and the method discussed above with reference to FIGS. 12A-12C.
Figure 13C:
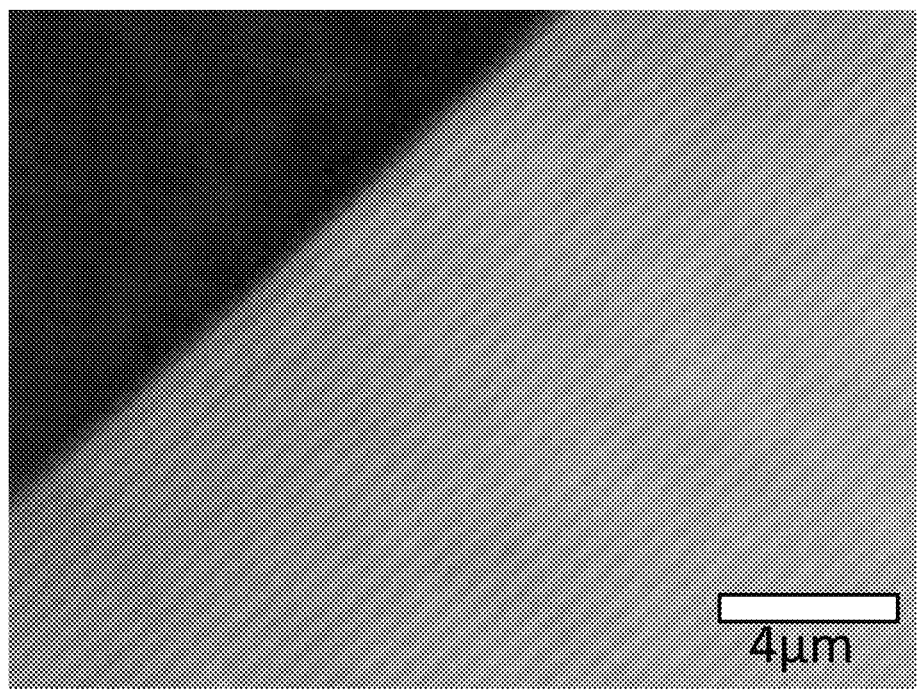
FIG. 13C is a polarizing microscope image of the patterned PLC layer shown in FIG. 13B.

FIG. 13A illustrates a scanning electron microscope (SEM) image of an embodiment of an imprint template. The imprint template comprises three domains 1301, 1303 and 1305 spaced-apart from each other by a domain gap. The domain gap between the first domain 1301 and the second domain 1303 is $d_1$ and the domain gap between the second domain 1303 and the third domain 1305 is $d_2$. Each of the three domains 1301, 1303 and 1305 comprise a plurality of features. A dimension (e.g., length, width or depth) of each of the plurality of features is less than 100 nm. The domain gaps $d_1$ and $d_2$ are less than or equal to 100 nm. FIG. 13B is a SEM image of a patterned PLC layer manufactured using the imprint template of FIG. 13A and the method discussed above with reference to FIGS. 12A-12C. FIG. 13C is a polarizing microscope image of the patterned PLC layer shown in FIG. 13B. FIG. 13C, depicts a gray-scale pattern that indicates the relative LC orientations with respect to the polarizer/analyzer of a polarizing microscope. It is noted from FIG. 13C that the polarizing microscope image exhibits a uniform pattern which indicates LC alignment that is substantially free of alignment defects (i.e., disclinations).

Figure 14:
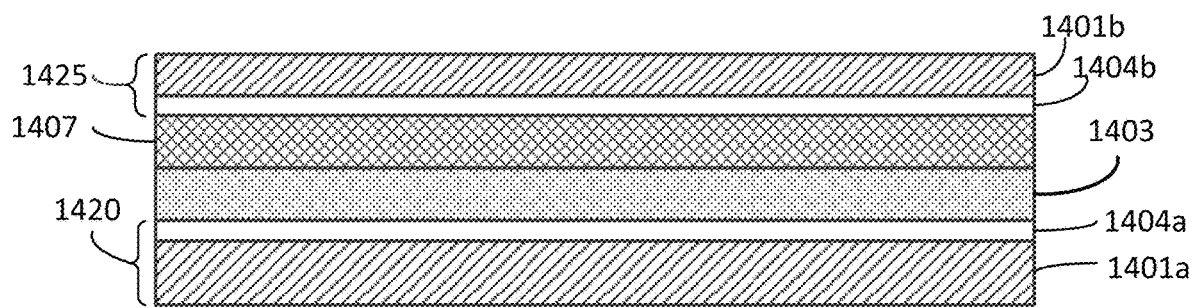
FIG. 14 illustrates an embodiment of an electrically-controllable liquid crystal device.

The methods described herein can be used to fabricate electrically-controllable liquid crystal devices including a liquid crystal layer with sub-wavelength features. FIG. 14 illustrates an embodiment of an electrically-controllable liquid crystal device in which a liquid crystal layer 1407 whose molecules are aligned to a patterned alignment layer 1403 is sandwiched between two electrode layers 1420 and 1425. In some embodiments, the alignment layer 1403 can comprise a patterned polymerizable liquid crystal layer. In some embodiments, the alignment layer 1403 can include a patterned polymer layer which directly aligns LC materials with nano-scale surface structures. The two electrode layers 1420 and 1425 can comprise a material (e.g., Indium Tin Oxide (ITO) that is transmissive to light in the visible spectral range (e.g., between about 400 nm and about 700 nm). In various embodiments, the two electrode layers 1420 and 1425 can each comprise a substrate 1401a and 1401b coated with a layer of ITO 1404a and 1404b respectively. In various embodiments, the electrically-controllable liquid crystal device can be manufactured by constructing a liquid crystal cell structure comprising the two electrode layers and the patterned alignment layer 1403. Liquid crystal material that forms the layer 1407 can be injected in the cell structure to fabricate the electrically-controllable liquid crystal device. The alignment layer 1403 can have a thickness between about 20 nm and about 10 micron. The liquid crystal layer 1407 can have a thickness between about 100 nm and 10 micron. The alignment layer 1403 can be patterned using an imprint template comprising a plurality of sub-wavelength features similar to the template 1100 and/or the template 1205 discussed above. For example, the imprint template used to pattern the alignment layer 1403 can include a plurality of space-apart domains. Each domain can include a plurality of features having a dimension (e.g., length, width and/or depth) of the order of a few nanometers, a few hundred nanometers or a few microns. As discussed above, the alignment layer 1403 can be polymerized after patterning to fix the longitudinal axes of the molecules of the alignment layer 1403. The molecules of the liquid crystal layer 1407 can be allowed to self-organize to the pattern imprinted on the alignment layer 1403. After self-organizing the molecules of the liquid crystal layer 1407 form distinct domains corresponding to the distinct domains of the imprint template and the longitudinal axes of the liquid crystal molecules in each domain are aligned along the directions of the individual features in the corresponding domain. The longitudinal axes of the liquid crystal molecules in the gaps between adjacent domains can progressively transition from the orientation of the longitudinal axes of the molecules in one domain to the orientation of the longitudinal axis of the adjacent domain without any abrupt discontinuities. For example, the longitudinal axes of the liquid crystal molecules in the gaps between adjacent domains can progressively transition from the orientation of the longitudinal axes of the molecules in one domain to the orientation of the longitudinal axis of the adjacent domain substantially continuously. In various embodiments, the liquid crystal layer 1407 can comprise complex, space-variant nano-scale patterns.

The orientation of the longitudinal axes of the liquid crystal molecules in one or more domains can be varied by applying an electric voltage across the electrode layers 1420 and 1425. Under certain conditions, for example, the LC molecules are aligned along the direction of electric fields across the electrode layers 1420 and 1425. Accordingly, by applying an electric voltage across the electrode layers 1420 and 1425, the grating structure in the liquid crystal layer 1407 can be switched on or switched off.

Figure 15A:
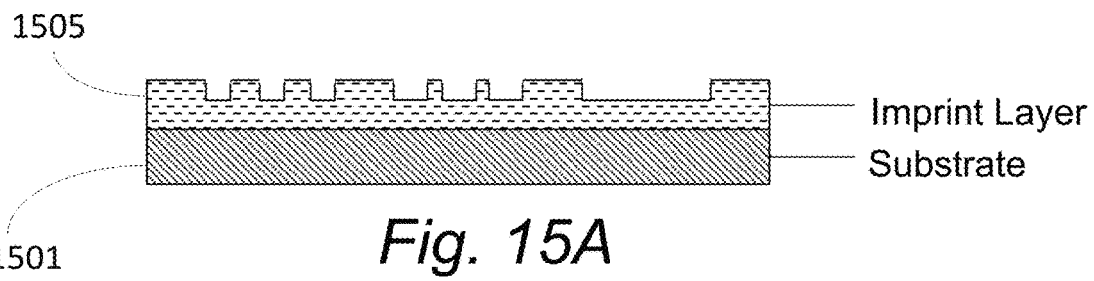
FIGS. 15A-15C illustrate an example of a method of manufacturing various liquid crystal devices described herein.
Figure 15B:
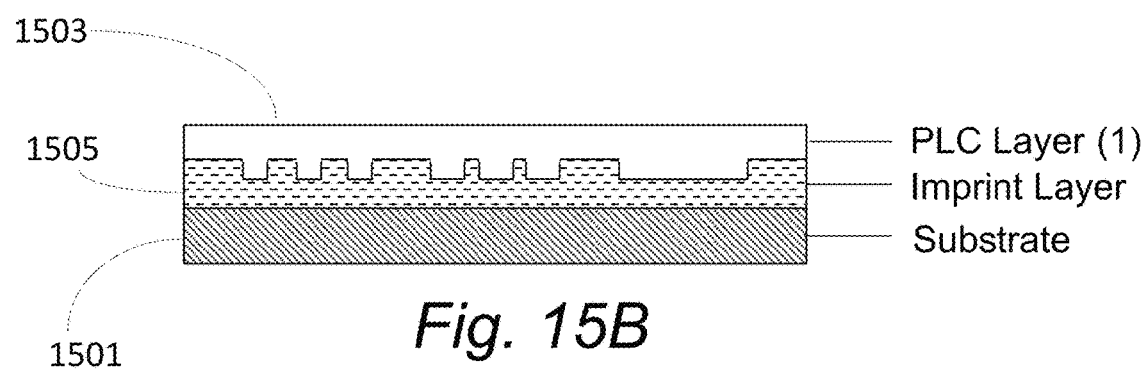
Figure 15C:
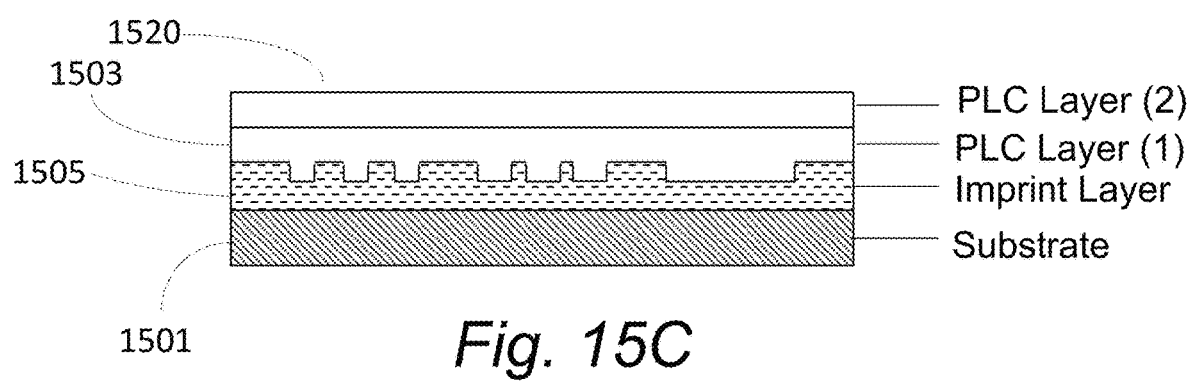

FIGS. 15A-15C illustrate an example of a method of manufacturing various liquid crystal devices described herein. The method comprises providing an imprint layer 1505 over a substrate 1501. Various physical and/or chemical characteristics of the imprint layer 1505 and the substrate 1501 can be similar to the imprint template 1205 and the substrate 1201 respectively that are discussed above. For example, in many cases, the substrate 1501 is optically transmissive. Examples of suitable materials for the substrate 1501 include glass, quartz, sapphire, indium tin oxide (ITO), or polymeric materials, including polycarbonate, polyacetate, and acrylic. In some implementations, the substrate 1501 can be transmissive to light of at least one of visible wavelengths or infrared wavelengths. The substrate can include a pair of major surfaces and surrounding edges. The major surface may be the largest area surface of the substrate, or may be one of a pair of similarly-sized opposing surfaces each having larger areas than other surfaces (e.g., edges). The liquid crystal devices can be configured to reflect, refract, diffract or otherwise redirect light incident on or with respect to the major surfaces of the substrate.

The imprint layer 1505 can be disposed over a major surface of the substrate 1501. As discussed above, the imprint layer 1505 can include features having sub-wavelength dimensions. For example, the imprint layer 1505 can include features having dimensions (e.g., length, width and/or depth) of the order of a few nanometers, a few hundred nanometers and/or a few microns. As another example, the imprint layer 1505 can include features having a length greater than or equal to about 20 nm and less than or equal to about 100 nm. As yet another example, the imprint layer 1505 can include features having a width greater than or equal to about 20 nm and less than or equal to about 100 nm. As yet another example, the imprint layer 1505 can include features having a depth greater than or equal to about 10 nm and less than or equal to about 100 nm. In various embodiments, the length and/or width of the features can be greater than the depth of the features. However, in some embodiments, the depth can be approximately equal to the length and/or width of the features. Features having dimensions outside these ranges are also possible though.

The features of each domain of the imprint layer 1505 can be arranged to form complex geometric patterns within each domain in which the direction and/or the period between consecutive features changes along length scales of the order of a few nanometers, a few hundred nanometers and/or a few microns. In various embodiments, the imprint layer 1505 can include a plurality of spaced-apart domains. Each domain can include a plurality of features having sub-wavelength dimensions. Each domain can be spaced-apart from a neighboring domain by a domain gap. The domain gap can have a value between about 10 nm and about 100 nm, between about 20 nm and about 90 nm, between about 30 nm and about 80 nm, between about 40 nm and about 75 nm, between about 50 nm and about 70 nm or any combination of these ranges or any subrange within these ranges or combination of sub-ranges. In various implementations, the domain gap can be less than or equal to 10 nm and/or greater than or equal to 100 nm. For example, the domain gap can be less than or equal to 5 nm, less than or equal to 2 nm, less than or equal to 1 nm or a value greater than or equal to 0 nm and less than or equal to 10 nm. In some implementations, the plurality of domains of the imprint template 1505 can be arranged as a square grid across the surface of the imprint template 1505 such that the domain gap between neighboring domains is uniform. In some implementations, the plurality of domains of the imprint template 1505 can be arranged as concentric circular or elliptical regions. The plurality of domains can be arranged irregularly across the surface of the imprint template 1505 such that the domain gap between neighboring domains is not uniform. The imprint layer 1505 can have characteristics similar to the imprint template 1100 and/or the imprint 1205 discussed above.

The imprint layer 1505 with sub-wavelength features can be designed and fabricated using nano-patterning techniques including optical lithography, nano-imprint, and ion- and electron-beam lithography. In various embodiments, the imprint layer 1505 can comprise a semiconductor material such as photoresist, silicon or a glass material.

A polymerizable liquid crystal (PLC) layer 1503 is disposed over the imprint layer 1505. The PLC layer 1503 can be disposed over the imprint layer 1505, by a spin-coating process or jet deposition. The PLC layer 1503 can have a thickness between about 10 nm and 10 micron. The PLC layer 1503 can include polymerizable liquid crystal materials (e.g., reactive mesogen) and/or Azo-containing polymers. The imprint layer 1505 acts as an alignment layer that causes the liquid crystal molecules of the PLC layer 1503 to align to the pattern of the imprint layer 1505. When the PLC layer 1503 is in contact with features of the imprint layer 1505, the longitudinal axes of the liquid crystal molecules of the PLC layer 1503 may be aligned to the features of the imprint layer 1505. In this manner, the surface of the PLC layer 1503 is imprinted with the pattern that corresponds to the pattern of the imprint layer 1503. The alignment of the liquid crystal molecules of the PLC layer 1503 to the pattern of the imprint layer 1505 can be attributed to steric interactions with the liquid crystal molecules, and/or anchoring energy exerted on deposited liquid crystal molecules by the imprint layer 1505. The PLC layer 1503 can be polymerized after deposition on the imprint layer 1505. Polymerization of the PLC layer 1503 can be achieved by a variety of methods including but not limited to exposure to ultraviolet (UV) radiation, application of heat, passage of time, or combinations thereof. Polymerization of the PLC layer 1503 can advantageously fix the orientation of the longitudinal axes of the liquid crystal molecules of the PLC layer 1503.

After polymerization of the patterned PLC layer 1503, another layer of liquid crystal material 1520 is disposed over the polymerized patterned PLC layer 1503. The layer 1520 of the liquid crystal material can be deposited over the PLC layer 1503 by spin-coating, slot-coating, bar-coating, blade-coating, jet deposition, or possibly other methods. The layer of liquid crystal material 1520 can have a thickness between about 10 nm and 10 micron. The layer of liquid crystal material 1520 can include a doped or an un-doped liquid crystal material. In various embodiments, the layer of liquid crystal material 1520 can be a polymerizable liquid crystal material, polymer-stabilized liquid crystal material or a non-polymerizable liquid crystal material.

The longitudinal axes of the molecules of the layer of liquid crystal material 1520 align themselves to the pattern imprinted on the PLC layer 1503. In various implementations, only the molecules of the sub-layer of the layer of liquid crystal material 1520 that is in contact with the imprint layer 1505 may their longitudinal axes aligned to the pattern of the imprint layer 1505. Other sub-layers of the layer of liquid crystal material 1520 may have different orientations as discussed above with reference to FIG. 10C. Accordingly, the PLC layer 1503 serves as an alignment layer for the layer of liquid crystal material 1520. In some embodiments, the alignment of the longitudinal axes of the molecules of the layer of liquid crystal material 1520 can be facilitated by application of heat and/or sufficient passage of time.

As discussed above, using the PLC layer 1503 as an alignment layer for the layer of liquid crystal material 1520 can have several advantages. A first advantage is that the PLC layer 1503 can provide stronger alignment conditions for the layer of liquid crystal material 1520 as compared to alignment layers that do not comprise a polymerizable liquid crystal material. A second advantage is that a homogeneous interface can be achieved when the material of the PLC layer 1503 has similar optical properties as the material of the layer of liquid crystal material 1520. This can advantageously reduce refractions/diffractions from the boundary between the PLC layer 1503 and the layer of liquid crystal material 1520.

The methods discussed herein may be used to fabricate liquid crystal metamaterials or liquid crystal metasurfaces. Various embodiments of liquid crystal layers comprising different spaced apart domains, the domain including a plurality of sub-wavelength scale pattern, may be formed on a substrate, which may be adjacent a transmissive waveguide or the waveguide itself as a substrate. In such embodiments, the liquid crystal layers with sub-wavelength scale pattern may be configured, for example, to diffract light incident at an angle between about ±30 degrees with respect to a normal to the waveguide such that the diffracted light can be coupled into a guided mode of a waveguide disposed adjacent to the liquid crystal layer. In some embodiments, the waveguide can be disposed directly adjacent the liquid crystal layer without any intervening layers. In some other embodiments, intervening layers can be disposed between the waveguide and the liquid crystal layer adjacent to the waveguide. In some such embodiments, the liquid crystal layers with sub-wavelength scale pattern may also be configured to out-couple light propagating through the waveguide. The liquid crystal layers with sub-wavelength scale pattern may be configured to be narrowband such that they can be wavelength selective or broadband such that they can efficiently diffract light over a wide range of wavelengths (e.g., wavelengths in the red/green/blue spectral range of the visible spectrum). The methods discussed herein can be used to fabricate other liquid crystal devices. For example, the methods discussed herein can be used to fabricate implementations of diffractive liquid crystal lens as discussed below.

Diffractive Liquid Crystal Lens

Figure 16A:
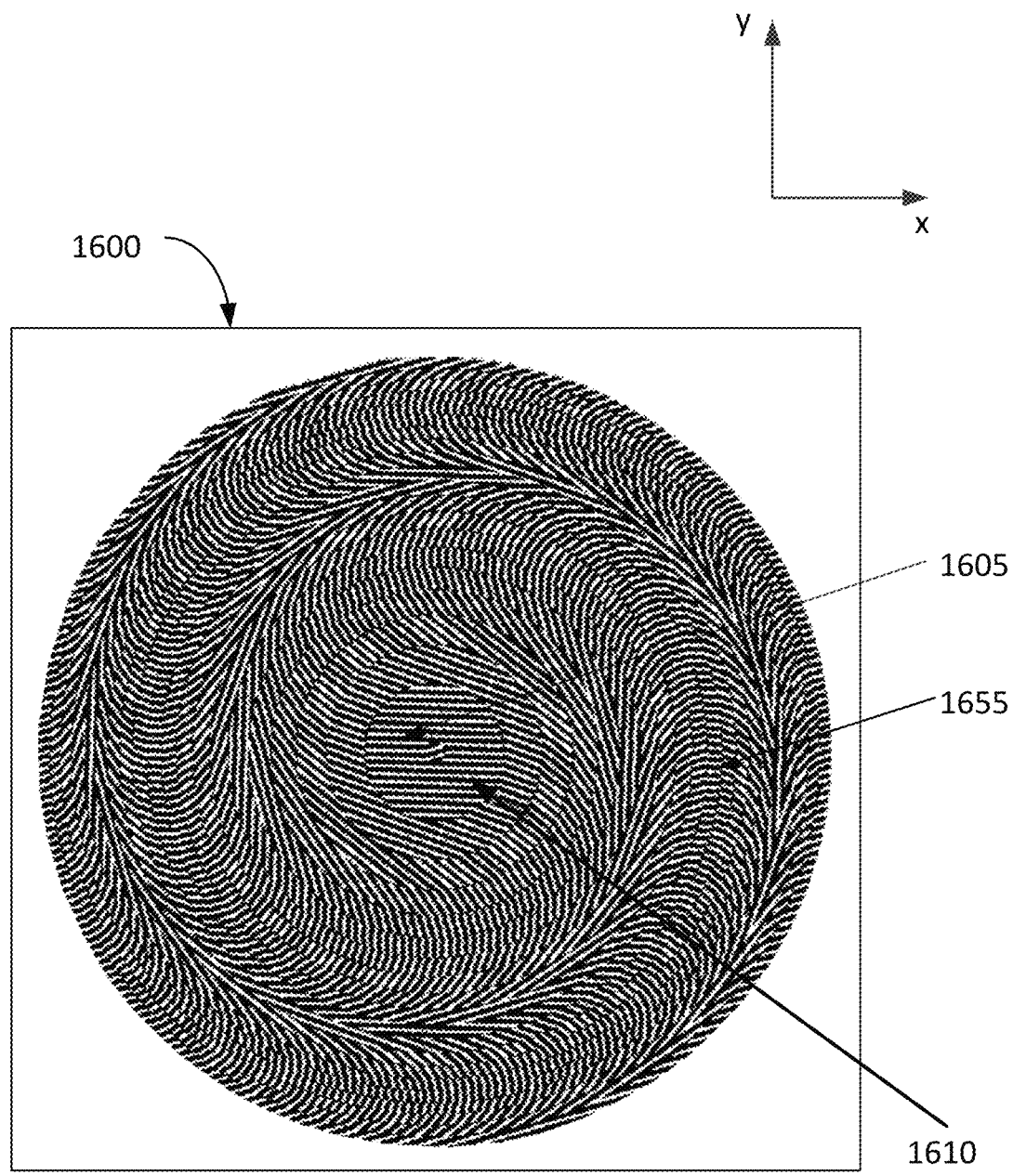
FIG. 16A illustrates a top view of an implementation of a diffractive lens comprising a liquid crystal material.

FIG. 16A illustrates a top view of an implementation of a diffractive lens 1600 comprising a liquid crystal material. The lens 1600 comprises a plurality of zones, such as, for example, zones 1605 and 1610 in the x-y plane. The number of the plurality of zones can be between 2 and about 50. For example, the number of the plurality of zones can be greater than or equal to 3, greater than or equal to 5, greater than or equal to 8, greater than or equal to 10, greater than or equal to 15, greater than or equal to 18, greater than or equal to 22, less than or equal to 50, less than or equal to 42, less than or equal to 30, less than or equal to 20, or any number in the ranges/sub-ranges defined by these values. The molecules of the liquid crystal material in each of the plurality of zones of the lens 1600 are oriented along a particular orientation or range thereabout. The orientation of the molecules of the liquid crystal material in adjacent zones can be different. For example, in the lens 1600, the longitudinal axes of the liquid crystal molecules in the zone 1605 can be aligned parallel to the y-axis while the longitudinal axes of the liquid crystal molecules in the zone 1610 can be rotated in a clock-wise direction by an angle of about 18 degrees with respect to the y-axis. In the lens 1600 depicted in FIG. 16A, the longitudinal axes of the molecules in each of the successive zones can be rotated in a clock-wise direction by an angle of about 18 degrees with respect to the longitudinal axes of the liquid crystal molecules of the preceding zone. In other lens implementations, the angle between the longitudinal axes of the liquid crystal molecules in a zone and the longitudinal axes of the liquid crystal molecules in a preceding zone can be other than 18 degrees. For example, angle between the longitudinal axes of the liquid crystal molecules in a zone and the longitudinal axes of the liquid crystal molecules in a preceding zone can be less than or equal to about 45 degrees. For example, angle between the longitudinal axes of the liquid crystal molecules in a zone and the longitudinal axes of the liquid crystal molecules in a preceding zone can be greater than or equal to about 1 degree, greater than or equal to about 2 degrees, greater than or equal to about 5 degrees, less than or equal to about 10 degrees, less than or equal to about 17 degrees, less than or equal to about 20 degrees, less than or equal to about 25 degrees, less than or equal to about 30 degrees, less than or equal to about 35 degrees, less than or equal to about 40 degrees and/or less than or equal to about 45 degrees or any angle in any range defined by any of these values.

In the implementation of the lens 1600 depicted in FIG. 16A, the angle between the direction of the longitudinal axes of the liquid crystal molecules and the y-axis progressively increases by a fixed amount (e.g., 18 degrees) such that the liquid crystal molecules in the tenth zone 1655 have the same orientation as the liquid crystal molecules in the first zone 1605. However, the angular difference in the orientation of the longitudinal axes of the liquid crystal molecules in neighboring zones need not be fixed or constant. Instead, the difference in the orientation angle of the longitudinal axes of the liquid crystal molecules between neighboring zones can vary across the lens. For example, the angular difference in the orientation of the longitudinal axes of the liquid crystal molecules between two neighboring zones can be 35 degrees, while the angular difference in the orientation of the longitudinal axes of the liquid crystal molecules between two other neighboring zones can be 10 degrees. Accordingly, in various implementations of the liquid crystal lens, the angular difference in the orientation of the longitudinal axes of the liquid crystal molecules between successive zones can be variable, non-constant, and/or random.

The plurality of zones can be ring shaped or annular. The plurality of zones can be concentric. For example, in FIG. 16A, the first zone 1605 is configured as a central zone that is surrounded by the other plurality of zones. The plurality of zones can be concentric rings or annuluses as depicted in FIG. 16A. However, in other implementations, the plurality of zones can be elliptical or possibly have other shapes. The plurality of zones need not be closed curves. Instead, some of the plurality of zones can be open curves (e.g., arcs). In various implementations, the width of the plurality of zones can reduce as the distance from the first (or central) zone increases. Accordingly, the width of the first (or central) zone can be the largest and the width of each consecutive zone can successively reduce. The width of the plurality of zones can reduce linearly or non-linearly as the distance from the central zone increases and/or center of the lens. The width of the plurality of zones can be governed by a mathematical equation in some cases.

In various implementations, the regions and the features contained therein are configured, e.g., have a shape, size, orientation, etc., such that the plurality of zones form an optical element such as a lens having optical power. This power may be positive or negative. The optical power may be positive or negative also depending on the polarization of incident light. For example, the optical power is positive for right-handed circular polarized light while negative for left-handed circular polarized light, and vice versa. This optical element, e.g., lens, may be a diffractive optical element such as a diffractive lens.

Each of the plurality of zones can be considered as a domain as discussed above. The plurality of the zones can be spaced apart from each other with a gap (corresponding to the domain gap) between about 1 nm and about 200 nm. However, in various implementations, the plurality of zones can be arranged such that they are spaced apart by a gap less than 5.0 nm or less than 1.0 nm. For example, in some implementations, there is no gap between the plurality of zones. In other words, the gap between adjacent zones can be 0. The domain gap may vary depending on the angular difference in the orientation of the longitudinal axes of the liquid crystal molecules in neighboring zones. Accordingly, depending on the difference in the orientation of the longitudinal axes of the liquid crystal molecules between neighboring zones, the gap can be between 0 and about 200 nm.

FIG. 16B illustrates a microscopic image of the lens 1600 between crossed polarizers disposed on either side of the lens 1600. The crossed polarizers can be linear polarizers whose polarization axes are disposed orthogonal to each other. The crossed polarizer will show the different regions, which rotate polarization by different amounts, as having different intensities depending on how much the polarization of light matches the polarizer orientation. The more the polarization of light matches the polarizer, the brighter the light and vice versa. To obtain the microscopic image of the lens 1600 circularly polarized light transmitted through one of the two crossed polarizers is incident on lens 1600. The output of the lens 1600 is transmitted through the other of the two crossed polarizers and observed through a microscope. The orientation of the longitudinal axes of the liquid crystal molecules in dark regions of the image depicted (e.g., region 1660) in FIG. 16B are parallel or perpendicular to the optic axes of the polarizers. The orientation of the longitudinal axes of the liquid crystal molecules in bright regions of the image depicted in FIG. 16B (e.g., region 1662) are approximately ±45 degrees with respect to the optic axes of the polarizers. Variation between the brighter and darker regions is associated with variation in the polarization orientation which is caused by the different orientations of the liquid crystal molecules and the optic axis of the birefringence in the particular region.

The alignment of the longitudinal axes of the plurality of the liquid crystals in the plurality of zones can be achieved by using an imprint layer as discussed above. FIG. 16B-1 depicts a scanning electron microscope (SEM) image showing the pattern of the imprint layer 1670 that achieves the desired alignment of the longitudinal axes of the plurality of the liquid crystals in the region 1664 comprising the zones 1605 and 1610. The SEM image in FIG. 16B-2 shows the pattern of the imprint layer 1670 that achieves the desired alignment of the longitudinal axes of the plurality of the liquid crystals in the region 1666. The region 1672 of the imprint layer 1670 comprises features (e.g., grooves) that are parallel to the y-axis. As a result, the longitudinal axes of the liquid crystal molecules that overlap with the region 1672 of the imprint layer 1670 are aligned parallel to the y-axis to form the zone 1605. The region 1674 of the imprint layer 1670 comprises features (e.g., grooves) that are rotated clock-wise by an angle (e.g., about 18 degrees) with respect to the y-axis. Accordingly, the longitudinal axes of the liquid crystal molecules that overlap with the region 1674 of the imprint layer 1670 are rotated clock-wise by an angle (e.g., about 18 degrees) with respect to the y-axis to form the zone 1610. The regions 1680, 1682, 1684, 1686, and 1688 of the imprint layer 1670 show different arrangements of features (e.g., grooves). The longitudinal axes of the liquid crystal molecules that overlap with the regions 1680, 1682, 1684, 1686, and 1688 of the imprint layer 1670 would be aligned parallel to the grooves in the respective regions 1680, 1682, 1684, 1686, and 1688.

The features in the various regions 1672, 1674, 1680, 1682, 1684, 1686, and 1688 of the imprint layer 1670 can be sub-wavelength size. For example, a length, a height, a width and/or a depth of the features in the various regions 1672, 1674, 1680, 1682, 1684, 1686, and 1688 of the imprint layer 1670 can be of the order of a few nanometers, a few hundred nanometers or a few microns. As another example, a length, a height, a width and/or a depth of the features in the various regions 1672, 1674, 1680, 1682, 1684, 1686, and 1688 of the imprint layer 1670 can be between about 20 nm and about 100 nm, between about 30 nm and about 90 nm, between about 40 nm and about 80 nm, between about 50 nm and about 75 nm, between about 60 nm and about 70 nm or any combination of these ranges or any subrange within these ranges or combination of sub-ranges. In various implementations, a length, a height, a width and/or a depth of the features in the various regions 1672, 1674, 1680, 1682, 1684, 1686, and 1688 of the imprint layer 1670 can be less than or equal to about 20 nm or greater than or equal to about 100 nm. For example, the length, a height, a width and/or a depth of the features in the various regions 1672, 1674, 1680, 1682, 1684, 1686, and 1688 of the imprint layer 1670 can be greater than or equal to 1 nm, greater than or equal to 5 nm, greater than or equal to 10 nm, greater than or equal to 15 nm, less than or equal to 100 nm, less than or equal to 125 nm, less than or equal to 150 nm, less than or equal to 200 nm, less than or equal to 250 nm, less than or equal to 1 micron, or a value in any range/sub-range defined by these values.

Figure 17A:
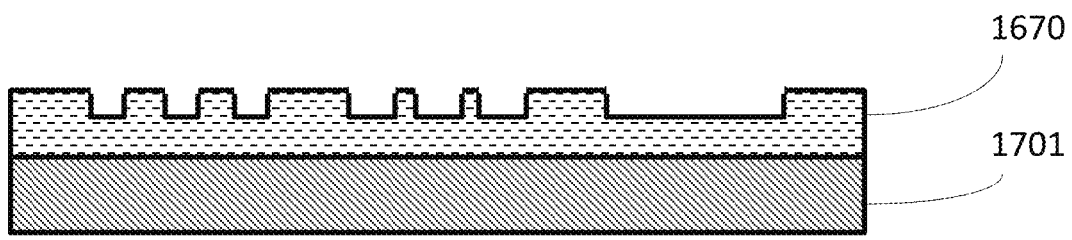
FIGS. 17A-17C illustrate an example of a method of manufacturing a liquid crystal lens
Figure 17B:
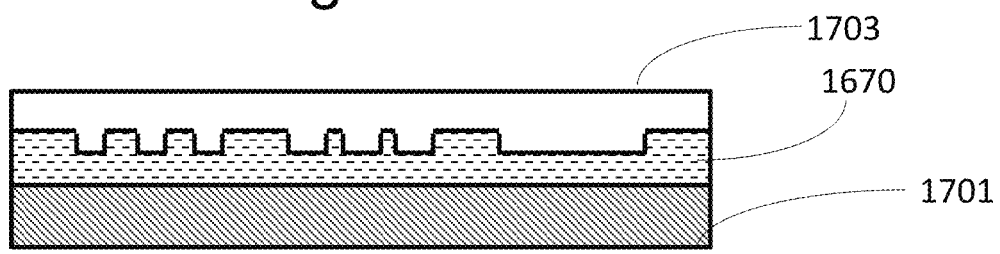
Figure 17C:
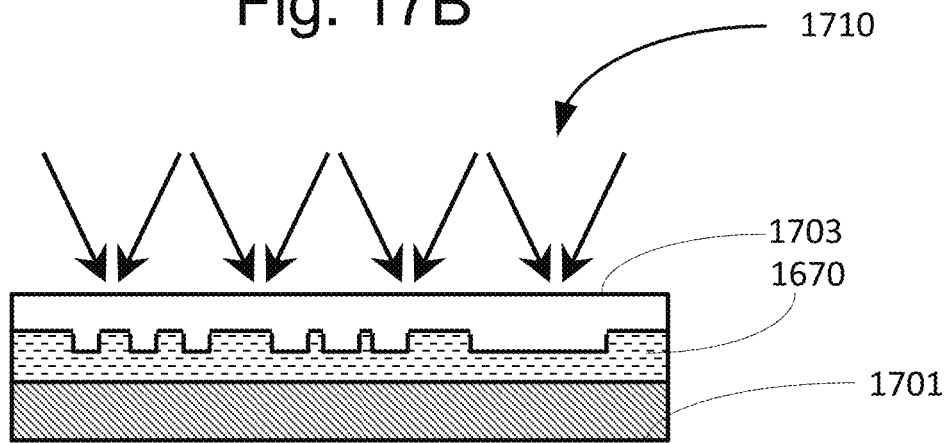

FIGS. 17A-17C illustrate an example of a method of manufacturing the lens 1600. The method comprises providing an imprint layer 1670 over a substrate 1701. Various physical and/or chemical characteristics of the imprint layer 1670 and the substrate 1701 can be similar to the liquid crystal layer 1203 and the substrate 1201 respectively that are discussed above. For example, in various cases the substrate 1701 is optically transmissive and/or transparent. Examples of suitable materials for the substrate 1701 include glass, quartz, sapphire, indium tin oxide (ITO), or polymeric materials, including polycarbonate, polyacetate, and acrylic. In some embodiments, the substrate 1701 can be transmissive to light of at least one of visible wavelengths or infrared wavelengths. The substrate can include a pair of major surfaces and surrounding edges. The major surface may be the largest area surface of the substrate, or may be one of a pair of similarly-sized opposing surfaces each having larger areas than other surfaces (e.g., edges). The liquid crystal devices can be configured to reflect, refract, diffract or otherwise redirect light incident on or with respect to the major surfaces of the substrate.

The imprint layer 1670 can be disposed over a major surface of the substrate 1701. As discussed above, the imprint layer 1670 comprises a plurality of zones comprising features (e.g., grooves). The features can have sub-wavelength dimensions. For example, the imprint layer 1670 can include features having dimensions (e.g., length, width and/or depth) of the order of a few nanometers, a few hundred nanometers and/or a few microns. As another example, the imprint layer 1670 can include features having a length greater than or equal to about 20 nm and less than or equal to about 100 nm. As yet another example, the imprint layer 1670 can include features having a width greater than or equal to about 20 nm and less than or equal to about 100 nm. As yet another example, the imprint layer 1670 can include features having a depth greater than or equal to about 10 nm and less than or equal to about 100 nm. In various embodiments, the length and/or width of the features can be greater than the depth of the features. However, in some embodiments, the depth can be approximately equal to the length and/or width of the features. Other dimensions outside these ranges are also possible.

In various implementations, the features in each of the plurality of zones are oriented along the same direction. The direction along which the features in one of the plurality of zones are oriented may be rotated by an angle with respect to the direction along which the features in a zone adjacent to one of the plurality of zones is oriented. The plurality of zones domain can be spaced-apart from each other by a gap having a value between about 1 nm and about 100 nm, between about 20 nm and about 90 nm, between about 30 nm and about 80 nm, between about 40 nm and about 75 nm, between about 50 nm and about 70 nm or any combination of these ranges or any subrange within these ranges or combination of sub-ranges. In some implementations, the plurality of zones can be spaced-apart by a gap less than about 5 nm or 1 nm. In some implementations, the plurality of zones can be spaced-apart by no gap (or a gap of 0 nm). The plurality of zones can ring shaped and can be arranged concentrically. The width of plurality of zones can decrease as the distance from the center of the imprint layer 1670 increases.

The imprint layer 1670 with sub-wavelength features can be fabricated using nano-patterning techniques including optical lithography, nano-imprint, and ion- and electron-beam lithography. In various embodiments, the imprint layer 1670 can comprise a semiconductor material such as photoresist, silicon or a glass material.

A liquid crystal (LC) layer 1703 is disposed over the imprint layer 1670. The liquid crystal layer 1703 can be a polymerizable liquid crystal layer. The LC layer 1703 can be disposed over the imprint layer 1670, by a spin-coating process, slot-die coating process, bar-coating process, blade-die coating process or jet deposition. The LC layer 1703 can have a thickness between about 10 nm and 10 micron. The LC layer 1503 can include polymerizable liquid crystal materials (e.g., reactive mesogen) and/or Azo-containing polymers. The imprint layer 1670 acts as an alignment layer that causes the liquid crystal molecules of the LC layer 1703 to align to the pattern of the imprint layer 1705. When the LC layer 1703 is in contact with features of the imprint layer 1670, the longitudinal axes of the liquid crystal molecules of the LC layer 1703 can align with the features of the imprint layer 1705. In this manner, the surface of the LC layer 1703 is imprinted with the pattern that corresponds to the pattern of the imprint layer 1670. The LC layer 1703 can be polymerized after deposition on the imprint layer 1505. Polymerization of the LC layer 1703 can be achieved by a variety of methods including but not limited to exposure to ultraviolet (UV) radiation 1710 such as schematically illustrated in FIG. 17C, application of heat, passage of time, or combinations thereof. Polymerization of the LC layer 1703 can advantageously fix the orientation of the longitudinal axes of the liquid crystal molecules of the PLC layer 1703.

Figure 18A:
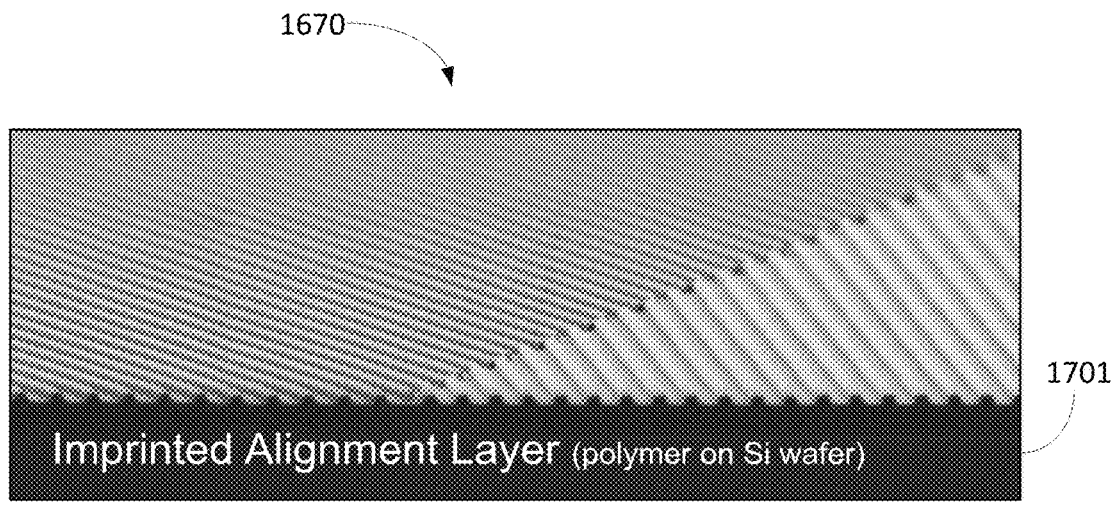
FIG. 18A illustrates a scanning electron microscope (SEM) image of an imprint layer that is used to manufacture an implementation of a liquid crystal lens.

FIG. 18A illustrates a scanning electron microscope (SEM) image of an imprint layer 1670 provided on a substrate comprising silicon (Si). As depicted in FIG. 18A, the imprint layer 1670 comprises a first zone having a first plurality of features oriented along a first direction and a second zone comprising a second plurality of features oriented along a second direction different from the first direction. The first and the second zones are spaced by a gap less than 1 nm (e.g., no gap).

Figure 18B:
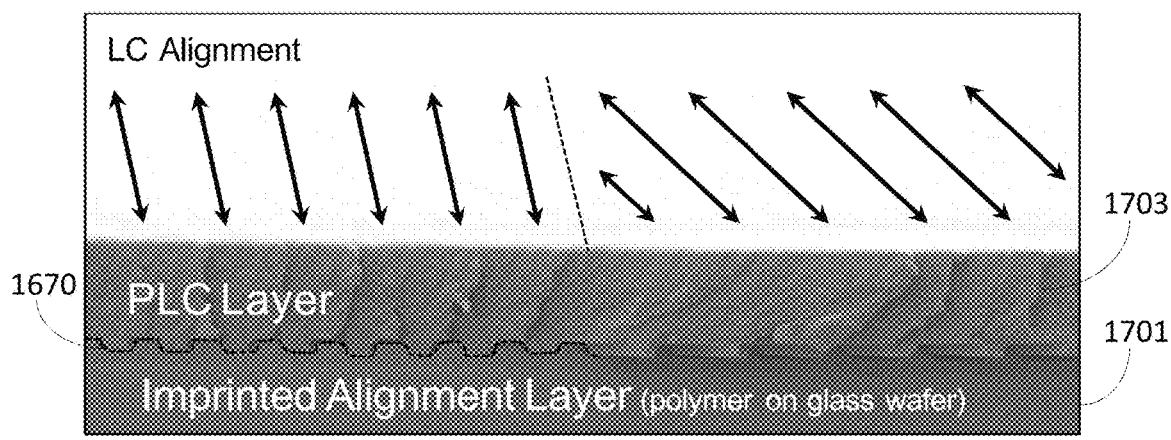
FIG. 18B illustrates a scanning electron microscope (SEM) image of a liquid crystal layer disposed over the imprint layer of FIG. 18A.

FIG. 18B illustrates a scanning electron microscope (SEM) image of a liquid crystal layer 1703 disposed over the imprint layer 1670. The longitudinal axes of the liquid crystal molecules in the portion of the liquid crystal layer 1703 that overlaps with the first zone are aligned along the first direction and the longitudinal axes of the liquid crystal molecules in the portion of the liquid crystal layer 1703 that overlaps with the second zone are aligned along the second direction.

It is contemplated that various embodiments may be implemented in or associated with a variety of applications such as imaging systems and devices, display systems and devices, spatial light modulators, liquid crystal based devices, polarizers, wave guide plates, etc. The structures, devices and methods described herein may particularly find use in displays such as wearable displays (e.g., head mounted displays) that can be used for augmented and/or virtually reality. More generally, the described embodiments may be implemented in any device, apparatus, or system that can be configured to display an image, whether in motion (such as video) or stationary (such as still images), and whether textual, graphical or pictorial. It is contemplated, however, that the described embodiments may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, head mounted displays and a variety of imaging systems. Thus, the teachings are not intended to be limited to the embodiments depicted solely in the figures, but instead have wide applicability as will be readily apparent to one having ordinary skill in the art.

Various modifications to the embodiments described in this disclosure may be readily apparent to those skilled in the art, and the generic principles defined herein may be applied to other embodiments without departing from the spirit or scope of this disclosure. Various changes may be made to the invention described and equivalents may be substituted without departing from the true spirit and scope of the invention. In addition, many modifications may be made to adapt a particular situation, material, composition of matter, process, process act(s) or step(s) to the objective(s), spirit or scope of the present invention. All such modifications are intended to be within the scope of claims associated with this disclosure.

The word "exemplary" is used exclusively herein to mean "serving as an example, instance, or illustration." Any embodiment described herein as "exemplary" is not necessarily to be construed as preferred or advantageous over other embodiments. Additionally, a person having ordinary skill in the art will readily appreciate, the terms "upper" and "lower", "above" and "below", etc., are sometimes used for ease of describing the figures, and indicate relative positions corresponding to the orientation of the figure on a properly oriented page, and may not reflect the orientation of the structures described herein, as those structures are implemented.

Certain features that are described in this specification in the context of separate embodiments also can be implemented in combination in a single embodiment. Conversely, various features that are described in the context of a single embodiment also can be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products. Additionally, other embodiments are within the scope of the following claims. In some cases, the actions recited in the claims can be performed in a different order and still achieve desirable results.

The invention includes methods that may be performed using the subject devices. The methods may comprise the act of providing such a suitable device. Such provision may be performed by the end user. In other words, the "providing" act merely requires the end user obtain, access, approach, position, set-up, activate, power-up or otherwise act to provide the requisite device in the subject method. Methods recited herein may be carried out in any order of the recited events which is logically possible, as well as in the recited order of events.

Example aspects of the invention, together with details regarding material selection and manufacture have been set forth above. As for other details of the present invention, these may be appreciated in connection with the above-referenced patents and publications as well as generally known or appreciated by those with skill in the art. The same may hold true with respect to method-based aspects of the invention in terms of additional acts as commonly or logically employed.

In addition, though the invention has been described in reference to several examples optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. In addition, where a range of values is provided, it is understood that every intervening value, between the upper and lower limit of that range and any other stated or intervening value in that stated range, is encompassed within the invention.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in claims associated hereto, the singular forms "a," "an," "said," and "the" include plural referents unless the specifically stated otherwise. In other words, use of the articles allow for "at least one" of the subject item in the description above as well as claims associated with this disclosure. It is further noted that such claims may be drafted to exclude any optional element. As such, this statement is intended to serve as antecedent basis for use of such exclusive terminology as "solely," "only" and the like in connection with the recitation of claim elements, or use of a "negative" limitation.

Without the use of such exclusive terminology, the term "comprising" in claims associated with this disclosure shall allow for the inclusion of any additional element—irrespective of whether a given number of elements are enumerated in such claims, or the addition of a feature could be regarded as transforming the nature of an element set forth in such claims. Except as specifically defined herein, all technical and scientific terms used herein are to be given as broad a commonly understood meaning as possible while maintaining claim validity.

The breadth of the present invention is not to be limited to the examples provided and/or the subject specification, but rather only by the scope of claim language associated with this disclosure.

What is claimed is:

1. An electrically-controllable liquid crystal device comprising:
   a liquid crystal layer comprising a liquid crystal material;
   an alignment layer adjacent to the liquid crystal layer and including at least one pattern of nano-scale surface structures such that liquid crystal molecules of the liquid crystal material in the liquid crystal layer align to the at least one pattern;
   a first electrode layer extending along a side of the alignment layer opposite the liquid crystal layer; and
   a second electrode layer adjacent to the liquid crystal layer and arranged such that the liquid crystal layer is between the second electrode layer and the alignment layer;
   wherein the liquid crystal layer comprises:
      a first domain including a first plurality of liquid crystal molecules, in which longitudinal axes of the first plurality of liquid crystal molecules are arranged to form a first pattern, and
      a second domain including a second plurality of liquid crystal molecules, in which the longitudinal axes of the second plurality of liquid crystal molecules are arranged to form a second pattern that is different from the first pattern,
   wherein the first domain is separated from the second domain along a transverse direction that is parallel to a major surface of the alignment layer;
   wherein the first domain is spaced apart laterally along the transverse direction from the second domain by a domain gap that is between the first domain and the second domain;
   wherein the longitudinal axes of the liquid crystal molecules in the domain gap progressively transition along the transverse direction from the first pattern to the second pattern such that the liquid crystal molecules in the domain gap form a transitional pattern that is transitional between the first pattern and the second pattern; and
   wherein applying an electric voltage across the first electrode layer and the second electrode layer creates an electric field that causes the liquid crystal molecules of the liquid crystal material to align along a direction of the electric field.

2. The liquid crystal device of claim 1, wherein the liquid crystal layer provides a grating structure that is configured to redirect at least a portion of light that is incident on the liquid crystal layer while the liquid crystal layer is switched on, and wherein the liquid crystal structure is switched on or switched off by applying the electric voltage across the first electrode layer and the second electrode layer.

3. The liquid crystal device of claim 2, wherein the grating structure is a diffractive grating configured to diffract at least a portion of light that is incident on the liquid crystal layer while the liquid crystal layer is switched on.

4. The liquid crystal device of claim 1, wherein the alignment layer is a patterned polymerizable liquid crystal layer.

5. The liquid crystal device of claim 1, wherein the first electrode layer and the second electrode layer each comprise a material that is transmissive to light in a spectral range.

6. The liquid crystal device of claim 5, wherein the first electrode layer and the second electrode layer each comprise Indium Tin Oxide.

7. The liquid crystal device of claim 1, wherein the domain gap has a distance D between about 10 nm and about 50 nm.

8. The liquid crystal device of claim 1, wherein:
   the longitudinal axes of the first plurality of liquid crystal molecules in the first domain are aligned along a first direction and the longitudinal axes of the second plurality of liquid crystal molecules in the second domain are aligned along a second direction, and
   directions of the longitudinal axes of the liquid crystal molecules in the domain gap progressively transition from the first direction to the second direction such that the liquid crystal molecules in the domain gap are aligned along respective transitional directions that are between the first direction and the second direction.

9. The liquid crystal device of claim 1, wherein the liquid crystal layer comprises a plurality of sub-layers distributed across the thickness of the liquid crystal layer, each of the plurality of sub-layers comprising a single layer of the liquid crystal molecules.

10. The liquid crystal device of claim 9, wherein each sub-layer comprises:
    a first domain in which longitudinal axes of the liquid crystal molecules are arranged to form the first pattern; and
    a second domain in which the longitudinal axes of the liquid crystal molecules are arranged to form the second pattern;
    wherein the first domain is spaced apart laterally along the transverse direction from the second domain by a domain gap.

11. The liquid crystal device of claim 10, wherein the domain gap has a distance D between about 10 nm and about 50 nm.

12. The liquid crystal device of claim 10, wherein the longitudinal axes of the liquid crystal molecules in the domain gap progressively transition from the first pattern to the second pattern.

13. The liquid crystal device of claim 10, wherein:
    the longitudinal axes of the liquid crystal molecules in the first domain are aligned along a first direction and the longitudinal axes of the liquid crystal molecules in the second domain are aligned along a second direction, and
    the longitudinal axes of the liquid crystal molecules in the domain gap progressively transition from the first direction to the second direction.

14. An optical device comprising:
    a waveguide; and
    the electrically-controllable liquid crystal device of claim 1, wherein at least one of the liquid crystal layer or the alignment layer is disposed over the waveguide, and wherein the liquid crystal layer is configured as at least one of:

an in-coupling optical element that in-couples at least a portion of an incident beam of light into the waveguide such that the in-coupled light propagates through the waveguide by total internal reflection;

an out-coupling optical element that out-couples, from the waveguide, light that is propagating through the waveguide; or an orthogonal pupil expander that redirects light propagating through the waveguide such that the redirected light continues to propagate through the waveguide.

\* \* \* \* \*